United States Patent
Sakaguchi et al.

(10) Patent No.: US 6,316,062 B1
(45) Date of Patent: Nov. 13, 2001

(54) MAGNETIC RECORDING MEDIUM AND METHOD OF PRODUCING THE SAME

(75) Inventors: Ryuji Sakaguchi; Kazuo Kobayashi; Hiroshi Sakai; Mikio Suzuki; Kenichi Yoneyama; Kazunori Ohnami, all of Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/508,836

(22) PCT Filed: Sep. 17, 1998

(86) PCT No.: PCT/JP98/04176

§ 371 Date: Mar. 17, 2000

§ 102(e) Date: Mar. 17, 2000

(87) PCT Pub. No.: WO99/14746

PCT Pub. Date: Mar. 25, 1999

(30) Foreign Application Priority Data

| Sep. 17, 1997 | (JP) | 9-252494 |
| May 13, 1998 | (JP) | 10-130823 |
| May 13, 1998 | (JP) | 10-130824 |
| May 13, 1998 | (JP) | 10-130825 |
| May 13, 1998 | (JP) | 10-130826 |
| May 13, 1998 | (JP) | 10-130827 |
| Jun. 9, 1998 | (JP) | 10-161134 |
| Jun. 9, 1998 | (JP) | 10-161135 |
| Jun. 9, 1998 | (JP) | 10-161136 |
| Jun. 9, 1998 | (JP) | 10-161137 |
| Jun. 9, 1998 | (JP) | 10-161138 |
| Jun. 9, 1998 | (JP) | 10-161139 |
| Jun. 9, 1998 | (JP) | 10-168140 |
| Jul. 3, 1998 | (JP) | 10-189503 |

(51) Int. Cl.$^7$ ................................................ H05H 1/02
(52) U.S. Cl. ................ 427/570; 427/131; 427/209; 427/249.1; 427/255.28; 427/577; 427/580; 427/585; 427/595
(58) Field of Search ................ 427/131, 249.1, 427/255.28, 209, 570, 577, 580, 585, 595

(56) References Cited

U.S. PATENT DOCUMENTS 5,230,964  7/1993  Kar et al. ................... 428/694

FOREIGN PATENT DOCUMENTS

| 1-201095 | 8/1989 | (JP) | C30B/29/04 |
| 6-504643 | 5/1994 | (JP) | G11B/5/71 |
| 7/14157 | 1/1995 | (JP) | G11B/5/84 |
| 7-262547 | 10/1995 | (JP) | G11B/5/66 |
| 8-13143 | 1/1996 | (JP) | C23C/14/34 |
| 8-7266 | 1/1996 | (JP) | G11B/5/84 |
| 8-63738 | 3/1996 | (JP) | G11B/5/71 |
| 8/161736 | 6/1996 | (JP) | G11B/5/84 |
| 8/273139 | 10/1996 | (JP) | G11B/5/66 |
| 9/22526 | 1/1997 | (JP) | G11B/5/84 |
| 9-111458 | 4/1997 | (JP) | C23C/16/50 |
| 9/128732 | 5/1997 | (JP) | G11B/5/66 |
| 9-171615 | 6/1997 | (JP) | G11B/5/72 |
| 9-282642 | 10/1997 | (JP) | G11B/5/72 |
| 92/11631 | 7/1992 | (WO) | G11B/5/66 |

Primary Examiner—Bernard Pianalto
(74) Attorney, Agent, or Firm—Sughrue, Mion, Zinn, Macpeak & Seas, PLLC

(57) ABSTRACT

The present invention provides a method for manufacturing a magnetic recording medium comprising the steps of forming a carbon protective film onto a disc, the non-magnetic substrate of which is layered with a non-magnetic base film and magnetic film, using a reactant gas containing carbon atoms as a starting material, according to a plasma CVD method, wherein a mixed gas of hydrocarbon and hydrogen, in which the mixing ratio of hydrocarbon to hydrogen is in the range of 2 to 1~1 to 100 by volume, is used as a reactant gas, during bias applying to said disc. In addition, the present invention provides a magnetic recording medium comprising a carbon protective film formed onto a disc, the non-magnetic substrate of which is layered with a non-magnetic base film and magnetic film, wherein said carbon protective film is formed according to a plasma CVD method, while applying bias.

8 Claims, 6 Drawing Sheets

MAGNETIC RECORDING MEDIUM AND METHOD OF PRODUCING THE SAME

TECHNICAL FIELD

The present invention relates to a magnetic recording medium such as a magnetic disc and the like for use in magnetic disc devices, and a manufacturing method for the same.

RELEVANT ART

In recent years, in the field of magnetic recording, particularly with respect to magnetic discs, remarkable improvements in the recording density have been achieved. In particular, recent improvements in the recording density have continued at a phenomenal pace, achieving rates of approximately 100 times in 10 years. Technologies supporting the improvement of recording density vary widely, however, one of the key concepts that can be mentioned is the technology of controlling the sliding characteristics between the magnetic head and magnetic recording medium.

Sliding of the head on the medium is unavoidable ever since the introduction of the CSS (Contact-Start-Stop) mode which is so-called "Winchester format" as the main mode for hard disc drives, wherein the basic operation comprises the steps of sliding into contact, head flotation, and sliding into contact between the magnetic head and magnetic recording medium. Accordingly, problems relating to tribology between head and medium have become critical technical problems. Thus, properties such as resistance to abrasion and resistance to sliding over the surface of the magnetic recording medium comprise the keys to a reliable product, and efforts continue to develop and improve the protective film, lubricating film, and the like, which coat the magnetic film.

As a protective film for magnetic recording medium, films comprising various materials have been proposed. However, from the perspective of the total performance such as coating performance and durability, carbon films are principally employed.

These carbon films are generally formed according to a spatter-coating method, in which the coating conditions are extremely important due to their direct impact on resistance to corrosion and CSS properties.

In addition, in order to improve the recording density, it is preferable to reduce the flying height of the head, to increase the number of rotations of the medium, and the like. Thus, a superior resistance to sliding is required for the magnetic recording medium. On the other hand, in order to improve the recording density by means of reducing spacing loss, it's preferable to make the protective film thinner, for example to a thickness of 100 Å or less. Hence, a thin, smooth and durable protective film is highly desired.

However, a carbon protective film formed according to the conventional spattering coating method, can sometimes lack durability, when the film is made thin, for example 100 Å or less.

Therefore, a plasma CVD method is currently being studied as a method for providing a carbon protective film with greater strength, compared to that produced by means of the spatter-coating method. This plasma CVD method is disclosed in, for example, Japanese Patent Application, Second Publication No. Hei 7-21858; First Publication Laid Open No. 7-73454; and the like.

However, under the current demands for increased recording density, it is difficult, from the perspective of durability to sliding, to produce a thin protective film to the point where a sufficiently high recording density is achieved without lowering the output properties, according to the aforementioned conventional technology. In addition, the conventional technology poses the problem of low coating rate, which in turn leads to production inefficiency.

In consideration of the aforementioned, the objectives of the present invention are described as follows.

(1) To provide a magnetic recording medium and manufacturing method thereof, that is reliable and capable of providing a sufficiently high recording density, without lowering the output properties.

(2) To provide a method for manufacturing the aforementioned magnetic recording medium in an efficient manner.

DISCLOSURE OF THE INVENTION

The method for manufacturing a magnetic recording medium according to the present invention comprises a method for manufacturing a magnetic recording medium by means of forming a carbon protective film onto the disc, the non-magnetic substrate of which is layered with a non-magnetic base film and magnetic film, using a reactant gas containing carbon atoms as a starting material, according to a plasma CVD method, wherein a mixed gas of hydrocarbon and hydrogen, in which the mixing ratio of hydrocarbon to hydrogen is in the range of 2 to 1~1 to 100 by volume, is used as a reactant gas, while applying a bias to said disc.

The aforementioned hydrocarbon preferably comprises at least one type of hydrocarbon selected from among lower saturated hydrocarbons, lower unsaturated hydrocarbons, and lower cyclic hydrocarbons, and more preferably comprises toluene.

In the case of using toluene, toluene and hydrogen are mixed, with a mixing ratio of toluene to hydrogen preferably in the range of 1 to 15~1 to 20 by volume.

The bias applied to the disc is preferably a high frequency bias.

In addition, formation of a carbon protective film is preferably carried out under high frequency electrical discharge.

When forming a carbon protective film on both sides of the disc at the same time, it is preferable to make the phases of electrical power supplied to each electrode arranged on the respective sides of the aforementioned disc different from each other. The phase difference of electrical power supplied to each electrode is preferably in the range of 90~270°, and in particular, more preferably the opposite phase (i.e., 180°).

The method for manufacturing a magnetic recording medium according to the present invention may comprise a method for manufacturing a magnetic recording medium by means of forming a carbon protective film onto the disc the non-magnetic substrate of which is layered with a non-magnetic base film and magnetic film, using a reactant gas containing carbon atoms as a starting material, according to a plasma CVD method, wherein pulse D.C. bias having a frequency of 1 kHz~100 GHz and pulse width of 1 ns~500 μs is applied to the disc, when forming (during formation of) the carbon protective film.

The frequency of the pulse D.C. bias applied to the disc is preferably in the range of 10 kHz~1 GHz, and the pulse width is preferably in the range of 10 ns~50 μs.

The average voltage of the pulse D.C. bias applied to the disc is preferably in the range of −400~−10V.

The aforementioned reactant gas is preferably a mixed gas of hydrocarbon and hydrogen, with a mixing ratio of hydrocarbon to hydrogen in the range of 2 to 1~1 to 100 by volume. The hydrocarbon preferably comprises at least one type of hydrocarbon selected from among lower saturated hydrocarbons, lower unsaturated hydrocarbons, and lower cyclic hydrocarbons.

The magnetic recording medium according to the present invention is provided with a carbon protective film onto the disc, the non-magnetic substrate of which is layered with a non-magnetic base film and magnetic film, that can be formed according to a plasma CVD method while applying pulse D.C. bias having a frequency of 1 kHz~100 GHz and pulse width of 1 ns~500 $\mu$s to the disc.

The method for manufacturing a magnetic recording medium according to the present invention may comprise a method for manufacturing a magnetic recording medium by means of forming a carbon protective film onto the disc, the non-magnetic substrate of which is layered with a non-magnetic base film and magnetic film, using a reactant gas containing carbon atoms as a starting material, according to a plasma CVD method, wherein the temperature of the disc is heated to 100~250° C. prior to forming the aforementioned carbon protective film.

The temperature of the disc is preferably in the range of 150~200° C.

The aforementioned reactant gas is preferably a mixed gas of hydrocarbon and hydrogen, with a mixing ratio of hydrocarbon to hydrogen in the range of 2 to 1~1 to 100 by volume, wherein the hydrocarbon mixed into the reactant gas preferably comprises at least one type of hydrocarbon selected from among lower saturated hydrocarbons, lower unsaturated hydrocarbons, and lower cyclic hydrocarbons.

The pressure of the reactant gas is in the range of 0.1~10 Pa, and preferably 2~6 Pa, when forming the carbon protective film in the method for manufacturing a magnetic recording medium according to the present invention.

The aforementioned reactant gas is preferably a mixed gas of hydrocarbon and hydrogen, with a mixing ratio of hydrocarbon to hydrogen in the range of 2 to 1~1 to 100 by volume, wherein the hydrocarbon mixed into the reactant gas preferably comprises at least one type of hydrocarbon selected from among lower saturated hydrocarbons, lower unsaturated hydrocarbons, and lower cyclic hydrocarbons.

The method for manufacturing a magnetic recording medium according to the present invention may comprise a method for manufacturing a magnetic recording medium by means of forming a carbon protective film onto the disc, the non-magnetic substrate of which is layered with a non-magnetic base film and magnetic film, using a reactant gas containing carbon atoms as a starting material, according to a plasma CVD method, wherein the reactant gas is a mixed gas of hydrocarbon and hydrogen, with a mixing ratio of hydrocarbon to hydrogen in the range of 2 to 1~1 to 100 by volume, into which nitrogen gas is added at a adding volume of 0.1~100% of the mixed gas.

The aforementioned hydrocarbon preferably comprises at least one type of hydrocarbon selected from among lower saturated hydrocarbons, lower unsaturated hydrocarbons, and lower cyclic hydrocarbons.

The magnetic recording medium according to the present invention may comprise a non-magnetic substrate, layered with a non-magnetic base film, magnetic film, carbon protective film, and lubricating film; wherein said carbon protective film comprises a plasma CVD carbon layer formed according to a plasma CVD method, and a spatter carbon layer formed according to a spattering coating method, which lies in contact with the lubricating film.

The thickness of the spatter carbon layer is in the range of 5~100 Å, and preferably 30~100 Å, and the thickness of a plasma CVD carbon layer is preferably in the range of 30~100 Å.

In addition, the method for manufacturing a magnetic recording medium may comprise the steps of forming (1) a plasma CVD carbon layer, using a reactant gas containing carbon atoms as a starting material, according to a plasma CVD method; (2) a spatter carbon layer thereon, using a spatter gas, according to a spatter-coating method; and (3) a lubricating film thereon, which lies in contact with said spatter carbon layer.

The reactant gas used for forming a plasma CVD carbon layer according to a plasma CVD method is preferably a mixed gas of hydrocarbon and hydrogen, with a mixing ratio of hydrocarbon to hydrogen in the range of 2 to 1~1 to 100 by volume, wherein the hydrocarbon preferably comprises at least one type of hydrocarbon selected from among lower saturated hydrocarbons, lower unsaturated hydrocarbons, and lower cyclic hydrocarbons.

The spatter gas used for forming a spatter carbon layer according to the spatter-coating method is preferably argon, into which at least one gas selected from among nitrogen, hydrogen, and methane, is added at a mixing ratio to the argon of 0.1~100% by volume.

In addition, the method for manufacturing a magnetic recording medium according to the present invention may comprise a method for manufacturing a magnetic recording medium by means of forming a carbon protective film on a disc, the non-magnetic substrate of which is layered with a non-magnetic base film and magnetic film, using a reactant gas containing carbon atoms as a starting material, according to a plasma CVD method, and lubricating film thereon, which lies in contact with the carbon protective film, wherein said films are formed while performing bias applying to the disc, with subsequent films formed without bias applying to the disc.

The bias applied to the disc is preferably a pulse D.C. bias of −400~−10V, or a high frequency bias of 10~300 W.

The thickness of the carbon layer which is formed without bias applying to the disc is preferably in the range of 5~20 Å.

The aforementioned reactant gas is preferably a mixed gas of hydrocarbon and hydrogen, with a mixing ratio of hydrocarbon to hydrogen in the range of 2 to 1~1 to 100 by volume, wherein the hydrocarbon preferably comprises at least one type of hydrocarbon selected from among lower saturated hydrocarbons, lower unsaturated hydrocarbons, and lower cyclic hydrocarbons.

In addition, the magnetic recording medium according to the present invention may comprise a carbon protective film and a lubricating film on a disc, the non-magnetic substrate of which is layered with a non-magnetic base film and magnetic film; wherein the carbon protective film comprises a first carbon layer, that is formed according to a plasma CVD method while performing bias applying to the disc, and a second carbon layer, which lies in contact with the lubricating film, that is formed according to a plasma CVD method without bias applying to the disc.

The thickness of the second carbon layer is preferably in the range of 5~20 Å.

In addition, the magnetic recording medium according to the present invention may comprise a non-magnetic base film, magnetic film, protective film, and lubricating film on the non-magnetic substrate; wherein the protective film comprises a carbon layer, principally comprising carbon, on a tantalum nitrogen layer, comprising tantalum and nitrogen with a mixing ratio of nitrogen of 1~30% atm, with said carbon layer being formed according to a plasma CVD method, and lying in contact with the lubricating film.

The thickness of the carbon layer is preferably in the range of 5~100 Å, while the thickness of the tantalum nitrogen layer is preferably 1~95 Å.

The method for manufacturing a magnetic recording medium according to the present invention may comprise the steps of forming (1) a non-magnetic base film and magnetic film on a non-magnetic substrate; (2) a tantalum nitrogen layer thereon, which comprises a material containing nitrogen and tantalum, with a mixing ratio of nitrogen of 1~30% atm; (3) a carbon layer thereon, which is formed according to a plasma CVD method, using a reactant gas containing carbon atoms; and (4) a lubricating film thereon, which lies in contact with the carbon layer.

The aforementioned reactant gas is preferably a mixed gas of hydrocarbon and hydrogen with a mixing ratio of hydrocarbon to hydrogen in the range of 2 to 1~1 to 100 by volume. The hydrocarbon preferably comprises at least one type of hydrocarbon selected from among lower saturated hydrocarbons, lower unsaturated hydrocarbons, and lower cyclic hydrocarbons.

In addition, the method for manufacturing a magnetic recording medium according to the present invention may comprise a method for manufacturing a magnetic recording medium by means of forming (1) a non-magnetic base film and magnetic film; (2) a carbon film thereon, using a reactant gas containing carbon atoms as a starting material, according to a plasma CVD method; and subsequently (3) a lubricating film on the carbon protective film; wherein the surface of the carbon protective film is irradiated with ultraviolet rays before forming the lubricating film.

The wavelength of the ultraviolet rays irradiating the carbon protective film is preferably in the range of 100~400 nm, and the source of the ultraviolet rays is preferably an excimer emission lamp.

Additionally, the surface of the carbon protective film is preferably washed, using water, before forming the lubricating film thereon.

The aforementioned reactant gas preferably comprises a mixed gas of hydrocarbon and hydrogen, with a mixing ratio of hydrocarbon to hydrogen in the range of 2 to 1~1 to 100 by volume. The hydrocarbon preferably comprises at least one type of hydrocarbon selected from among lower saturated hydrocarbons, lower unsaturated hydrocarbons, and lower cyclic hydrocarbons.

In addition, the method for manufacturing a magnetic recording medium may comprise a method for manufacturing a magnetic recording medium by means of forming (1) a non-magnetic base film and magnetic film; (2) a carbon film thereon, using a reactant gas containing carbon atoms as a starting material, according to a plasma CVD method; and subsequently (3) a lubricating film on the carbon protective film; wherein the surface of the carbon protective film is washed, using water, before forming the lubricating film thereon.

When washing the carbon protective film, the cleaning water used preferably comprises water of a high purity.

In addition, the magnetic recording medium according to the present invention may comprise a non-magnetic base film, magnetic film, carbon protective film, and lubricating film on a non-magnetic substrate, wherein the carbon protective film is formed according to a plasma CVD method, followed by irradiation of the surface of the carbon protective film with ultraviolet rays.

Additionally, the magnetic recording medium according to the present invention may comprise a non-magnetic base film, magnetic film, carbon protective film, and lubricating film on a non-magnetic substrate, wherein the carbon protective film is formed, using a reactant gas containing carbon atoms as a starting material, according to a plasma CVD method, and the lubricating film principally comprises at least one chemical compound represented by the following formula (1) through (5), the number average molecular weights of which lie in the range of 500~6000.

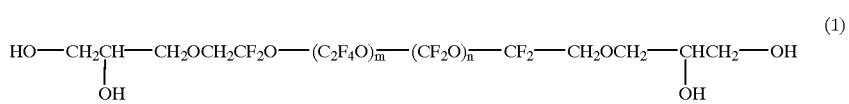

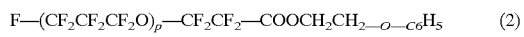

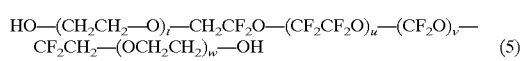

[wherein, m, n, p, q, r, s, t, u, v, and w each represents an integer].

Additionally, the lubricating film may principally comprise a mixture, which is formed by means of adding a chemical compound represented by the following formula (6), into the aforementioned chemical compound, at a mixing ratio 0.1~20% by weight.

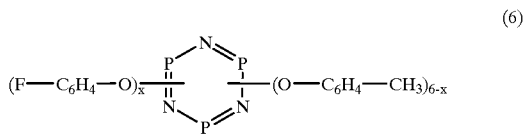

[wherein, x represents an integer between 0 and 6].

Among the aforementioned, in particular, a lubricating film principally comprising a compound represented by the aforementioned formula (1) or (5), the number average molecular weights of which lie in the range of 500~6000, is preferred.

In addition, the aforementioned magnetic recording medium may comprise a non-magnetic base film, a magnetic film containing Co, and a carbon protective film formed according to a plasma CVD method, on a non-magnetic substrate; wherein the extraction amount of Co is no greater than 3 ng/cm$^2$ with respect to the area of the substrate, and preferably no greater than 2 ng/cm$^2$, and more preferably, no greater than 1.5 ng/cm$^2$.

In addition, the method for manufacturing a magnetic recording medium according to the present invention may comprise a method for manufacturing a magnetic recording medium by means of forming (1) a non-magnetic base film and magnetic film on a non-magnetic substrate; and (2) a carbon protective film thereon, using a reactant gas containing carbon atoms as a starting material, according to a plasma CVD method; wherein the surface of the non-magnetic substrate is treated with texture-processing to form an average roughness (Ra) of the surface of the non-magnetic substrate is 1~20 Å.

When texture-processing the surface of the non-magnetic substrate in the aforementioned manner, the average roughness of the surface is more preferably in the range of 3~10 Å.

The method for texture-processing is preferably a mechanical method for texture-processing, in which abrasive particles are used, preferred examples of which may include processes in which the average particle diameter is 0.1~0.5 μm.

The method for mechanical texture-processing is a method for treating the surface of the non-magnetic substrate with texture-processing, by means of rotating the non-magnetic substrate while At the same time running an abrasive tape over the substrate in contact with the surface of the non-magnetic substrate, and supplying abrasive particles between the abrasive tape and non-magnetic substrate. In this method, it is preferable to oscillate the abrasive tape in a direction which crosses the aforementioned running direction, at a frequency of 0.1~5 Hz.

The rotational speed of the non-magnetic substrate when performing texture-processing is preferably in the range of 300~2000 rpm.

The aforementioned reactant gas is preferably a mixed gas of hydrocarbon and hydrogen, wherein the hydrocarbon preferably comprises at least one type of hydrocarbon selected from among lower saturated hydrocarbons, lower unsaturated hydrocarbons, and lower cyclic hydrocarbons.

In addition, the magnetic recording medium according to the present invention may comprise a non-magnetic base film, magnetic film, and carbon protective film, which are formed on the non-magnetic substrate according to a plasma CVD method; wherein the average surface roughness (Ra) of the non-magnetic substrate is in the range of 1~20 Å.

In addition, the method for manufacturing a magnetic recording medium according to the present invention is a method for manufacturing a magnetic recording medium by means of forming a carbon protective film on a disc, the non-magnetic substrate of which is layered with a non-magnetic base film and magnetic film, using a reactant gas containing carbon atoms as a starting material, according to a plasma CVD method; wherein bias applying is performed to the disc at the time of forming the carbon protective film, and the reactant gas is either butadiene gas or a mixed gas of butadiene and hydrogen comprising a mixing ratio of butadiene to hydrogen in the range of 100 to 0~1 to 100 by volume.

With regard to the aforementioned reactant gas, the mixing ratio of butadiene to hydrogen is preferably in the range of 100 to 0~1 to 25 by volume.

Additionally, the method for manufacturing a magnetic recording medium according to the present invention may comprise a method for manufacturing a magnetic recording medium by means of exposing a disc, in which both surfaces of the non-magnetic substrate are layered with a non-magnetic base film and magnetic film, to a reactant gas containing carbon atoms, while supplying electrical power to electrodes arranged on both sides of the disc to generate plasma, and form a carbon protective film on both sides of the disc, using the aforementioned reactant gas as a starting material, according to a plasma CVD method; wherein bias applying is performed to the disc at the time of forming the carbon protective film; the electrical power supplied to the aforementioned electrodes comprises high frequency electrical power; and the reactant gas comprises either butadiene gas or a mixed gas of butadiene and hydrogen, with a mixing ratio of butadiene to hydrogen in the range of 100 to 0~1 to 100 by volume.

When forming the carbon protective film, it is preferable to make the phases of electrical power supplied to each electrode arranged on both sides of the disc different from each other. The phase difference in the phase of electrical power supplied to each electrode is preferably in the range of 90~270°, and in particular, more preferably comprises the opposite phase (i.e., 180°).

The thickness of the carbon protective film is preferably in the range of 30~100 Å.

BRIEF DESCRIPTION OF THE DRAWINGS

FIG. 9(a) shows a front view and FIG. 9(b) shows a side view.

BEST MODES FOR CARRYING OUT THE INVENTION

Figure 1:
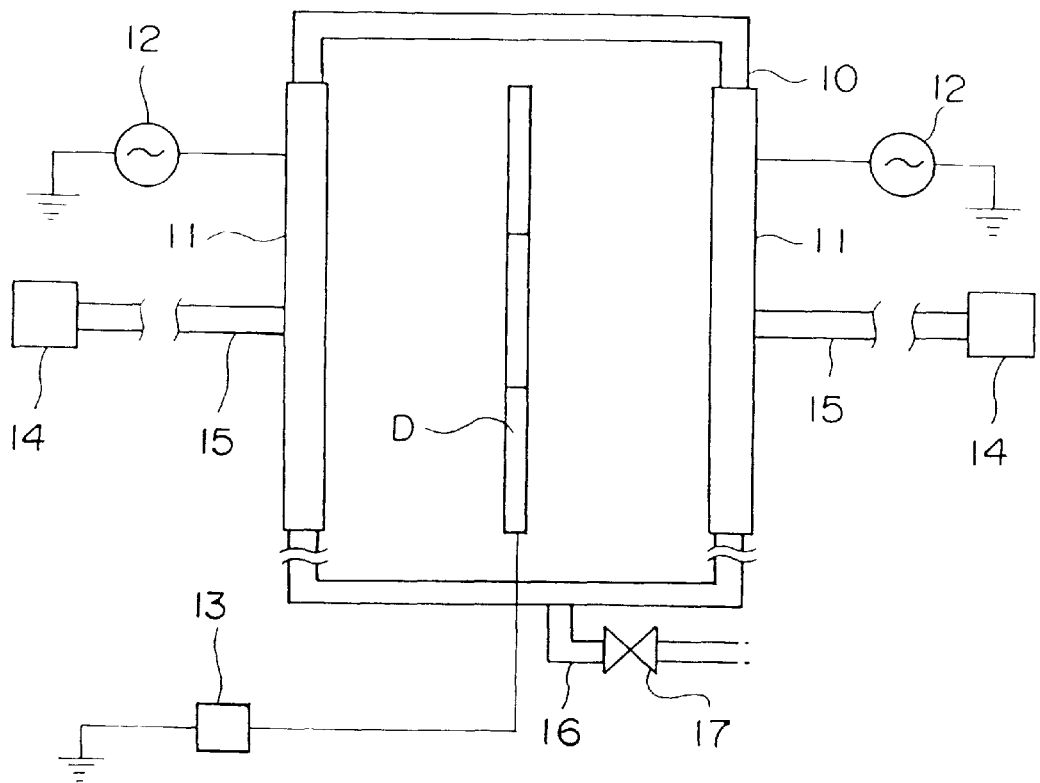
FIG. 1 is a schematic structural view, showing the plasma CVD apparatus, used in an embodiment of the method for manufacturing a magnetic recording medium according to the present invention.

FIG. 1 shows the plasma CVD apparatus, which serves as the main portion of the manufacturing apparatus used in an embodiment of the method for manufacturing a magnetic recording medium according to the present invention. This plasma CVD apparatus is used to form a carbon protective film, and comprises a chamber 10 for storing the disc;

electrodes 11 and 11 which are arranged in a manner such that they face the inner surfaces of both walls of chamber 10; high frequency electrical power sources 12 and 12 which supply high frequency electrical power to the aforementioned electrodes 11 and 11; an electrical bias source 13 which can be connected to the disc housed inside of the chamber 10; and a supply source 14 for the reactant gas which serves as a starting material of the carbon protective film formed onto the disc.

The chamber 10 is connected to introduction tubes 15 and 15 which direct the reactant gas supplied from the supply source 14 into the chamber 10, and an exhaust tube 16 which sends gas inside of the chamber 10 out of the system. This exhaust tube 16 is provided with an exhaust volume regulating valve 17, which allows for the appropriate regulation of the inner pressure of the chamber 10.

The high frequency electrical power source 12 is preferably one that can supply an electrical power of 50~2000 W to the electrode 11, when forming the carbon protective film.

Additionally, preferred examples of the electrical bias source 13 may include a high frequency electrical power source and/or a pulse D.C. electrical power source. The high frequency electrical power source can preferably apply a high frequency electrical power of 10~300 W to the disc. Additionally, the pulse D.C. electrical power source can preferably apply an average voltage of −400~−10V to the disc.

In the following, an embodiment of the method for manufacturing a magnetic recording medium according to the present invention is described, in which the aforementioned manufacturing equipment is used as an example.

Initially, a non-magnetic base film and magnetic film are formed on both sides of a non-magnetic substrate according to a method such as a spatter-coating method or the like, to obtain a disc D.

The non-magnetic substrate may comprise any substrate that is generally used as a substrate for a magnetic recording medium, examples of which may include an aluminium alloy substrate coated with a NiP metal film, and substrates comprising glass, silicone, and the like. The surface of the non-magnetic substrate is preferably treated with texture-processing such as mechanical texture-processing. In particular, the average surface roughness (Ra) is preferably in the range of 1~20 Å.

Preferred examples of the material for the non-magnetic base film include Cr, alloys of Cr and Ti, alloys of Cr and W, alloys of Cr and V, and alloys of Cr and Si.

Preferred examples of the material for the magnetic film include Co alloys such as alloys of Co and Cr; alloys of Co, Cr, and Ta; alloys of Co, Cr, and Pt; alloys of Co, Cr, Pt, and Ta; and the like.

The thicknesses of the non-magnetic base film and magnetic film are preferably in the range of 50~1000 Å, and 50~800 Å, respectively.

Subsequently, the disc D is transported into a chamber 10 of the plasma CVD apparatus, and the surface of the disc D is exposed to a reactant gas, which is continuously supplied from a supply source 14 via an introduction tube 15 into the aforementioned chamber 10, where this gas is removed via an exhaust tube 16 to continuously circulate the gas therein.

The reactant gas is a mixed gas of hydrocarbon and hydrogen, with a mixing ratio of hydrocarbon to hydrogen in the range of 2 to 1~1 to 100 by volume.

The hydrocarbon preferably comprises at least one type of hydrocarbon selected from among lower saturated hydrocarbons, lower unsaturated hydrocarbons, and lower cyclic hydrocarbons.

Examples of the lower saturated hydrocarbon may include methane, ethane, propane, butane, octane, and the like. Furthermore, examples of the lower unsaturated hydrocarbons may include ethylene, propylene, butylene, butadiene, and the like. Additionally, examples of the lower cyclic hydrocarbon may include benzene, toluene, xylene, styrene, naphthalene, cyclohexane, cyclohexadiene, and the like.

Among the aforementioned hydrocarbons, toluene is particularly preferred, and the mixing ratio of toluene to hydrogen is preferably in the range of 1 to 15~1 to 20 by volume.

Hereinafter, a "lower hydrocarbon" signifies a hydrocarbon having 1~10 carbon atoms. In addition, a "cyclic hydrocarbon" represents a hydrocarbon possessing a ring structure such as a benzene ring, and the like.

The reason for limiting the mixing ratio of hydrocarbon and hydrogen to the aforementioned range is twofold: a mixing ratio of hydrocarbon to hydrogen falling below the aforementioned range results in a reduced coating rate, which is unsuitable for practical, industrial production. On the other hand, a mixing ratio exceeding the aforementioned range, results in a high stress remaining within the carbon protective film, which in turn lowers the adhesion strength and CSS resistance of the resultant carbon protective film.

In addition, a lower hydrocarbon is preferably used as the hydrocarbon—if the number of carbon atoms of the hydrocarbon exceeds the aforementioned range, it is difficult to supply the hydrocarbon as a gas, and in addition, at the time of discharge, difficulty with the decomposition of hydrocarbons is encountered, which in turn leads to a carbon protective film containing high polymers that are inferior in strength.

When performing the aforementioned operation, the flow rate of the reactant gas is preferably 50~500 sccm. In addition, the inner pressure of the chamber 10 is preferably set at a predetermined value such as 0.1~10 Pa, by means of appropriately adjusting the flow rate of the exhaust gas from the chamber 10, using the exhaust regulating valve 17.

At the same time, using the high frequency electrical power source 12, high frequency electrical power of preferably 50~2000 W is supplied to the electrodes 11 to generate plasma, and a carbon protective film is formed on both sides of the disc D by means of plasma chemical gas phase growth, using the aforementioned reactant gas as a starting material. The thickness of the carbon protective film is preferably in the range of 30~100 Å. The carbon protective film can be formed at the same time on both sides of the disc D.

When supplying electrical power to the electrodes 11 and 11, it is preferable to make the phases of electrical power supplied to each electrode 11 different from each other. By means of making the phases of electrical power supplied to each electrode different, the coating rate and durability of the protective film can be improved. The difference in the phase of electrical power supplied to each electrode is preferably in the range of 90~270°, and in particular the opposite phase (i.e., 180°) is preferred.

In addition, when forming the carbon protective film, it is preferable to form a film while performing bias applying, such as high frequency bias or pulse D.C. bias, to the disc D, using the electrical bias source 13. When using a high frequency electrical source as the electrical bias source 13, high frequency electrical power of 10~300 W is preferably applied to the disc D. Additionally, when using a pulse D.C. electrical source as the electrical bias source 13, a voltage of −400~−10V (at an average) is preferably applied to the disc D. Furthermore, the width of pulse is preferably in the range of 10~50000 ns, and the frequency is preferably in the range of 10 kHz~1 GHz.

When performing bias applying to the disc D, bias applying may be performed directly to the disc D, or alternatively bias applying may be performed via a disc carrier (not shown).

In order to accommodate for practical, industrial production, the coating rate of the carbon protective film is preferably at least 200 Å/min, and more preferably at least 400 Å/min.

In addition, a lubricating film may be provided onto the protective film, by means of applying lubricant such as a fomblin lubricant, perfluoropolyether, and the like, according to a dipping method or the like.

In the following, the effects of the present invention are explained in detail using concrete examples.

TEST EXAMPLES 1~12

An aluminium substrate coated with a NiP metal film, which had been treated with texture-processing using an alumina slurry to form an average surface roughness of 20 Å, was set into the chamber of a DC Magnetron Spatter Apparatus, and the gas within the chamber was exhausted to an ultimate vacuum level of $2 \times 10^{-6}$ Torr. Subsequently, a base film comprising Cr with a thickness of 400 Å, and a magnetic film comprising an alloy of $Co_{82}Cr_{15}Ta_3$ (at %) were successively formed on both sides of the substrate, to obtain a disc D.

Subsequently, the disc D was transported into a chamber 10 of the aforementioned plasma CVD apparatus, and a mixed gas of hydrocarbon and hydrogen comprising a mixing ratio shown in Table 1 was supplied into the chamber as a reactant gas. The inner pressure of the chamber 10 was maintained at 2 Pa.

At the same time, high frequency electrical power (of 13.56 MHz) of 300 W was supplied to the electrodes 11 to generate plasma while a high frequency bias of 50 W, under the conditions shown in Table 1, was applied to the disc D, to form a carbon protective film with a thickness of 50 Å on both sides of the disc D. The temperature of the disc D during coating was maintained at 130° C. (In Test Example 9, the electrical power supplied to the electrode 11 was 600 W, and the temperature of the disc during coating was 136° C. Furthermore, the bias used in Test Example 3 comprised a D.C. bias of −200V). The distance between the disc D and electrode 11 was set at 30 mm. Furthermore, in the table, the "RF phase difference" signifies the difference in the phase of electrical power supplied to the two electrodes 11 and 11.

TABLE 1

| | Gas type | Mixing ratio (sccm) | Bias frequency (kHz) | RF differ-ence (°) | Coating rate (Å/min) | Note |
|---|---|---|---|---|---|---|
| Test Example 1 | Toluene | 10:150 | 400 | 180 | 335 | |
| Test Example 2 | Toluene | 10:120 | 400 | 0 | 202 | |
| Test Example 3 | Toluene | 10:120 | D.C. bias | 180 | 188 | −200 V |
| Test Example 4 | Toluene | 10:120 | 400 | 180 | 460 | |
| Test Example 5 | Toluene | 15:120 | 400 | 180 | 1098 | |

TABLE 1-continued

| | Gas type | Mixing ratio (sccm) | Bias frequency (kHz) | RF differ-ence (°) | Coating rate (Å/min) | Note |
|---|---|---|---|---|---|---|
| Test Example 6 | Toluene | 100:50 | 400 | 180 | 1181 | |
| Test Example 7 | Toluene | 100:0 | 400 | 180 | 2344 | |
| Test Example 8 | Methane | 100:0 | 400 | 180 | 324 | |
| Test Example 9 | Methane | 60:60 | no bias | 0 | 161 | |
| Test Example 10 | Ethane | 100:0 | 400 | 180 | 385 | |
| Test Example 11 | Acetone | 100:0 | 400 | 180 | 221 | |
| Test Example 12 | Toluene | 10:150 | no bias | 180 | 290 | |

*Mixing ratio: the ratio of the gas shown in the "Gas Type" column to $H_2$

Table 1 shows the coating rates of each carbon film. Comparing Test Examples 4 through 7, it is clear that increasing the mixing ratio of toluene results in an increased coating rate. However, in Test Examples 6 and 7, the coating rate did not improve relative to the mixing ratio of toluene. This result is assumed secondary to the diffusion of plasma from sparks incurred during discharge. In addition, when comparing Test Examples 1~5 and 12, it is clear that the improvements in the coating rate can be achieved by means of bias applying, in particular the high frequency bias applying, and/or making the phases of the electrical power supplied to electrodes which are at front and reverse sides of the disc different from each other.

Subsequently, a fomblin lubricant was applied to the carbon protective film at 15 Å, to obtain a magnetic recording medium.

The resultant magnetic recording medium was used in the CSS test, as described in the following. In this test, a CSS operation was performed 20000 times using an MR head, wherein once cycle consisted of building up for five seconds; high speed rotation for one second; trailing down for five seconds; and parking for one second, at a rotational speed of 7200 rpm, under the conditions of ambient temperature and normal humidity.

Furthermore, with regard to Test Examples 3~5, a stiction value was monitored, and another CSS test was performed in which a CSS operation was carried out 5000 times, using the same cycle as described above, at a temperature of 40° C. with a humidity of 80%. The results are shown in Table 2. When a crash occurred during the CSS test performed under a normal temperature and pressure, the number of CSS cycles at the time when the crash occurred was recorded.

In Table 2, the ratio of the g-band peak value (vG-line) and d-band peak value (Id/Ig) according to Raman spectral analysis (argon ion laser excitation) is also shown for reference. In general, when a carbon film is analyzed according to the Raman spectral analysis, a profile with two peaks is obtained in which a g-band is measured at approximately 1530 $cm^{-1}$ and a d-band is measured at approximately 1400 $cm^{-1}$. A smaller value for Id/Ig, or alternatively, a higher frequency for the g-band peak results in greater diamond-like characteristics in the carbon film.

Subsequently, the same magnetic recording medium used in the CSS test was used in a corrosion test, as described in the following. This test comprised the steps of leaving the test medium in an oven at a temperature of 60° C. with a humidity of 80% for 96 hours; subsequently soaking the medium in 50 cc of pure water for 30 minutes; and measuring the amount of Co extracted in the pure water. In addition, another test, was performed in the same manner as described above, with the exception that the aforementioned magnetic recording medium was allowed to sit at a normal temperature (25° C.) and humidity (50%) for 96 hours. The results are shown in Table 2.

Furthermore, in the present specification, the term "crash" signifies the occurrence of a head crash during the CSS test, while the phrase "no crash" signifies that such a head crash did not occur.

As described in the aforementioned, according to the present invention, it is possible to efficiently form a carbon protective film possessing a superior durability. Accordingly, it is possible to make the carbon protective film thinner while maintaining a sufficient durability, thereby reducing the spacing loss.

Thus, it is possible to efficiently provide a reliable, magnetic recording medium, which can support a sufficiently high recording density without reduction in its output properties.

In the following, another embodiment of the method for manufacturing a magnetic recording medium according to

TABLE 2

|  | CSS Test | | | Co Corrosion Test | | Raman Analysis | |
| --- | --- | --- | --- | --- | --- | --- | --- |
|  | Normal temp & pressure | 40° C., 80% | Stiction | Normal ($\mu$g/disc) | 60° C., 80% ($\mu$g/disc) | vG-line ($cm^{-1}$) | Id/Ig |
| Test Example 1 | 8500 | — | — | 0.07 | 0.17 | 1543.2 | 0.56 |
| Test Example 2 | 5000 | — | — | 0.08 | 0.18 | 1550.2 | 0.66 |
| Test Example 3 | No crash | 5000 | 0.44 | 0.06 | 0.14 | 1559.2 | 1.56 |
| Test Example 4 | No crash | 5000 | 0.38 | 0.05 | 0.07 | 1553.0 | 0.63 |
| Test Example 5 | No crash | 5000 | 0.34 | 0.08 | 0.12 | 1524.5 | 0.39 |
| Test Example 6 | 7000 | — | — | 0.18 | 0.28 | 1547.2 | 0.78 |
| Test Example 7 | 250 | — | — | 0.22 | 0.54 | — | — |
| Test Example 8 | 10 | — | — | 0.11 | 0.18 | — | — |
| Test Example 9 | 4000 | — | — | 0.09 | 0.19 | 1534.0 | 0.45 |
| Test Example 10 | 10 | — | — | 0.14 | 0.22 | — | — |
| Test Example 11 | 10 | — | — | 0.13 | 0.77 | — | — |
| Test Example 12 | 20 | — | — | 0.18 | 0.25 | — | — |

From Table 2, it is clear that with the magnetic recording medium manufactured according to Test Examples 1 through 6, the above described crashes did not occur, even when the CSS operation was performed greater than 5000 times. In particular, Test Examples 3~5, did not result in crashes even when the CSS operation was performed 20000 times, and also did not result in crashes when the CSS operation was performed 5000 times, under the conditions of a temperature of 40° C. and a humidity of 80%, and thus these examples exhibited a favorable performance with regard to resistance to CSS.

On the other hand, Test Example 7, in which the mixing ratio of toluene and $H_2$ was out of the range defined in the present invention, and Test Example 12, in which bias applying was not performed, resulted in a modest coating rate, but a magnetic recording medium of inferior durability.

Additionally, the magnetic recording medium obtained according Test Examples 8~11, in which methane, ethane, or acetone was employed, all exhibited an inferior durability.

In addition, the results of the corrosion test confirmed that the extraction amount of Co of all magnetic recording media was approximately 1~2 ng per medium, leaving no problems with respect to practical use.

Furthermore, the results of the CSS test showed clearly that it is possible to improve the durability of the resultant magnetic recording medium, by means of making the phases of electrical power supplied to the electrodes on each side of the disc different.

In addition, according to the results of Test Examples 1~6, it is possible to form a carbon protective film at a coating rate suitable for industrial production, and to provide a magnetic recording media exhibiting superior performance with respect to their resistance to CSS and resistance to corrosion.

the present invention is described, using an example in which the plasma CVD apparatus shown in FIG. 1 is employed.

Initially, a non-magnetic base film and magnetic film are formed on both sides of the non-magnetic substrate according to a method such as a spatter-coating method or the like, to obtain a disc D.

The non-magnetic substrate can comprise any substrate that is generally used as a substrate for a magnetic recording medium, as described in the aforementioned. The material and thickness of the non-magnetic base film and magnetic film are also as described aforementioned.

Subsequently, the disc D, layered with a non-magnetic base film and magnetic film on the non-magnetic substrate according to the aforementioned operations, is transported into chamber 10 of the aforementioned plasma CVD apparatus, and the surface of the disc D is exposed to the reactant gas, which is continuously supplied from a supply source 14 via an introduction tube 15 into the chamber 10, where the gas is exhausted via an exhaust tube 16 to circulate the gas therein.

The reactant gas is preferably a mixed gas comprising hydrocarbon and hydrogen, with a mixing ratio of hydrocarbon to hydrogen in the range of 2 to 1~1 to 100 by volume, as described in the aforementioned. The hydrocarbon preferably comprises at least one type of hydrocarbon selected from among lower saturated hydrocarbons, lower unsaturated hydrocarbons, and lower cyclic hydrocarbons.

When carrying out this operation, the flow rate of the reactant gas is preferably 50~500 sccm. Additionally, the inner pressure of the chamber 10 is preferably set at a predetermined value, such as 0.1~10 Pa.

At the same time, using the high frequency electrical power source 12, a high frequency electrical power of preferably 50~2000 W is supplied to the electrodes 11 to generate plasma, and a carbon protective film is formed on both sides of the disc D by means of the plasma chemical gas phase growth, using the aforementioned reactant gas as a starting material. The thickness of the carbon protective film is preferably in the range of 30~100 Å.

When supplying electrical power to the electrodes 11 and 11, it is preferable to make the phases of electrical power supplied to each electrode 11 different. By means of making the phases of electrical power supplied to each electrode different, the coating rate and durability of the protective film can be improved. The difference in the phase of electrical power supplied to each electrode is preferably in the range of 90~270°, with a particular preference for the opposite phase (i.e., 180°).

According to this embodiment of the method for manufacturing a magnetic recording medium, when forming a carbon protective film, it is preferable to form the film while applying pulse D.C. bias having a frequency of 1 kHz~100 GHz (with a cycle of 10 ns~1 ms) and pulse width of 1 ns~500 μs, to the disc D, using an electrical bias source 13.

A pulse D.C. bias frequency of less than 1 kHz or exceeding 100 GHz, results in a carbon protective film of inferior durability. In particular, when the frequency is less than 1 kHz, the coating rate tends to be lower, leading to an unfavorable reduction in the production efficiency.

The frequency and pulse width of the aforementioned pulse D.C. bias is preferably 10 kHz~1 GHz, and 10 ns~50 μs, respectively.

Furthermore, the average voltage of the pulse D.C. bias applied to the disc is preferably −400~−10V.

When the average voltage is less than −400V, sparks are likely to be generated during the coating, leading to a high likelihood of generating abnormal growth portions on the surface of the carbon protective film. When the average voltage exceeds −10V, the carbon protective film tends to contain a greater number of high polymers, which are inferior in strength.

In addition, a lubricating film may be provided on the protective film by means of applying the aforementioned lubricant.

Figure 2:
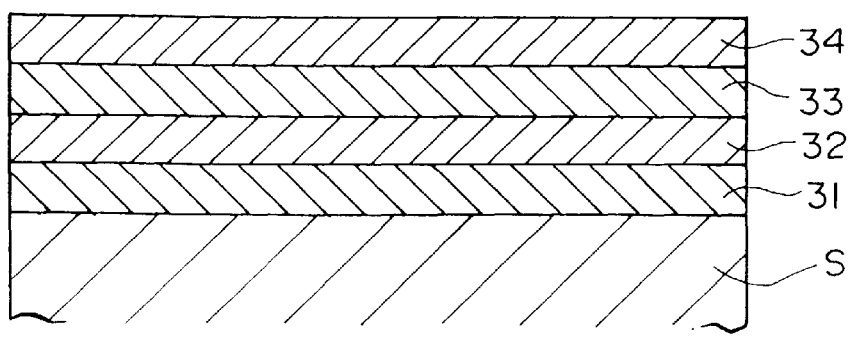
FIG. 2 is a cross-sectional view, showing an embodiment of the magnetic recording medium according to the present invention.

Examples of the magnetic recording medium manufactured according to the aforementioned manufacturing method may include a magnetic recording medium with the structure shown in FIG. 2.

In the magnetic recording medium according to this embodiment, a non-magnetic substrate S, a non-magnetic base film 31, a magnetic film 32, a carbon protective film 33, and a lubricating film 34 are provided.

According to the aforementioned manufacturing method, at the time of forming the carbon protective film, it is possible to efficiently form a carbon protective film displaying a superior durability, since pulse D.C. bias with a frequency of 1 kHz~100 GHz and pulse width of 1 ns~500 μs is applied to the disc. Accordingly, it is possible to make the carbon protective film thinner while also maintaining durability, and thus provide a magnetic recording medium that is capable of reducing spacing loss. In addition, it is possible to increase the coating rate, and production efficiency therein.

Therefore, it is possible to efficiently provide a reliable, magnetic recording medium, which can support a sufficiently high recording density without lowering the output properties thereof.

In the following, the effects of the present invention are specified, using concrete examples.

TEST EXAMPLES 13~26

After an aluminium alloy substrate coated with a NiP metal film (with a diameter of 95 mm and thickness of 0.8 mm) was treated with mechanical texture-processing to form an average surface roughness of 20 Å, a non-magnetic base film (with a thickness of 600 Å) comprising a Cr alloy, and a magnetic film comprising a Co alloy were successively formed on both sides of the substrate, using spattering device (3010 manufactured by Anelva) to obtain a disc D.

Subsequently, the disc D was transported into a chamber 10 of the aforementioned plasma CVD apparatus, and a mixed gas was supplied from the supply source 14 into the chamber to achieve a flow rate of 130 sccm.

A mixed gas of toluene and hydrogen, with a mixing ratio of toluene to hydrogen of 1 to 12 by volume, was used as the reactant gas. Additionally, the inner pressure of the chamber 10 was maintained at 6 Pa.

At the same time, pulse D.C. bias was applied to the disc under the conditions shown in Table 3, using an electrical bias source 13, and high frequency electrical power of 300 W, or alternatively 500 W, was supplied to the electrodes 11 to generate plasma and form a carbon protective film with a thickness of 50 Å on both sides of the disc D.

The temperature of the disc D during coating was maintained at 130° C. The difference in the phase of high frequency electrical power supplied to each electrode 11 was set at 180°. In addition, the distance between the disc D and electrode 11 was set at 30 mm.

Subsequently, a magnetic recording medium was obtained by means of applying a fomblin lubricant (Fomblin Zdol 2000) to the carbon protective film, according to a dipping method, to form a lubricating film thereon with a thickness of 20 Å.

The CSS test described in the following was performed on the resultant magnetic recording media. In the test, using a MR head, a CSS operation was performed on the magnetic recording medium 10,000 times, at a rotational speed of 7200 rpm, and a temperature of 40° C. with a humidity of 80%. After allowing the magnetic recording medium to sit for 1 hour, the dynamic stiction value was monitored. The results are shown in Table 3.

In the table, the term "plasma RF electrical power" represents the electrical power supplied to the electrodes 11 during the formation of the carbon protective film.

TABLE 3

|  | Bias frequency | Pulse width | Bias voltage (V) | Plasma RF electrical power (W) | Coating rate (Å/min) | Stiction (−) |
| --- | --- | --- | --- | --- | --- | --- |
| Test Example 13 | 1 kHz | 500 ns | −120 | 500 | 405 | 0.81 |
| Test Example 14 | 200 kHz | 500 ns | −120 | 500 | 753 | 0.40 |
| Test Example 15 | 2 MHz | 250 ns | −120 | 300 | 712 | 0.55 |

TABLE 3-continued

|  | Bias frequency | Pulse width | Bias voltage (V) | Plasma RF electrical power (W) | Coating rate (Å/min) | Stiction (−) |
|---|---|---|---|---|---|---|
| Test Example 16 | 10 MHz | 50 ns | −120 | 500 | 844 | 0.46 |
| Test Example 17 | 200 kHz | 1 ns | −120 | 500 | 477 | 0.88 |
| Test Example 18 | 200 kHz | 1000 ns | −120 | 500 | 777 | 0.44 |
| Test Example 19 | 1 kHz | 500000 ns | −120 | 500 | 624 | 0.67 |
| Test Example 20 | 70 GHz | 50 ns | −100 | 500 | 553 | 0.66 |
| Test Example 21 | 101 GHz | 1 ns | −100 | 500 | 413 | Crash |
| Test Example 22 | 0.5 kHz | 500 ns | −100 | 500 | 388 | Crash |
| Test Example 23 | 200 kHz | 500 ns | −400 | 500 | 1042 | Crash |
| Test Example 24 | 200 kHz | 0.5 ns | −100 | 500 | 340 | Crash |
| Test Example 25 | 1 kHz | 0.8 ms | −100 | 500 | 314 | Crash |
| Test Example 26 | — | — | — | 300 | 335 | Crash |

From the results of the CSS test shown in Table 3, it is clear that the magnetic recording media obtained according to the method for applying pulse D.C. bias with a frequency of 1 kHz~100 GHz and pulse width of1 ns~500 µs to the disc, at the time of forming the carbon protective film, were superior in durability and exhibited a higher coating rate.

As described in the aforementioned, according to the present invention, it is possible to efficiently form a carbon protective film with a superior durability. Accordingly, it is possible to make the carbon protective film thinner while also maintaining a sufficient durability, and thereby reduce spacing loss.

Therefore, it is possible to provide a highly reliable, magnetic recording medium, which can support a sufficiently high recording density without lowering the output properties.

Figure 3:
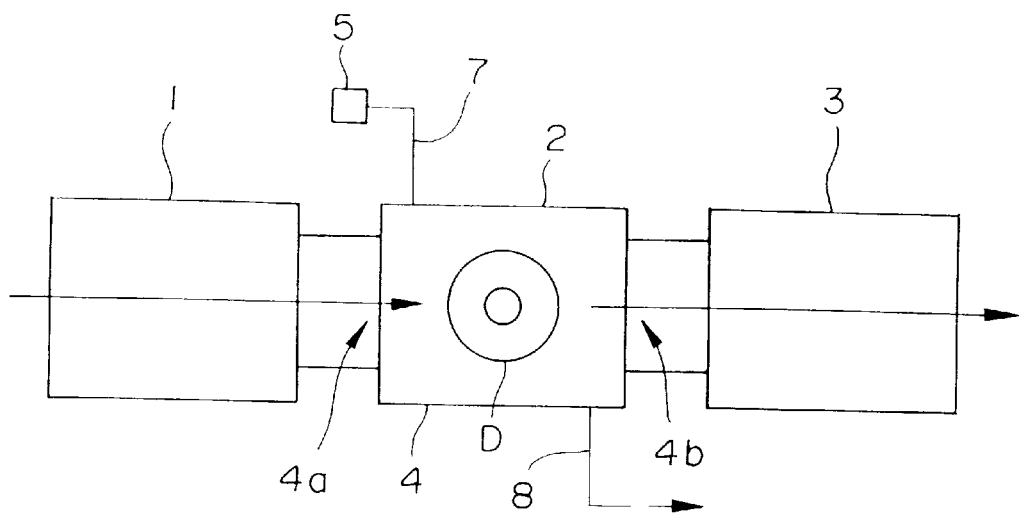
FIG. 3 is a schematic structural view, showing the main portion of the magnetic recording medium manufacturing apparatus which employs the plasma CVD apparatus shown in FIG. 1.

FIG. 3 shows the manufacturing equipment used in another embodiment of the method for manufacturing a magnetic recording medium according to the present invention. The manufacturing equipment shown herein is provided with a spattering device 1, temperature regulating device 2, and plasma CVD apparatus 3.

The spattering device 1 is used to form a non-magnetic base film, magnetic film, and the like, on a non-magnetic substrate, and may comprise any apparatus generally used for manufacturing a magnetic recording medium.

The temperature regulating device 2 sets the temperature of the disc sent to the aforementioned plasma CVD apparatus 3 to a predetermined degree, and comprises a chamber 4, which stores the disc, and a supply source for supplying the temperature adjusting gas 5, which is used for adjusting the temperature of the disc in the chamber 4. The aforementioned chamber 4 is connected to an introduction tube 7, which directs the temperature adjusting gas supplied from the supply source 5 into the chamber 4, and an exhaust tube 8, which expels the gas inside the chamber 4 out of the system.

The aforementioned chamber 4 comprises an airtight structure, and is provided with a transport entrance 4a, which transports a disc passing through the spattering device 1 into the chamber 4, and a transport exit 4b, which transports the disc out of the chamber 4 towards the aforementioned plasma CVD apparatus 3.

The aforementioned plasma CVD apparatus 3 may comprise the same structure shown in FIG. 1.

In the following, another embodiment of the method for manufacturing a magnetic recording medium according to the present invention is described, using an example in which the aforementioned manufacturing equipment is employed.

Initially, using a spattering device 1, a non-magnetic base film and magnetic film are formed on both sides of the non-magnetic substrate, to obtain a disc D.

The non-magnetic substrate may comprise any substrate that is generally used as a substrate for a magnetic recording medium, as described in the aforementioned. The material and thickness of the non-magnetic base film and magnetic film are similarly as described in the aforementioned.

In general, when forming the non-magnetic base film and magnetic film, the temperature of the non-magnetic substrate is approximately 250~350° C.

Subsequently, the disc D, layered with the non-magnetic base film and magnetic film on the non-magnetic substrate according to the aforementioned operations, is transported into the chamber 4 of the temperature regulating device 2 through the transport entrance 4a, and the disc D in the chamber 4 is exposed to the temperature adjusting gas, which is supplied from the supply source 5 via the introduction tube 7 into the chamber 4, from which the gas is exhausted via the exhaust tube 8 to circulate the gas within.

The temperature adjusting gas is not particularly limited, as long as it does not adversely affect the disc D; examples of the aforementioned gas may include hydrogen, nitrogen, helium, neon, argon, and the like.

The temperature of the temperature adjusting gas is appropriately determined according to the desired temperature of the disc D, and other conditions, such as a flow rate of the temperature adjusting gas and the like; however, this temperature is preferably in the range of 0~250° C.

When carrying out this operation, the flow rate of the temperature adjusting gas is preferably 50~1500 sccm. Additionally, the inner pressure of the chamber 4 is preferably set at a predetermined value, e.g., 1~30 Pa by means of appropriately adjusting the flow rate of the exhaust gas from the chamber 4.

By means of exposing the disc D to the temperature adjusting gas, heat exchange is performed between the disc D and temperature adjusting gas. This operation is continued until the temperature of the disc D is in the range of 100~250° C., preferably 150~250° C., and more preferably 150~200° C.

If the temperature of the disc D is less than 100° C., the density of the carbon protective film formed onto the disc D, according to the operation described in the following, results in a low value, which leads to an inferior durability.

If the temperature exceeds 250° C., the kinetic energy of the molecules of the reactant gas becomes too high during the formation of the carbon protective film according to the operation described in the following, which in turn results in difficulty in adhering the molecules to the disc D, thereby leading to a low coating rate. In addition, the resultant carbon protective film contains a greater number of high polymer components that are inferior in strength, which then lead to an inferior durability.

Subsequently, the disc D is transported out of the temperature regulating device 2 via the transport exit 4b, and immediately into chamber 10 of the aforementioned plasma CVD apparatus 3, where the surface of the disc D, the temperature of which has been adjusted to the aforementioned value by means of the temperature regulating device 2, is exposed to a reactant gas, which is supplied from the supply source 14 via the introduction tube 15 into the chamber 10. Gas is continuously exhausted through the exhaust tube 16 to circulate the gas within chamber 10.

The reactant gas is preferably a mixed gas of hydrocarbon and hydrogen with a mixing ratio of hydrocarbon to hydrogen in the range of 2 to 1~1 to 100 by volume as described in the aforementioned, and the hydrocarbon preferably comprises at least one type of hydrocarbon selected from among lower saturated hydrocarbons, lower unsaturated hydrocarbons, and lower cyclic hydrocarbons.

When carrying out the operation, the flow rate of the reactant gas is preferably in the range of 50~500 sccm. In addition, the inner pressure of the chamber 10 is preferably set at a predetermined value, e.g., 0.1~10 Pa by means of appropriately adjusting the flow rate of the exhaust gas from the chamber 10, using the exhaust regulating valve 17.

At the same time, using the high frequency electrical power source 12, high frequency electrical power of preferably 50~2000 W is supplied to the electrodes 11 to generate plasma and form the carbon protective film on both sides of the disc D by means of plasma chemical gas phase growth, using the aforementioned reactant gas as a starting material. The thickness of the carbon protective film is preferably in the range of 30~100 Å.

When supplying electrical power to the electrodes 11 and 11, it is preferable to make the phases of electrical power supplied to each electrode different. By means of making the phases of electrical power supplied to each electrode 11 different, it is possible to improve the coating rate and durability of the protective film. The difference in the phase of electrical power supplied to each electrode is preferably in the range of 90~270°, and in particular, more preferably comprises the opposite phase (i.e., 180°).

Herein, it is preferable to form the film while performing bias applying such as high frequency bias and pulse D.C. bias to the disc, using the electrical bias source 13.

The conditions of bias, such as voltage and the like, are preferably as described in the aforementioned.

In addition, a lubricating film may be provided on the protective film by means of applying a lubricant such as fomblin lubricant, perfluoropolyether, and the like, according to a dipping method or the like.

In the aforementioned manufacturing method, since the disc temperature is set at 100~250° C. in advance, during formation of the carbon protective film, the carbon protective film is able to support a higher density, which leads to a superior durability. Accordingly, it is possible to make the carbon protective film thinner, while also maintaining a sufficient durability, and thus provide a magnetic recording medium that is capable of reducing spacing loss at the time of recording and replay.

Therefore, it is possible to provide a highly reliable, magnetic recording medium, which can support a sufficiently high recording density without lowering the output properties thereof.

In addition, it is possible to accelerate adhesion of the materials of the carbon protective film, derived from the reactant gas, to the disc D, and thereby increase the coating rate and production efficiency.

The reason for the improvement in durability of the carbon protective film by means of setting the temperature of the disc D in the aforementioned range at the time of forming the aforementioned carbon protective film is unclear; however, the following is hypothesized.

Namely, if the temperature is less than the aforementioned range, the kinetic energy of the molecules of the materials of the carbon protective film at the time of forming the carbon protective film is low, which results in an insufficient tightness and irregular configuration of the carbon protective film molecules. Accordingly, the resultant carbon protective film comprises a lower density, leading to an inferior durability of the carbon protective film.

In addition, if the temperature exceeds the aforementioned range, high polymer reactions such as polymerization, condensation, and the like are more likely to occur, and the carbon compounds, derived from the supplied reactant gas, will tend to form high polymers on the surface of the disc D. As a result, the number of high polymer components in the carbon protective film, which exhibit an inferior strength, increases, thereby leading to an inferior durability in the carbon protective film.

In the following the effects of the present invention are specified, using concrete examples.

TEST EXAMPLES 27~32

Magnetic recording medium was manufactured as described in the following, using the equipment shown in FIGS. 1 and 3.

After an aluminium alloy substrate coated with a NiP metal film (with a diameter of 95 mm and thickness of 0.8 mm) was treated with mechanical texture-processing to form an average surface roughness of 20 Å, a non-magnetic base film (with a thickness of 600 Å) comprising a Cr alloy, and a magnetic film comprising a Co alloy were successively formed on both sides of the substrate, using a spattering device (3010 manufactured by Anelva), to obtain a disc D. At the time of forming the aforementioned non-magnetic base film and magnetic film, the temperature of the substrate was set at 250° C.

Subsequently, the disc D was transported into the chamber 4 of the temperature regulating device 2, where hydrogen gas (the temperature of which was adjusted in advance to 20° C.) for use in adjusting the temperature of the disc was supplied at a flow rate shown in Table 4. In this manner, the temperature of the disc D was adjusted to the values shown in Table 4 by means of exposing the disc D to the hydrogen gas for a period of time shown in Table 4. Furthermore, the temperature of the disc D was measured by means of a radiation thermometer provided in chamber 4. The inner pressure of the chamber 4 was set at 10 Pa.

Subsequently, the disc D was immediately transported into the chamber 10 of the plasma CVD apparatus 3, and a reactant gas was supplied from the supply source 14 into the chamber 10 at a flow rate of 130 sccm. A mixed gas of toluene and hydrogen, with a mixing ratio of toluene to hydrogen of 1 to 10 by volume, was used as the reactant gas. In addition, the inner pressure of the chamber 10 was set at 6 Pa.

At the same time, high frequency electrical power of 500 W was supplied to the electrodes 11 to generate plasma and form a carbon protective film with a thickness of 50 Å on both sides of the disc D. The temperature of the disc D was set as shown in Table 4, by means of the aforementioned temperature regulating device 2. In addition, high frequency electrical power of 50 W was applied to the disc D, using the electrical bias source 13. In addition, the difference in the phase of high frequency electrical power supplied to each electrode 11 was set at 180°.

Subsequently, fomblin lubricant was applied to the carbon protective film, to form a lubricating film with a thickness of 15 Å, and yielding a magnetic recording medium.

The CSS test described in the following was performed on the resultant magnetic recording media. In the CSS test, using MR head, a CSS operation was performed 20,000 times at a rotational speed of 7200 rpm, and a temperature of 40° C. with a humidity of 80%. The dynamic stiction value was monitored after allowing the magnetic recording medium to sit for one hour. The results are shown in Table 4.

TEST EXAMPLES 33~36

The magnetic recording medium was manufactured in the same manner as in the aforementioned test examples, with the exception that the temperature of the disc D, at the time of forming the carbon protective film, was adjusted by means of changing the temperature of the disc D at the time of transport into the temperature regulating device 2, and/or the flow rate or temperature of the temperature adjusting gas in the temperature adjusting operation, using the temperature regulating device 2. The test results are also shown in Table 4.

TABLE 4

| | Temp regulating time (sec) | Flow rate of temp. adjusting gas (sccm) | Disc temp. when forming film (° C.) | Coating rate (Å/min) | Stiction (−) |
|---|---|---|---|---|---|
| Test Example 27 | 8 | 80 | 238 | 617 | 0.72 |
| Test Example 28 | 13 | 80 | 220 | 660 | 0.66 |
| Test Example 29 | 20 | 80 | 174 | 765 | 0.67 |
| Test Example 30 | 8 | 200 | 191 | 720 | 0.63 |
| Test Example 31 | 13 | 200 | 150 | 830 | 0.73 |
| Test Example 32 | 6 | 80 | 250 | 506 | 0.68 |
| Test Example 33 | 0 | 0 | 327 | 339 | 2.59 |
| Test Example 34 | 2 | 80 | 304 | 381 | 1.48 |
| Test Example 35 | 13 | 2000 | 50 | 1850 | Crash |
| Test Example 36 | 0 | 0 | 400 | 225 | Crash |

From the results shown in Table 4, it is clear that the magnetic recording media manufactured according to a method in which the temperature of the disc D was set in the range of 100~250° C., at the time of forming the carbon protective film, exhibited a lower stiction value after performing the CSS test and a superior durability, in addition to a higher coating rate, when compared to the magnetic recording media manufactured according to a method in which the temperature of the disc D was set outside of the aforementioned range.

As described in the aforementioned, in the method for manufacturing a magnetic recording medium according to the present invention, it is possible to provide a carbon protective film comprising a high density and superior durability. Accordingly, it is possible to manufacture a thinner carbon protective film while also maintaining a sufficient durability, and thus to provide a magnetic recording medium that is capable of reducing spacing loss at the time of recording and replay.

Therefore, it is possible to provide a highly reliable magnetic recording medium, which can support a sufficiently high recording density without lowering the output properties thereof. Additionally, it is possible to also increase the production efficiency.

In the following, another embodiment of the method for manufacturing a magnetic recording medium according to the present invention is described, using an example which employs the aforementioned plasma CVD apparatus shown in FIG. 1.

Initially, a non-magnetic base film and magnetic film were formed on both sides of non-magnetic substrate, according to a method such as a spatter-coating method, and the like, to obtain a disc D.

The non-magnetic substrate may comprise any substrate that is generally used as a substrate for a magnetic recording medium, as described in the aforementioned. The material and thickness of the non-magnetic base film and magnetic film are also as described in the aforementioned.

Subsequently, the disc D is transported into the chamber 10 of the aforementioned plasma CVD apparatus, and the surface of the disc D is exposed to the reactant gas, which is supplied from the supply source 14 via the introduction tube 15 into the chamber 10, from which the gas is exhausted through the exhaust tube 16 to circulate the gas within.

The reactant gas comprises a mixed gas of hydrocarbon and hydrogen, with a mixing ratio of hydrocarbon to hydrogen in the range of 2 to 1~1 to 100 by volume. The hydrocarbon preferably comprises at least one type of hydrocarbon selected from among lower saturated hydrocarbons, lower unsaturated hydrocarbons, and lower cyclic hydrocarbons.

When carrying out this operation, the flow rate of the reactant gas is preferably in the range of 50~500 sccm.

According to the method of this embodiment, the flow rate of the exhaust gas from the chamber 10 is appropriately adjusted, using the exhaust regulating valve 17 provided in the exhaust tube 16, such that the pressure of the reactant gas in the chamber 10 falls into the range of 0.1~10 Pa, preferably 2~6 Pa, and more preferably 4.5~6 Pa.

The reason for setting the pressure in the aforementioned range is that the coating rate decreases if the pressure is less than 0.1 Pa, while the durability of the carbon protective film deteriorates if the pressure exceeds 10 Pa.

At the same time, high frequency electrical power of preferably 50~2000 W is supplied to the electrodes 11, using a high frequency electrical power source 12, to generate plasma, and thereby form a carbon protective film formed on both sides of the disc D by means of the plasma chemical gas phase growth, using the aforementioned reactant gas as a starting material. The thickness of the carbon protective film is preferably in the range of 30~100 Å.

When supplying electrical power to the electrodes 11 and 11, it is preferable to make the phases of electrical power supplied to each electrode 11 different. By means of shifting the phase of electrical power supplied to each electrode, the coating rate and durability of the protective film can be improved. The difference in the phase of electrical power supplied to each electrode is preferably in the range of 90~270°, and in particular the opposite phase (i.e., 180°) is preferred.

In addition, when forming the carbon protective film, it is preferable to form the film while performing bias applying, such as high frequency bias or pulse D.C. bias, to the disc D, using an electrical bias source 13.

The preferred conditions of bias, e.g., voltage and the like are as described in the aforementioned.

In addition, a lubricating film may be provided on the protective film by means of applying the aforementioned lubricant.

In the aforementioned manufacturing method, since the pressure of the reactant gas is maintained at 0.1~10 Pa, at the time of forming the carbon protective film, the resultant carbon protective film exhibits a superior durability. Accordingly, it is possible to make the carbon protective film thinner while also maintaining a sufficient durability, and thus provide a magnetic recording medium that is capable of reducing spacing loss at the time of recording and replay.

Thus, it is possible to provide a highly reliable magnetic recording medium, which can support a sufficiently high recording density without lowering the output properties thereof.

In addition, it is possible to increase the coating rate and production efficiency.

The reason that a carbon protective film with superior durability can be efficiently formed by means of setting the pressure of the reactant gas in the aforementioned range at the time of forming the aforementioned carbon protective film is hypothesized in the following.

Setting the pressure for the reactant gas in the aforementioned range results in the excitation and activation of a portion of the hydrocarbons in the reactant gas by the plasma. After decomposition of the potion of the hydrocarbons, this portion of hydrocarbons are restructured onto disc D to form a diamond-like carbon (referred to hereinafter as "DLC") with high hardness. Thus, the resultant carbon protective film exhibits superior strength.

In addition, a sufficient reactant gas is thus supplied to the chamber 10, leading to a high coating rate.

On the other hand, if the pressure of the reactant gas is less than the aforementioned range, the number of hydrocarbon molecules in the reactant gas which exist in the chamber 10 becomes insufficient, leading to an inadequate coating rate.

In addition, if the pressure exceeds the aforementioned range, the number of hydrocarbon molecules in the reactant gas present within chamber 10 becomes too high, which in turn leads to difficulty in decomposing the hydrocarbons even in the presence of the plasma. As a result, a portion of the hydrocarbons in the reactant gas remain adhered to the disc D without undergoing decomposition, and the overall content of DLC in the resultant carbon protective film decreases, leading to a carbon protective film with an inferior strength.

In the following, the effects of the present invention are specified, using concrete examples.

TEST EXAMPLES 37~43

After an aluminium alloy substrate coated with a NiP metal film (with a diameter of 95 mm and thickness of 0.8 mm) was treated with mechanical texture-processing to form an average surface roughness of 23 Å, a non-magnetic base film (with a thickness of 600 Å) comprising a Cr alloy, and a magnetic film comprising a Co alloy were successively formed on both sides of the substrate, using a spattering device (3010 manufactured by Anelva), to obtain a disc D.

Subsequently, the disc D was transported into the chamber 10 of the aforementioned plasma CVD apparatus, and a mixed gas was supplied from the supply source 14 into the chamber to achieve a flow rate of 130 sccm. A mixed gas of toluene and hydrogen, with a mixing ratio of toluene to hydrogen of 1 to 10 by volume, was used as the reactant gas.

The inner pressure of the chamber 10 at this time was maintained as shown in Table 5, by means of adjusting the exhaust regulating valve 17.

At the same time, high frequency electrical power of 500 W was supplied to the electrodes 11 to generate plasma, and thereby form a carbon protective film with a thickness of 50 Å on both sides of the disc D. In addition, high frequency electrical power of 50 W was applied to the disc D, using the electrical bias source 13. In addition, the difference in the phase of high frequency electrical power supplied to each electrode 11 was set at 180°.

Subsequently, fomblin lubricant was applied to the carbon protective film, to form a lubricating film with a thickness of 15 Å, thereby yielding a magnetic recording medium.

The CSS test described in the following was performed on the magnetic recording media. In the CSS test, using an head, a CSS operation was performed 20,000 times at a rotational speed of 7200 rpm, and a temperature of 40° C. with a humidity of 80%. The dynamic stiction value was monitored after allowing the magnetic recording medium to sit for one hour. The results are shown in Table 5.

Additionally, Raman spectral analysis (argon ion laser excitation) was performed on the aforementioned magnetic recording media, using a Raman spectral analysis apparatus (manufactured by JEOL Co., Inc). These results are also shown in Table 5.

In general, when a carbon film is analyzed according to the Raman spectral analysis, a profile with two peaks is obtained in which a g-band is measured at approximately 1530 cm$^{-1}$ and a d-band is measured at approximately 1400 cm$^{-1}$. A smaller value for Id/Ig, or alternatively, a higher frequency for the g-band peak results in greater diamond-like characteristics in the carbon film.

TEST EXAMPLES 44 AND 45

A magnetic recording medium was manufactured in the same manner as the aforementioned test example, with the exception that the pressure of the reactant gas in the chamber 10 was modified by means of adjusting the exhaust regulating valve 17. The test results are shown in Table 5.

Additionally, Raman spectral analysis was performed on these magnetic recording media. The results also displayed in Table 5.

TABLE 5

|  | Pressure of reactant gas (Pa) | Stiction (-) | Results of Raman spectral analysis | |
|---|---|---|---|---|
|  |  |  | G-line (cm$^{-1}$) | Id/Ig (-) |
| Test Example 37 | 2.30 | 0.71 | 1540.9 | 0.62 |
| Test Example 38 | 3.60 | 0.50 | 1539.9 | 0.56 |
| Test Example 39 | 4.70 | 0.43 | 1553.0 | 0.63 |
| Test Example 40 | 5.30 | 0.49 | 1545.2 | 0.53 |
| Test Example 41 | 5.80 | 0.46 | 1547.5 | 0.66 |
| Test Example 42 | 6.40 | 0.83 | 1535.6 | 0.51 |
| Test Example 43 | 0.88 | 0.77 | 1558.9 | 0.76 |
| Test Example 44 | 13.1 | 1.24 | 1565.5 | 3.77 |
| Test Example 45 | 16.4 | Crash | 1566.0 | 3.89 |

From the results shown in Table 5, it is clear that the magnetic recording media, manufactured according to a method in which the pressure of the reactant gas at the time of forming the carbon protective film is maintained at 0.1~1.0 Pa, are superior in durability when compared to magnetic recording media manufactured according to a method wherein the pressure is set outside of the aforementioned range.

Moreover, among the aforementioned, it is clear that magnetic recording media manufactured according to a method in which the pressure of the reactant gas is maintained at 2~6 Pa, in particular, exhibit a superior durability.

In addition, the carbon protective films of magnetic recording media, manufactured according to a method wherein the pressure of the reactant gas is maintained in the aforementioned range, display g-band peak values at higher frequency when compared to those manufactured according to a method wherein the pressure is set outside of the aforementioned range, which in turn lead to a low Id/Ig and greater DLC content.

As described in the aforementioned, in the method for manufacturing a magnetic recording medium according to the present invention, a carbon protective film exhibiting a superior durability is produced by means of maintaining the pressure of the reactant gas at 0.1~10 Pa at the time of forming the carbon film. Accordingly, it is possible to make the carbon protective film thinner while also maintaining a sufficient durability, and thus to provide a magnetic recording medium that is capable of reducing spacing loss at the time of recording and replay.

Therefore, it is possible to provide a highly reliable magnetic recording medium, which can support a sufficiently high recording density without lowering the output properties thereof.

In addition, it is also possible to increase the coating rate, and production efficiency.

In the following, another embodiment of the method for manufacturing a magnetic recording medium according to the present invention, using an example in which the aforementioned plasma CVD apparatus shown in FIG. 1 is employed.

Initially, a non-magnetic base film and magnetic film were formed on both sides of a non-magnetic substrate, according to a method such as a spatter-coating method or the like, to obtain a disc D.

The non-magnetic substrate may comprise any substrate that is generally used as a substrate for a magnetic recording medium, as described in the aforementioned. The material and thickness of the non-magnetic base film and magnetic film are also as described in the aforementioned.

Subsequently, the disc D is transported into the chamber 10 of the aforementioned plasma CVD apparatus, and the surface of the disc D is exposed to the reactant gas, which is supplied from the supply source 14 through the introduction tube 15 into the chamber 10. The gas is then exhausted from chamber 10 via the exhaust tube 16 to circulate the gas therein.

According to the manufacturing method of this embodiment, the reactant gas is that comprises a mixed gas of hydrocarbon and hydrogen, with a mixing ratio of hydrocarbon to hydrogen in the range of 2 to 1~1 to 100 by volume, into which nitrogen gas is added at a adding volume of 0.1~100% of the mixed gas, and preferably 50~100 vol %.

The hydrocarbon preferably comprises at least one type of hydrocarbon selected from among lower saturated hydrocarbons, lower unsaturated hydrocarbons, and lower cyclic hydrocarbons.

The nitrogen gas is added into the aforementioned mixed gas at a adding volume of 0.1~100% of the mixed gas. A adding volume of the nitrogen gas to the mixed gas of less than 0.1% by volume, or alternatively exceeding 100% by volume reduces the hardness of the carbon protective film, which in turn leads to an insufficient durability.

In addition, the reason that the mixing ratio of the aforementioned mixed gas of hydrocarbon to hydrogen is preferably in the aforementioned range since a mixing ratio of the hydrocarbon to hydrogen in the mixed gas of less than the aforementioned range leads to a reduced coating rate which is unsuitable for practical, industrial production. Similarly, a mixing ratio exceeding the aforementioned range results in an increase in the stress remaining within the carbon protective film, leading to inferior adhesion and an inferior resistance to CSS in the resultant carbon protective film.

In addition, a lower hydrocarbon is preferably used as the hydrocarbon—if the number of carbon atoms of the hydrocarbon exceeds the aforementioned range, it is difficult to supply the hydrocarbon as a gas, and in addition, at the time of discharge, difficulty with the decomposition of hydrocarbons is encountered, which in turn leads to a carbon protective film containing high polymers that are inferior in strength.

When carrying out the operation, the flow rate of the reactant gas is preferably in the range of 50~500 sccm. In addition, the inner pressure of the chamber 10 is preferably set at the predetermined value, e.g., 0.1~10 Pa.

At the same time, high frequency electrical power of preferably 50~2000 W is supplied to the electrodes 11, using the high frequency electrical power source 12, to generate plasma, and thereby form a carbon protective film on both sides of the disc D by means of plasma chemical gas phase growth, using the aforementioned reactant gas as a starting material. The thickness of the carbon protective film is preferably in the range of 30~100 Å.

When supplying electrical power to the electrodes 11 and 11, it is preferable to make the phases of electrical power supplied to each electrode 11 different. By means of shifting the phase of electrical power supplied to each electrode, it is possible to improve both the coating rate and durability of the protective film. The difference in the phase of electrical power supplied to each electrode is preferably in the range of 90~270°, and in particular the opposite phase (i.e., 180°) is preferred.

In addition, when forming the carbon protective film, it is preferable to form the film while performing bias applying, such as high frequency bias or pulse D.C. bias, to the disc D, using the electrical bias source 13.

The conditions of bias such as voltage and the like are preferably as described in the aforementioned.

In addition, a lubricating film may be provided on the protective film by means of applying the aforementioned lubricant.

In the aforementioned manufacturing method, as the reactant gas, by means of adding a nitrogen gas, at a adding volume of 0.1~100% of the mixed gas, and preferably 50~100% by volume, into the mixed gas comprising hydrocarbon and hydrogen, with a mixing ratio of hydrocarbon to hydrogen in the range of 2 to 1~1 to 100 by volume, at the time of forming the carbon protective film, the carbon protective film exhibits a superior durability. Accordingly, it is possible to make the carbon protective film thinner while maintaining a sufficient durability, and thus provide a magnetic recording medium that is capable of reducing spacing loss at the time of recording and replay.

Therefore, it is possible to provide a highly reliable magnetic recording medium, which can support a sufficiently high recording density without lowering the output properties thereof.

The reason that it is possible to form a carbon protective film possessing a superior durability by means of using a mixed gas, in which the nitrogen gas has been added at a adding volume of 0.1~100% of the mixed gas as the reactant gas at the time of forming the aforementioned carbon protective film, is unclear, but is hypothesized as follows.

It is hypothesized that by means of using gas containing nitrogen gas as the reactant gas, the nitrogen atoms bond to "dangling bonds" which exists in the carbon protective film, thereby increasing the chemical stability and mechanical strength of the carbon protective film.

Additionally, in particular, when providing a lubricating film on the carbon protective film, by means of using a reactant gas containing nitrogen gas, the wetting properties on the surface of the carbon protective film are improved due to the introduction of the nitrogen polar groups. Accordingly, the affinity of the carbon protective film to the lubricating film improves, leading to improved durability of the magnetic recording medium.

The reason for setting the adding volume of nitrogen gas to the mixed gas in the aforementioned range is that if the adding volume is less than the aforementioned range, the aforementioned effects become insufficient, while if the adding volume exceeds the aforementioned range, the nitrogen content in the carbon protective film becomes too high, leading to a decrease in the strength of the carbon protective film, and inferior durability.

In the following, the effects of the present invention are specified, using concrete examples.

TEST EXAMPLES 46 AND 47

After an aluminium alloy substrate coated with a NiP metal film (with a diameter of 95 mm and thickness of 0.8 mm) was treated with mechanical texture-processing to form an average surface roughness of 20 Å, a non-magnetic base film (with a thickness of 600 Å) comprising a Cr alloy, and a magnetic film comprising a Co alloy were successively formed on both sides of the substrate, using a spattering device (3010 manufactured by Anelva), to obtain a disc D.

Subsequently, the disc D was transported into the chamber 10 of the aforementioned plasma CVD apparatus, and a reactant gas was supplied from the supply source 14 into the chamber to achieve a flow rate of 130 sccm.

A mixed gas of toluene and hydrogen, with a mixing ratio of toluene to hydrogen of 1 to 10 by volume, into which nitrogen gas was added at a adding volume shown in Table 6, was used as the reactant gas. Furthermore, the inner pressure of the chamber 10 was maintained at 6 Pa.

At the same time, high frequency electrical power of 500 W was supplied to the electrodes 11 to generate plasma, and thereby form the carbon protective film with a thickness of 50 Å on both sides of the disc D. At this time, high frequency electrical power of 50 W was applied to the disc D, using the electrical bias source 13. In addition, the difference in the phase of high frequency electrical power supplied to each electrode 11 was set at 180°.

Subsequently, fomblin lubricant was applied to the carbon protective film, to form a lubricating film with a thickness of 15 Å, thereby yielding the magnetic recording medium.

The CSS test and corrosion test the following were performed on the magnetic recording media.

In the CSS test, using an MR head, a CSS operation was performed 20,000 times at a rotational speed of 7200 rpm, and a temperature of 40° C. with a humidity of 80%. The dynamic stiction value was monitored after allowing the magnetic recording medium to sit for one hour.

In the corrosion test, after sitting for 96 hours at a high temperature (60° C.) and high humidity (80%), the magnetic recording medium was soaked in 50 cc of ultrapure water at 25° C., and the extraction amount of Co (per substrate area) from the ultrapure water was measured. In addition, the extraction amount of Co was measured in the same manner after allowing the magnetic recording medium to sit for 96 hours at normal temperature (25° C.) and normal humidity (50%). These test results are shown in Table 6.

TEST EXAMPLES 48 AND 49

Magnetic recording medium was manufactured, using a gas, in which nitrogen gas had been added into a mixed gas at a adding volume shown in Table 6, as the reactant gas. The CSS test and corrosion test were performed on the magnetic recording media. These test results are also shown in Table 6.

TABLE 6

| | Adding vol. of nitrogen gas (vol. %) | Stiction (−) | Coating rate (Å/min) | Corrosion test | |
|---|---|---|---|---|---|
| | | | | Normal temp. & humidity (ng/cm$^2$) | High temp. & humidity (ng/cm$^2$) |
| Test Example 46 | 50 | 0.88 | 664 | 0.07 | 0.34 |
| Test Example 47 | 100 | 0.67 | 432 | 0.11 | 0.25 |
| Test Example 48 | 0 | 1.27 | 753 | 0.12 | 0.24 |
| Test Example 49 | 200 | Crash | 125 | 0.44 | 1.25 |

From Table 6, it is clear that the magnetic recording media manufactured according to a method which used a mixed gas, into which nitrogen gas was added at a adding volume of 0.1~100% of the mixed gas, as the reactant gas, exhibited lower stiction values, leading to a superior durability. Additionally, from the results of the corrosion test, it is clear that these magnetic recording media contained only an extremely small amount of corrosion, and exhibited a level of resistance to corrosion which poses no problem for practical use.

As explained in the aforementioned, in the method for manufacturing a magnetic recording medium according to the present invention, it is possible to form a carbon protective film comprising a superior durability. Accordingly, it is possible to make the carbon protective film thinner while also maintaining a sufficient durability, and hence reduce spacing loss.

Thus, it is possible to provide a highly reliable magnetic recording medium, which can support a sufficiently high recording density without lowering the output properties thereof.

Figure 4:
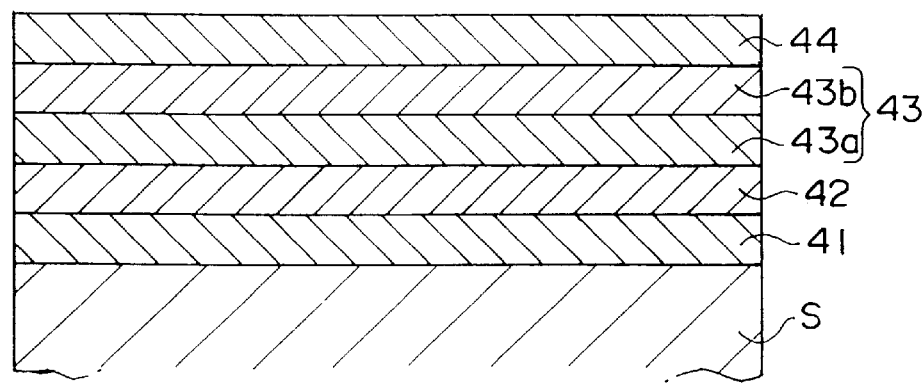
FIG. 4 is a cross-sectional view, showing an embodiment of the magnetic recording medium according to the present invention.

In the following, an embodiment of the magnetic recording medium according to the present invention is described. FIG. 4 shows an embodiment of the magnetic recording medium according to the present invention, wherein a non-magnetic base film 41, magnetic film 42, carbon protective film 43, and lubricating film 44 are successively formed on a non-magnetic substrate S.

The non-magnetic substrate S may comprise any substrate that is generally used as a substrate for a magnetic recording medium, examples of which may include an aluminium alloy substrate coated with a NiP metal film, and substrates comprising glass, silicone, and the like.

In addition, the surface of the non-magnetic substrate S is preferably treated with texture-processing, e.g., mechanical texture-processing. In particular, the average surface roughness (Ra) is preferably in the range of 1~20 Å.

Preferred examples of the materials for the non-magnetic base film 41 and magnetic film 42 are as described in the aforementioned.

The thickness of the non-magnetic base film 41 and magnetic film 42 is preferably in the range of 50~1000 Å, and 50~800 Å, respectively.

In the magnetic recording medium according to the present invention, the carbon protective film may comprise a two-layer structure, comprising a plasma CVD carbon layer 43a formed according to a plasma CVD method, and a spatter carbon layer 43b formed thereon according to a spatter-coating method.

The thickness of a plasma CVD carbon layer 43a is preferably in the range of 30~100 Å.

A thickness of less than 30 Å results in an insufficient strength for the entire protective film; while a thickness exceeding 100 Å results in a magnetic recording medium with a greater spacing loss at the time of recording and replay, which leads to a higher likelihood of lowering output properties when increasing recording density.

The spatter carbon layer 43b is provided on the surface of the carbon protective film 43, and its thickness is in the range of 5~100 Å, and preferably 30~100 Å.

A thickness of less than 5 Å results in weakening of the bonds between the spatter carbon layer 43b and lubricating film 44, leading to an inferior resistance to sliding of the magnetic recording medium. On the other hand, a thickness exceeding 100 Å results in a decrease in the output properties at the time of increasing recording density.

Preferred examples of the materials of the lubricating film 44 may include perfluoropolyether, fomblin lubricant, and the like. The thickness of the lubricating film 44 is preferably 5~40 Å.

In the following, another embodiment of the method for manufacturing a magnetic recording medium according to the present invention is described, using an example in which an aforementioned magnetic recording medium is manufactured.

Figure 5:
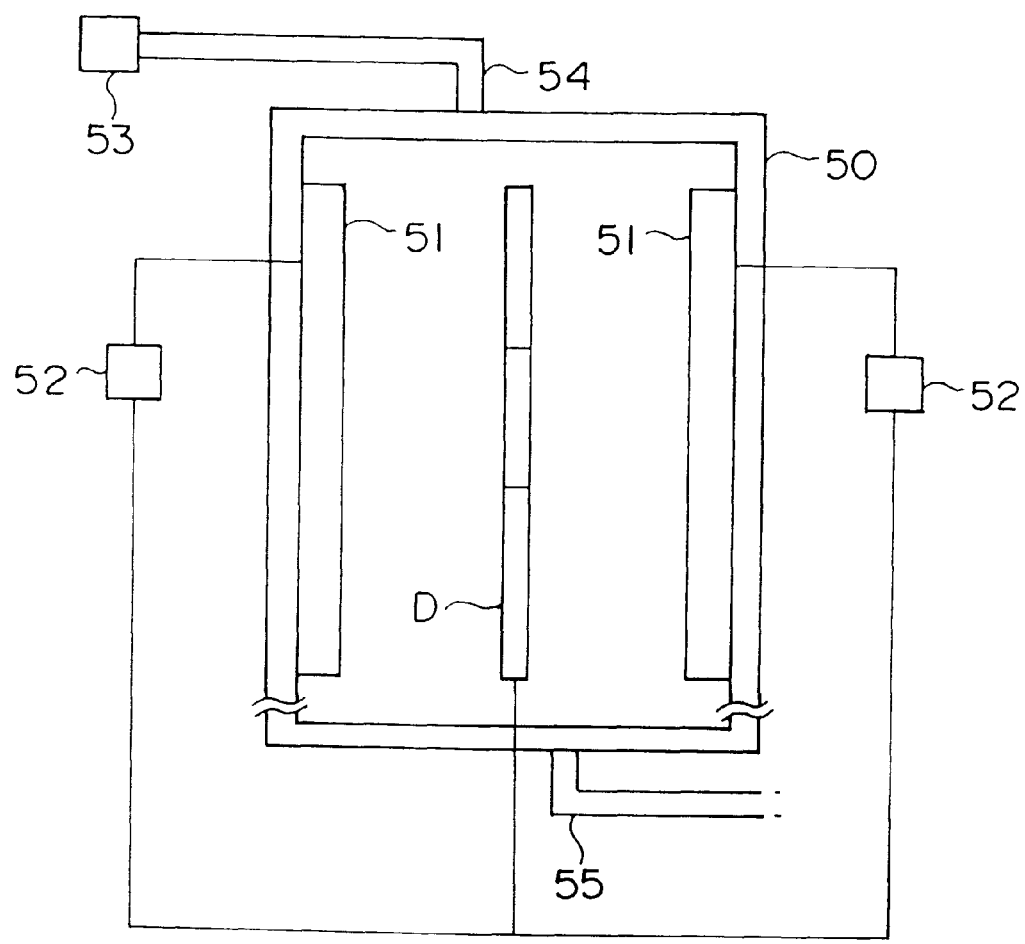
FIG. 5 is a schematic structural view, showing the spatter equipment used in an embodiment of the method for manufacturing a magnetic recording medium according to the present invention.

FIG. 5 shows the spatter equipment used for manufacturing the aforementioned magnetic recording medium, which comprises a chamber 50, targets 51, which are provided on the inner walls on both sides of the chamber 50; an electrical source 52 which supplies electrical power to the targets 51; a supply source 53 for spatter gas which supplies spatter gas into the chamber 50.

The chamber 50 is connected to a introduction tube 54 which directs the spatter gas supplied from the supply source 53 into the chamber 50, and an exhaust tube 55 which expels gas inside of the chamber 7 out of the system.

The target 51 may principally comprise carbon.

The electrical source 52 may comprise a D.C. electrical source, or a high frequency electrical source.

In order to manufacture the aforementioned magnetic recording medium using the aforementioned spatter equipment and plasma CVD apparatus shown in FIG. 1, a non-magnetic base film 41 comprising a Cr alloy, and magnetic film 42 comprising a Co alloy are successively formed on both sides of an aluminium alloy substrate S coated with a NiP metal film, according to a method such as a spatter-coating method, to obtain a disc D.

Subsequently, the disc D is transported into the chamber 10 of the aforementioned plasma CVD apparatus, and the surface of the disc D is exposed to the reactant gas, which is supplied from the supply source 14 via the introduction tube 15 into the chamber 10, from which gas is exhausted via the exhaust tube 16 to circulate the gas within.

The reactant gas is preferably a mixed gas of hydrocarbon and hydrogen, with a mixing ratio of hydrocarbon to hydrogen in the range of 2 to 1~1 to 100 by volume, and the hydrocarbon preferably comprises at least one type of hydrocarbon selected from among lower saturated hydrocarbons, lower unsaturated hydrocarbons, and lower cyclic hydrocarbons.

When carrying out this operation, the flow rate of the reactant gas is preferably 50~500 sccm. Additionally, the inner pressure of the chamber 10 is preferably set at a predetermined value, such as 0.1~10 Pa.

At the same time, using the high frequency electrical power source 12, high frequency electrical power of preferably 50~2000 W is supplied to the electrodes 11 to generate plasma, and a plasma CVD carbon layer 43a, the thickness of which is preferably in the range of 30~100 Å, is formed on both sides of the disc D by means of plasma chemical gas phase growth, using the aforementioned reactant gas as a starting material.

When supplying electrical power to the electrodes 11 and 11, it is preferable to make the phases of electrical power supplied to each electrode 11 different. By means of making the phases of electrical power supplied to each electrode 11 different, it is possible to improve the coating rate and durability of the protective film. The difference in the phase of electrical power supplied to each electrode is preferably in the range of 90~270°, and more preferably comprises the opposite phase (i.e., 180°).

In addition, it is preferable to form the film while performing bias applying, such as high frequency bias or pulse D.C. bias, to the disc D, using the electrical bias source 13. When using high frequency electrical source as the electrical bias source 13, high frequency electrical power of 10~300 W is preferably applied to the disc D. Additionally, when using pulse D.C. electrical source as the electrical bias source 13, a voltage of −400~−10V is preferably applied to the disc D. Furthermore, the width of pulse is preferably in the range of 10~50000 ns, and the frequency is preferably in the range of 10 kHz~1 GHz.

The resultant plasma CVD carbon layer 43a contains a higher content of diamond-like carbon (DLC) of an increased hardness, and is superior in strength, when compared to the carbon films formed according to the conventionally known, spatter-coating method.

Subsequently, the disc D, on the surface of which a plasma CVD carbon layer 43a has been formed according to the aforementioned operation, is transported into the chamber 50 of the spatter equipment, and the surface of the plasma CVD carbon layer 43a, formed on the aforementioned disc D, is exposed to the spatter gas, which is supplied into chamber 50 from the supply source 53 via the introduction tube 54. Gas is then exhausted via the exhaust tube 55 to circulate the gas within.

The spatter gas may comprise argon, which is generally used in the spatter-coating method. In particular, a mixed gas comprising argon, into which at least one gas selected from among nitrogen, hydrogen, and methane is added at a adding volume to the argon of 0.1~100% by volume, is preferred.

At the same time, electrical power is supplied to target 51, using the electrical source 52, and the material of target 51 is then supplied onto the plasma CVD carbon layer 43a by means of spattering, to form the spatter carbon layers 43b on both sides of the disc D.

In this operation, the flow rate of the spatter gas is preferably 20~300 sccm.

Subsequently, a lubricant such as perfluoropolyether, fomblin lubricant, and the like, is applied to the spatter carbon layer 43b, according to a dipping method or the like.

In this manner, a magnetic recording medium, which comprising a non-magnetic base film 41, magnetic film 42, carbon protective layer 43 which comprises plasma CVD carbon layer 43a and spatter carbon layer 43b, and lubricating layer 44 are successively formed on the substrate S, is provided.

In the aforementioned magnetic recording medium, since the carbon protective layer 43 is provided with a plasma CVD carbon layer 43a formed according to a plasma CVD method, and spatter carbon layer 43b formed according to a spatter-coating method, the adhesion of the lubricating film 44 to the carbon protective film 43 is increased, which leads to a superior durability.

It is hypothesized that the spatter carbon layer 43b formed by means of spattering has a greater number of "dangling bonds" when compared to the carbon film formed according to the plasma CVD method. Therefore, bonding which involves the "dangling bond" creates a stronger adhesion to the lubricating film 44, and thus leads to the superior durability of the aforementioned magnetic recording medium.

In addition, since the carbon protective layer 43 possesses a plasma CVD carbon layer 43a of superior strength, it is possible to make the carbon protective film 43 thinner while also maintaining the durability, and thus reduce spacing loss. In addition, it is possible to prevent problems such as "spin-off" in CSS operation.

Accordingly, it is possible to provide effects of reliability and a sufficiently high recording density, without lowering the output properties thereof. Furthermore, in the aforementioned embodiment, the carbon protective layer 43 is provided with a two-layer structure comprising the plasma CVD carbon layer 43a and spatter carbon layer 43b. However, the magnetic recording medium according to the present invention is not limited thereto, and may also comprise a structure possessing three or more layers.

In the following, the effects of the present invention are specified, using concrete examples.

TEST EXAMPLES 50~52

A magnetic recording medium was manufactured as follows, using the plasma CVD apparatus and spatter equipment shown in FIGS. 1 and 5.

After an aluminium alloy substrate coated with a NiP metal film (with a diameter of 95 mm and thickness of 0.8 mm) was treated with mechanical texture-processing to form an average surface roughness of 20 Å, a non-magnetic base film 41 (with a thickness of 600 Å) comprising a Cr alloy, and a magnetic film 42 comprising a Co alloy ($Co_{82}Cr_{15}Ta_3$) were successively formed on both sides of the substrate S, using a spattering device (3010 manufactured by Anelva), to obtain a disc D.

Subsequently, the disc D was transported into the chamber 10 of the plasma CVD apparatus, and a reactant gas was supplied from the supply source 14 into the chamber to achieve a flow rate of 130 sccm.

A mixed gas of toluene and hydrogen, with a mixing ratio of toluene to hydrogen of 1 to 10 by volume, was used as the reactant gas. Additionally, the inner pressure of the chamber 10 was maintained at 6 Pa.

At the same time, high frequency electrical power of 500 W was supplied to the electrodes 11 to generate plasma, and thereby form a plasma CVD carbon layer 43a with a thickness of 40 Å on both sides of the disc D. At this time, pulse D.C. bias of –120V (with a frequency of 200 kHz and pulse width of 500 ns) was applied to the disc, using the electrical bias source 13. Furthermore, the temperature of the disc D at the time of coating was maintained at 150° C. The difference in the phase of high frequency electrical power supplied to each electrode 11 was set at 180°. In addition, the distance between the disc D and electrode 11 was set at 30 mm.

Subsequently, the disc D, on the surface of which the plasma CVD carbon layer 43a was formed according to the aforementioned operation, was transported into the chamber 50 of the spatter equipment, and the spatter gas supplied from the supply source 53 was directed into the chamber 50 via the introduction tube 54.

Spatter gas containing the respective components shown in Table 7 was used herein.

At the same time, electrical power was supplied to the target 51, using the electrical source 52, and the spatter carbon layers 43b were formed on both sides of the disc D, by means of spattering.

Subsequently, a fomblin lubricant (Fomblin Zdol 2000) was applied onto the spatter carbon layer 43b, according to a dipping method, and a lubricating film 44 with a thickness of 20 Å was formed, thereby yielding a magnetic recording medium.

The "bonded ratio" test, "spin-off" test, and CSS test described in the following were performed on resultant magnetic recording media.

(1) Bonded Ratio Test

The aforementioned magnetic recording medium was soaked in a solvent (AK225 manufactured by Asahi Glass) for 15 minutes, and then removed. The ratio of the thickness of the lubricating film 44 prior to this operation and after this operation was then calculated in percentage. The thickness of the lubricating film 44 was measured at the position where the radius was 20 mm, using ESCA.

(2) Spin-off Test

The aforementioned magnetic recording medium was rotated at a rotational speed of 10000 rpm and a temperature of 100° C. for 168 hours. The ratio of the thickness of the lubricating film 44 prior to this operation and after this operation was then calculated in percentage. The thickness of the lubricating film 44 was measured at the positions, where the radius of the magnetic recording medium was 20 mm (inner circumference) and 42 mm (outer circumference), using FT-IR.

(3) CSS Test

Using an MR head, a CSS operation was performed on the aforementioned magnetic recording medium 80000 times, at a rotational speed of 7200 rpm, and a temperature of 40° C. at a humidity of 80%.

These test results are shown in Table 7.

TEST EXAMPLES 53 AND 54

A carbon protective film was formed according to only a plasma CVD method, based on the methods in TEST EXAMPLES 50~52, to provide a magnetic recording medium comprising a carbon protective film comprising a single-layer structure (Test Example 53).

In addition, a carbon protective film was formed according to a conventionally known, spatter-coating method, to provide a magnetic recording medium comprising a carbon protective film comprising a single-layer structure. (Test Example 54)

The aforementioned three types of tests were performed on these magnetic recording media. These test results are shown in Table 8.

In the tables, the plasma CVD carbon layer is represented as "pCVD layer", and the spatter carbon layer is represented as "spatter layer".

TABLE 7

| | Structure of protective film | Thickness of pCVD layer (Å) | Thickness of spatter layer (Å) | Spatter gas | Bonded ratio (%) | Spin-off Inner circumference (%) | Spin-off Outer circumference (%) | CSS |
|---|---|---|---|---|---|---|---|---|
| Test Example 50 | Two-layer | 40 | 10 | 100% Ar | 38 | 58 | 64 | No crash |
| Test Example 51 | Two-layer | 40 | 10 | 98% Ar and 2% $N_2$ | 46 | 65 | 74 | No crash |
| Test Example 52 | Two-layer | 40 | 10 | 90% Ar and 10% $CH_4$ | 16 | 48 | 55 | No crash |

TABLE 8

| | Structure of protective film | Coating method of carbon film | Thickness of carbon film (Å) | Spatter gas | Bonded ratio (%) | Spin-off inner circumference (%) | Spin-off outer circumference (%) | CSS |
|---|---|---|---|---|---|---|---|---|
| Test Example 53 | Single-layer | pCVD | 50 | — | 20 | 37 | 43 | Crash |
| Test Example 54 | Single-layer | Spatter-coating | 100 | 100% Ar | 42 | 77 | 84 | Crash |

From the results of the CSS test shown in Tables 7 and 8, it is clear that the magnetic recording media in which the carbon protective film 43 comprised a two-layer structure comprising the plasma CVD carbon layer 43a and spatter carbon layer 43b exhibited sufficient durability against CSS operation performed over 80000 times, whereas the magnetic recording media in which the carbon protective film comprised a single-layer structure formed according to only a plasma CVD method, or spatter-coating method, led to "head crash".

Additionally, from the results of the bonded ratio test and spin-off test, it is clear that the magnetic recording medium wherein the carbon protective film 43 comprised a two-layer structure exhibited a lower reduction ratio of the thickness of the lubricating film, compared to the magnetic recording medium wherein the carbon protective film was formed only according to the plasma CVD method.

Accordingly, the magnetic recording media in which the carbon protective film 43 comprised a two-layer structure exhibited a superior durability when compared to the magnetic recording medium in which the carbon protective layer comprised a single-layer structure formed according to only a plasma CVD method, or spatter-coating method.

As explained in the aforementioned, according to the present invention, it is possible to form a carbon protective film with a superior durability. As a result, it is also possible to make the carbon protective film thinner while also maintaining a sufficient durability, and thereby reduce spacing loss.

Therefore, it is possible to provide a highly reliable magnetic recording medium, which is capable of sufficiently increasing recording density without lowering the output properties thereof.

In the following, another embodiment of the method of manufacturing the magnetic recording medium according to the present invention, using an example in which the plasma CVD apparatus shown in FIG. 1 is employed.

Initially, a non-magnetic base film and magnetic film are respectively formed on both sides of the non-magnetic substrate according to a method such as a spatter-coating method, and the like, to obtain a disc D.

The non-magnetic substrate may comprise any substrate that is generally used as a substrate for magnetic recording medium as described in the aforementioned. The material and thickness of the non-magnetic base film and magnetic film are as described in the aforementioned.

In the method for manufacturing the magnetic recording medium according to the present embodiment, the process of coating the carbon protective film comprises two subsequent processes as described in the following.

As the first process, the following operation is performed.

The disc D, wherein the non-magnetic base film and magnetic film are formed on the aforementioned non-magnetic substrate, is transported into the chamber 10 of the plasma CVD apparatus, and the surface of the disc D is exposed to the reactant gas, which is supplied from the supply source 14 through the introduction tube 15 into the chamber 10. The gas is then exhausted from chamber 10 via the exhaust tube 16 to circulate the gas therein.

The reactant gas is, as described in the aforementioned, preferably a mixed gas of hydrocarbon and hydrogen, with a mixing ratio of hydrocarbon to hydrogen in the range of 2 to 1~1 to 100 by volume. The hydrocarbon preferably comprises at least one type of hydrocarbon selected from among lower saturated hydrocarbons, lower unsaturated hydrocarbons, and lower cyclic hydrocarbons.

In this operation, the flow rate of the reactant gas is preferably in the range of 50~500 sccm. Additionally, the inner pressure of the chamber 10 is preferably set at a predetermined value such as 0.1~10 Pa.

At the same time, high frequency electrical power of preferably 50~2000 W is supplied to electrodes 11, using a high frequency electrical source 12, to generate plasma, and the first carbon layer having a thickness of preferably 30~45 Å is formed on both sides of the disc D by means of plasma chemical gas phase growth, using the aforementioned reactant gas as a starting material.

In this first process, at this point, bias such as high frequency bias or pulse D.C. bias is applied to the disc D, to form the film by means of a bias electrical source 13.

When using high frequency bias as the aforementioned bias, high frequency electrical power of 10~300 W is preferably applied to the disc, using a high frequency electrical source as the bias electrical source 13.

This is due to the fact that if bias applied to the disc D during coating is less than 10 W, the first carbon layer will contain a large amount of high polymer components, which are inferior in strength, and thus reduce the durability. On the other hand, if the bias exceeds 300 W, sparks are likely to occur during coating, which lead to a greater likelihood of creating abnormal growth sections on the surface of the first carbon layer.

Additionally, when using pulse D.C. bias as bias and pulse D.C. electrical source as the bias electrical source 13, a voltage of −400~−10 V is preferably applied to the disc.

This is due to the fact that if bias applied to the disc D during coating is less than −400 V, sparks are likely to occur at the time of coating, which lead to a greater likelihood of creating abnormal growth sections on the surface of the first carbon layer. If the bias exceeds −10 V, the first carbon layer contains a higher content of high polymer components, which are inferior in strength.

In addition, preferably, the pulse width is in the range of 10~50000 ns, and the frequency is in the range of 10 kHz~1 GHz.

The resultant first carbon layer thereby contains a large amount of diamond-like-carbons (DLC) which exhibit an increased hardness.

The reason for preferably setting the thickness of the first carbon layer in the range of 30~45 Å is due to the fact that a thickness of less than 30 Å results in a reduction in the strength of the carbon protective film, leading to a lower durability of the resultant magnetic recording medium; and a thickness exceeding 45 Å results in a magnetic recording medium that exhibits greater spacing loss at the time of recording and replay, which tends to lower output properties at the time of increasing the recording density.

Subsequently, the second process described in the following is performed.

In the second process, bias applying to the disc D, using the bias electrical source 13, is halted, and a second carbon layer of preferably 5~20 Å is formed onto the first carbon layer in a similar manner as in the aforementioned first process, with the exception that bias applying is not performed.

The reason for setting the thickness of the second carbon layer in the range of 5~20 Å is due to the fact that if the thickness is less than 5 Å, the joining strength between the second carbon layer and lubricating film weakens, leading to a lower resistance to sliding of the magnetic recording medium; while if the thickness exceeds 20 Å, the resultant magnetic recording medium exhibits greater spacing loss at the time of recording and replay, which tends to lower output properties at the time of increasing the recording density.

In the aforementioned first and second processes, when supplying electrical power to the electrodes 11 and 11, the phase of the electrical power supplied to each electrode 11 are preferably shifted with respect to each other. By means of making the phases of electrical power supplied to each electrode 11 different, it is possible to improve both the coating rate and durability of the protective film. The difference of the phase of electrical power supplied to each electrode is preferably in the range of 90~270°, and in particular, the opposite phase (i.e., 180°) is preferred.

Through the aforementioned first and second processes, the carbon protective film comprising the first and second carbon layer is formed onto the disc D.

Subsequently, a lubricant such as perfluoropolyether, fomblin lubricant, and the like, is applied onto the second carbon layer according to a dipping method or the like, to form a lubricating film with a thickness of preferably 5~40 Å.

In this manner, a magnetic recording medium is obtained, wherein a non-magnetic base film, magnetic film, a carbon protective film (first carbon layer and second carbon layer), and lubricating film are successively formed.

Examples of the magnetic recording medium manufactured according to the aforementioned manufacturing method may include a magnetic recording medium with a structure similar to that shown in FIG. 4.

The magnetic recording medium of this example comprises a non-magnetic substrate S, non-magnetic base film 41, magnetic film 42, carbon protective film 43 (first carbon layer 43a, and second carbon layer 43b), and lubricating film 44.

In the aforementioned method for manufacturing a magnetic recording medium, the carbon protective film 43 is formed, by means of forming a second carbon layer 43b, according to the plasma CVD method without performing bias applying to the disc D, on top of a first carbon layer 43a, which is formed according to a plasma CVD method while performing bias applying to the disc D. In this manner, the resultant magnetic recording medium exhibits a higher bonding strength with respect to the lubricating film 44, lying in contact with the second carbon layer 43b of the carbon protective film 43, and hence leads to a superior durability.

The reason for the superior durability of the aforementioned magnetic recording medium is as follows. That is, the second carbon layer 43b, which is formed without performing bias applying to the disc D, contains a greater number of dangling bonds, compared to the first carbon layer 43a which is formed while performing bias applying to the disc D, and bonding which involves these dangling bond generates a stronger adhesion to the lubricating film.

In addition, the first carbon layer 43a, which is formed while performing bias applying to the disc D contains a higher content of diamond-like-carbon (DLC), leading to a superior strength.

As a result, the carbon protective film 43 exhibits a higher strength, and moreover is firmly joined to the lubricating film 44. Accordingly, it is possible to make the carbon protective film 43 thinner while also maintaining a sufficient durability, and thereby reduce spacing loss. Additionally, problems such as spin-off in the CSS operation do not occur.

Accordingly, it is possible to provide a highly reliable magnetic recording medium that is capable of increasing the recording density sufficiently without lowering the output properties thereof.

Furthermore, in the aforementioned embodiment, the carbon protective film comprises a two-layer structure comprising a first carbon layer 43a and second carbon layer 43b. However, the magnetic recording medium according to the present invention is not limited thereto, and may comprise a structure of three or more layers.

In the following, the effects of the present invention are specified, using concrete examples.

TEST EXAMPLES 55~59

Magnetic recording medium was manufactured as described in the following, using the plasma CVD apparatus shown in FIG. 1.

After an aluminium alloy substrate coated with a NiP metal film (with a diameter of 95 mm and thickness of 0.8 mm) was treated with mechanical texture-processing to form an average surface roughness of 20 Å, a non-magnetic base film 41 (with a thickness of 600 Å) comprising a Cr alloy, and a magnetic film 42 comprising a Co alloy ($Co_{82}Cr_{15}Ta_3$) were successively formed on both sides of the substrate S, using a spattering device (3010 manufactured by Anelva), to obtain a disc D.

Subsequently, the disc D was transported into the chamber 10 of the plasma CVD apparatus, and a mixed gas was supplied from the supply source 14 into the chamber to achieve a flow rate of 130 sccm.

A mixed gas of toluene and hydrogen, with a mixing ratio of toluene to hydrogen of 1 to 12 by volume, was used as the reactant gas. Additionally, the inner pressure of the chamber 10 was maintained at 6 Pa.

At the same time, high frequency electrical power of 450 W was supplied to the electrodes 11 to generate plasma, while applying pulse D.C. bias of −120V (with a frequency of 200 kHz and a pulse width of 500 ns) to the disc D, using the bias electrical source 13, to form the first carbon layer 43a. The temperature of the disc D and coating rate at the time of coating were set at 130° C., and 450 Å/min, respectively. The difference in the phase of high frequency electrical power supplied to each electrode 11 was set at 180°. In addition, the distance between the disc D and electrode 11 was set at 30 mm.

Subsequently, a second carbon layer 43b with a thickness shown in Table 9 was formed onto the disc D, onto which a first carbon layer 43a had been formed on the surface thereof as described in the aforementioned, according to the similar method for forming the first carbon layer 43a, with the exception that bias was not applied to the disc D.

Subsequently, a fomblin lubricant (Fomblin Zdol 2000) was applied onto the second carbon layer 43b, according to a dipping method, and a lubricating film 44 with a thickness of 20 Å was formed, thereby yielding a magnetic recording medium.

The bonded ratio test, spin-off test, and CSS test described in the following were then performed on the resultant magnetic recording media.

(1) Bonded Ratio Test

The aforementioned magnetic recording medium was soaked in a solvent (AK225 manufactured by Asahi Glass) for 15 minutes, and then removed. The ratio of the thickness of the lubricating film 44 prior to this operation and after this operation was then calculated in percentage. Furthermore, the thickness of the lubricating film 44 was measured at a position where the radius was 20 mm, using ESCA.

(2) Spin-off Test

The aforementioned magnetic recording medium was rotated at a rotational speed of 10000 rpm and a temperature of 100° C. for 168 hours. The ratio of the thickness of the lubricating film 44 prior to this operation and after this operation was then calculated in percentage. The thickness of the lubricating film 44 was measured at the positions where the radius of the magnetic recording medium was 20 mm (inner circumference) and 42 mm (outer circumference), respectively, using FT-IR.

(3) CSS Test

Using an MR head, a CSS operation was performed on the aforementioned magnetic recording medium 40000 times at a rotational speed of 7200 rpm, and a temperature of 40° C. with a humidity of 80%.

The test results are shown in Table 9.

TEST EXAMPLE 60

A magnetic recording medium was manufactured in the similar manner as in the aforementioned test example, with the exception that a second carbon layer 43b was not formed.

The resultant magnetic recording medium underwent with the aforementioned three types of tests. The test results are shown in Table 9.

TEST EXAMPLE 61

A magnetic recording medium was manufactured, in which the carbon protective film was formed according to a conventionally known, spatter-coating method.

The aforementioned three types of tests were performed on the resultant magnetic recording medium. The test results are shown in Table 9.

TABLE 9

| | First carbon layer | | Second carbon layer | | Bond ratio (%) | Spin-off Inner circumference (%) | Spin-off Outer circumference (%) | CSS (the number of times a crash occurred) |
|---|---|---|---|---|---|---|---|---|
| | Coating method | Thickness (Å) | Coating method | Thickness (Å) | | | | |
| Test Example 55 | pCVD (w/bias) | 40 | pCVD (w/o bias) | 10 | 19 | 56 | 61 | No crash |
| Test Example 56 | pCVD (w/bias) | 32 | pCVD (w/o bias) | 18 | 23 | 59 | 63 | No crash |
| Test Example 57 | pCVD (w/bias) | 25 | pCVD (w/o bias) | 25 | 25 | 64 | 70 | Crash (37000) |
| Test | pCVD | 12 | pCVD | 38 | 26 | 68 | 75 | Crash |

TABLE 9-continued

| | First carbon layer | | Second carbon layer | | Bond ratio (%) | Spin-off Inner circum-ference (%) | Spin-off Outer circum-ference (%) | CSS (the number of times a crash occurred) |
|---|---|---|---|---|---|---|---|---|
| | Coating method | Thick-ness (Å) | Coating method | Thick-ness (Å) | | | | |
| Example 58 Test | (w/bias) pCVD | 47 | (w/o bias) pCVD | 3 | 11 | 40 | 45 | (25000) Crash |
| Example 59 Test | (w/bias) pCVD | 50 | (w/o bias) — | — | 10 | 38 | 44 | (20000) Crash |
| Example 60 Test | (w/bias) Spatter-ing | 50 | — | — | 33 | 76 | 82 | (15000) Crash |
| Example 61 | | | | | | | | |

From the results of the CSS test shown in Table 9, it is clear that the magnetic recording media wherein the carbon protective film 43 comprised a first and second carbon layers 43a and 43b exhibited superior resistance to sliding, when compared to the magnetic recording medium wherein the carbon protective film comprised only a single-layer structure.

In particular, the magnetic recording media wherein the thickness of the second carbon layer was 5~20 Å exhibited sufficient durability against the CSS operation.

Additionally, from the results of the bonded ratio test and spin-off test, it is clear that the magnetic recording media in which the carbon protective film 43 comprised a two-layer structure exhibited a lower reduction ratio of the thickness of the lubricating film, when compared to magnetic recording media wherein the carbon protective film comprised a single-layer structure.

Accordingly, the magnetic recording media in which the carbon protective film comprised a two-layer structure exhibited a superior durability.

As explained in the aforementioned, according to the present invention, it is possible to form a carbon protective film with a superior durability. Therefore, it is also possible to make the carbon protective film thinner while also maintaining a sufficient durability, and thereby reduce spacing loss.

As a result, it is possible to provide a highly reliable magnetic recording medium, which is capable of sufficiently increasing the recording density without lowering the output properties thereof.

In the following, another embodiment of the magnetic recording medium according to the present invention is described.

The magnetic recording medium of this embodiment may comprise a similar structure to that shown in FIG. 4. The magnetic recording medium according to this embodiment comprises a non-magnetic substrate S, non-magnetic base film 41, magnetic film 42, carbon protective film 43 (first carbon layer 43a, and second carbon layer 43b), and lubricating film 44.

Examples of the non-magnetic substrate S may include an aluminium alloy substrate coated with a NiP metal film, and substrates comprising glass, silicone, and the like. The surface of the substrate S is preferably treated with texture-processing such as mechanical texture-processing. In particular, the average surface roughness (Ra) is preferably in the range of 1~20 Å. The material and thickness of the non-magnetic base film 41 and magnetic film 42 are as described in the aforementioned.

In the magnetic recording medium of the present embodiment, the protective film 43 comprises a two layer structure comprising a tantalum nitrogen layer 43a and carbon layer 43b formed thereon.

The tantalum nitrogen layer 43a comprises titanium and nitrogen, incorporating a material comprising a nitrogen content of 1~30 at % as its main component.

A nitrogen content of less than 1 at % results in a loss of strength of the protective film 43, leading to a lower durability of the resultant magnetic recording medium. Additionally, a nitrogen content exceeding 30 at % also results in a decrease in the strength of the protective film 43, similarly leading to a lower durability of the resultant magnetic recording medium.

The tantalum and nitrogen in the tantalum nitrogen layer 43a exist in the form of TaN, $Ta_2N$, $Ta_3N_5$, simple substance, or mixture thereof.

The thickness of the tantalum nitrogen layer 43a is preferably in the range of 1~95 Å.

A thickness of less than 1 Å results in a protective film comprising an inadequate strength, while a thickness exceeding 95 Å results in a magnetic recording medium that exhibits greater spacing loss at the time of recording and replay, leading to a likelihood of lowering the output properties at the time of increasing the recording density.

The carbon layer 43b is formed according to the plasma CVD method.

The thickness of the carbon layer 43b is preferably in the range of 5~100 Å.

If the thickness is less than 5 Å, the bond between the carbon layer 43b and lubricating film 44 weakens, leading to a lower resistance to sliding of the magnetic recording medium. On the other hand, a thickness exceeding 100 Å results in a decrease in the strength of the protective film 43.

The lubricating film 44 preferably comprises a lubricant such as perfluoropolyether, fomblin lubricant, and the like. The thickness of the lubricating film is preferably in the range of 5~40 Å.

In the following, another embodiment of the method for manufacturing magnetic recording medium according to the present invention is described, using an example in which the aforementioned magnetic recording medium is manufactured.

In the manufacturing method according to the present embodiment, a spattering device is employed with a similar structure to that shown in FIG. 5, with the exception that a material comprising principally tantalum, or a mixture of tantalum and nitrogen is used as the target 51.

D.C. electrical source or high frequency electrical source may be used as the electrical source 52. Preferred examples of the D.C. electrical source may include one that is capable of supplying an electrical power of 50~6000 W to the target 51.

In order to manufacture the aforementioned magnetic recording medium, using the aforementioned spattering device, and the plasma CVD apparatus shown in FIG. 1, a non-magnetic base film 41 comprising a Cr alloy or the like, and a magnetic film 42 comprising a Co alloy or the like are successively formed on both sides of the aluminium alloy substrate S coated with a NiP metal film, according to a method such as a spatter-coating method, to obtain a disc D.

Subsequently, the disc D is transported into the chamber 50 of the aforementioned spattering apparatus, and the surface of the disc D is exposed to the spatter gas, which is supplied from the supply source 53 through the introduction tube 54 into the chamber 50, from which the gas is exhausted via the exhaust tube 55 to circulate the gas within.

Examples of the spatter gas may include any gas described below.

When using a target principally comprising tantalum as the target 51, a gas formed from Ar or the like, which is generally used in the spatter-coating method, into which a nitrogen gas has been added at adding volume of 0.1~100 vol % of said gas, may be used.

Furthermore, when using a target principally comprising tantalum and nitrogen as the target 51, a gas such as Ar, or similar gas to which an appropriate amount of nitrogen has been added, may be used.

At the same time, electrical power is supplied to the target 51, using the electrical source 52, and the material of the target 51 further is supplied onto the disc D by means of spattering, to form a tantalum nitrogen layer 43a, which comprises a material comprising tantalum and nitrogen as its main component, on both side of the disc D.

In this operation, the flow rate of the spatter gas is preferably in the range of 10~200 sccm.

Subsequently, the disc D comprising a tantalum nitrogen layer 43a is transported into the chamber 10 of the plasma CVD apparatus, and the surface of the disc D is exposed to a reactant gas, which is supplied from the supply source 14 through the introduction tube 15 into the chamber 10. The gas is then exhausted from chamber 10 via the exhaust tube 16 to circulate the gas therein.

The reactant gas is preferably a mixed gas of hydrocarbon and hydrogen, with a mixing ratio of hydrocarbon to hydrogen in the range of 2 to 1~1 to 100 by volume, and the hydrocarbon preferably comprises at least one type of hydrocarbon selected from among lower saturated hydrocarbons, lower unsaturated hydrocarbons, and lower cyclic hydrocarbons.

In this operation, the flow rate of the reactant gas is preferably in the range of 50~500 sccm. Additionally, the inner pressure of the chamber 10 is preferably set at a predetermined value such as 0.1~10 Pa.

At the same time, high frequency electrical power of preferably 50~2000 W is supplied to the electrodes 11, using the high frequency electrical source 12, to generate plasma, and thereby form a carbon layer 43b with a thickness of preferably 5~10 Å on both sides of the disc D, by means of plasma chemical gas phase growth, using the aforementioned reactant gas as a starting material.

When supplying electrical power to the electrodes 11 and 11, it is preferable to make the phases of electrical power supplied to each electrode 11 different. By means of making the phases of electrical power supplied to each electrode 11 different, it is possible to improve the coating rate and durability of the protective film. The difference in the phase of electrical power supplied to each electrode is preferably in the range of 90~270°, and in particular, more preferably opposite phase (i.e., 180°).

The resultant carbon layer 43b contains a higher content of diamond-like-carbons (DLC), which exhibit an increased hardness, leading to a superior strength when compared to a carbon film formed according to the conventionally known, spatter-coating method.

In this operation, it is preferable to form the film while performing bias applying e.g., high frequency bias and pulse D.C. bias to the disc D, using the bias electrical source 13.

The conditions such as the voltage of the bias are preferably set as described in the aforementioned.

Subsequently, a lubricant such as perfluoropolyether, fomblin lubricant, and the like, is applied onto the carbon layer 43b, according to a dipping method, and the like, to form a lubricating film 44. In this manner, a magnetic recording medium is provided wherein a non-magnetic base film 41 and magnetic film 42 are first formed onto a substrate S, followed by successive formation of a protective film 43, comprising a tantalum nitrogen layer 43a and a carbon layer 43b, and a lubricating film 44 thereon.

In the aforementioned magnetic recording medium, the protective film 43 is provided with the carbon layer 43b, which is formed on a tantalum nitrogen layer 43a, consisting principally of a material comprising tantalic and nitrogen, according to a plasma CVD method, and thus exhibits a superior durability.

The reason that the aforementioned magnetic recording medium exhibits a superior durability can be attributed to the formation of a protective film 43 comprising a carbon layer 43b, which exhibits sufficient strength and relatively high bonding strength with the lubricating film 44, onto a tantalum nitrogen layer 43a which exhibits a great hardness.

Accordingly, it is possible to make the protective film 43 thinner while also maintaining a sufficient durability, and thereby reduce spacing loss.

Therefore, it is possible to provide a magnetic recording medium, that is reliable and capable of sufficiently increasing the recording density without lowering the output properties thereof.

Furthermore, in the aforementioned embodiment, the protective film 43 is provided with a two-layer structure comprising a tantalum nitrogen layer 43a and a carbon layer 43b. However, the magnetic recording medium according to the present invention is not limited thereto, and may also comprise a structure having three or more layers.

In the following, the effects of the present invention are specified, using concrete examples.

TEST EXAMPLES 62~64

A magnetic recording medium was manufactured, using the aforementioned plasma CVD apparatus, and spattering device, according to the following process. A spattering device with a target 51 comprising tantalum was used.

After an aluminium alloy substrate coated with a NiP metal film (with a diameter of 95 mm and thickness of 0.8 mm) was treated with mechanical texture-processing to form an average surface roughness of 20 Å, a non-magnetic base film 41 (with a thickness of 600 Å) comprising a Cr alloy, and a magnetic film 42 comprising a Co alloy ($Co_{82}Cr_{15}Ta_3$) were successively formed on both sides of the substrate S, using a spattering device (3010 manufactured by Anelva), to obtain a disc D.

Subsequently, the disc D was transported into chamber 50 of the spattering device, and a spatter gas was supplied from the supply source 53 to the chamber 50 via the introduction tube 54.

A mixed gas of nitrogen and argon, comprising a mixing ratio shown in Table 10, was used as the spatter gas. Additionally, the inner pressure of the chamber 50 was maintained at 0.7 Pa.

At the same time, D.C. electrical power of 600 W was supplied to the target 51, and a tantalum nitrogen layer 43a comprising tantalum and nitrogen was formed on both sides of the disc D by means of spattering.

Subsequently, the disc D was transported into the chamber 10 of the plasma CVD apparatus, and a reactant gas was supplied from the supply source 14 into the chamber 10.

A mixed gas of toluene and hydrogen, comprising a mixing ratio shown in Table 10, was used as the reactant gas. Additionally, the inner pressure of the chamber 10 was maintained at 6 Pa.

At the same time, high frequency electrical power of 300 W was supplied to the electrodes 11, to generate plasma, while applying high frequency electrical power of 50 W (with a frequency of 13.56 MHz) to the disc D, using the bias electrical source 13, to form a carbon layer 43b on both sides of the disc D.

Furthermore, the temperature of the disc D at the time of forming the carbon layer 43b was set at 130° C. The difference in the phase of high frequency electrical power supplied to each electrode 11 was 180°. Additionally, the distance between the disc D and the electrode 11 was set at 30 mm.

Subsequently, a fomblin lubricant (Fomblin Zdol 2000) was applied onto the carbon layer 43b, according to a dipping method, to form a lubricating film 44 with a thickness of 20 Å, thereby yielding a magnetic recording medium.

The CSS test described in the following was performed on the resultant magnetic recording media. In the CSS test, using an MR head, a CSS operation was performed 20000 times at a rotational speed of 7200 rpm, and a temperature of 40° C. with a humidity of 80%. The dynamic stiction value was monitored after allowing the magnetic recording medium to sit for one hour. The results are shown in Table 10.

TEST EXAMPLE 65

A magnetic recording medium, wherein the protective film comprised a single-layer structure comprising only a carbon layer, was manufactured without forming a tantalum nitrogen layer.

TEST EXAMPLE 66

A magnetic recording medium, wherein the protective film comprised a single-layer structure comprising only a tantalum nitrogen layer, was manufactured without forming a carbon layer.

TEST EXAMPLE 67

A magnetic recording medium, wherein the protective film comprised a two-layer structure comprising a tantalum nitrogen layer and a carbon layer, was manufactured according to a method in which a spatter gas containing nitrogen, at a mixing ratio shown in Table 10, was used at the time of forming the tantalum nitrogen layer.

The aforementioned CSS test was performed on these magnetic recording media, and the test results are shown in Table 10.

The nitrogen content in the tantalum nitrogen layer of the magnetic recording medium in each of the aforementioned Test Examples 62, 63, 65, and 66 were 5 at %, and the nitrogen content in the tantalum nitrogen layer of the magnetic recording medium in Test Example 67 was 40 at %.

TABLE 10

| | Structure of protective film | Tantalic nitrogen layer | | Carbon layer | | | |
| --- | --- | --- | --- | --- | --- | --- | --- |
| | | Nitrogen content in spatter gas (vol. %) | Thickness (Å) | Flow rate of reactant gas | | Thickness (Å) | Stiction (−) |
| | | | | Toluene (sccm) | Hydrogen (sccm) | | |
| Test Example 62 | Two-layer | 5 | 45 | 10 | 120 | 5 | 0.67 |
| Test Example 63 | Two-layer | 5 | 10 | 10 | 120 | 40 | 0.44 |
| Test Example 64 | Two-layer | 5 | 45 | 100 | 0 | 5 | 0.91 |
| Test Example 65 | Single-layer | — | — | 10 | 120 | 50 | 1.27 |
| Test Example 66 | Single-layer | 5 | 50 | — | — | — | Crash |
| Test Example 67 | Two-layer | 50 | 30 | 109 | 120 | 20 | Crash |

From the results of the CSS test shown in Table 10, it is clear that the magnetic recording media comprising a protective film 43 comprising a tantalum nitrogen layer 43a, with a nitrogen content of 1~30 at %, and carbon layer 43b formed thereon, exhibited sufficient durability against a CSS operation performed 20000 times. On the other hand, the magnetic recording media comprising only a single-layer carbon protective film, or alternatively comprising a protective film in which the nitrogen content of the tantalum nitrogen layer was out of the aforementioned range, exhibited an inferior durability.

As explained in the aforementioned, according to the present invention, it is possible to form a carbon protective film with a superior durability. Therefore, it is also possible to make the carbon protective film thinner while also maintaining a sufficient durability, and thereby reduce spacing loss.

Thus, it is possible to provide a highly reliable magnetic recording medium, which is capable of sufficiently increasing the recording density without lowering the output properties thereof.

Figure 6:
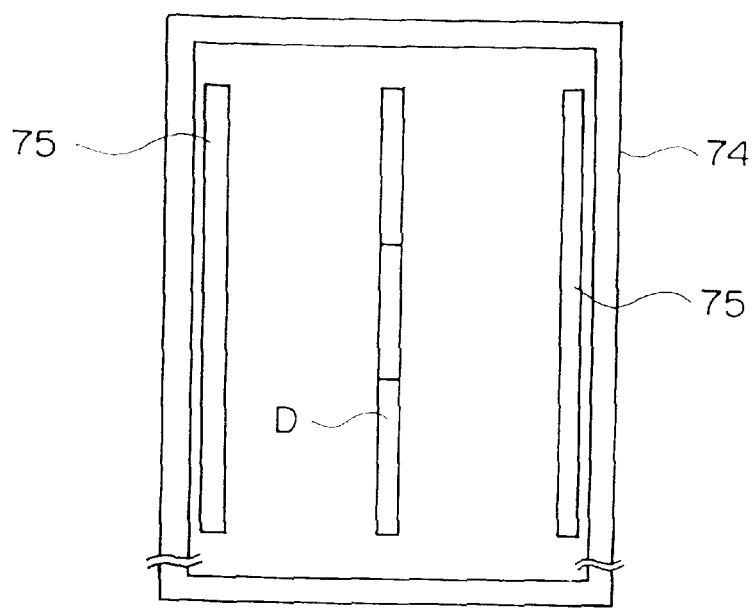
FIG. 6 is a schematic structural view, showing the ultraviolet ray irradiation equipment used in an embodiment of the method for manufacturing a magnetic recording medium according to the present invention.
Figure 7:
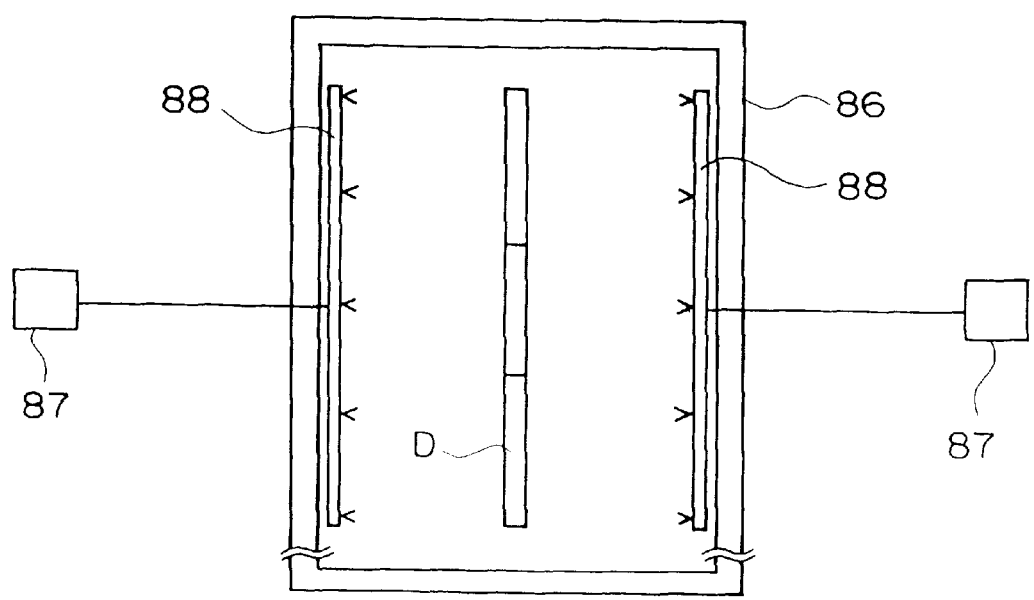
FIG. 7 is a schematic structural view, showing the washing apparatus used in an embodiment of the method for manufacturing a magnetic recording medium according to the present invention.

FIGS. 6 and 7 show the critical parts of the manufacturing equipment used in another embodiment of the method for manufacturing magnetic recording medium according to the present invention. FIG. 6 shows an ultraviolet ray irradiation device; and FIG. 7 shows a washing apparatus.

The ultraviolet ray irradiation device is used to irradiate the surface of the carbon protective film with ultraviolet rays, and is provided with a chamber 74 for storing a disc comprising a carbon protective film; and ultraviolet ray source 75 for irradiating the surface of the disc stored therein with ultraviolet rays. The ultraviolet ray source is preferably one that is capable of irradiating ultraviolet rays with a wavelength of 100~400 nm.

Concrete examples of the ultraviolet ray source 75 may include an excimer emission lamp.

The washing apparatus cleans the surface of the carbon protective film of the disc, which has passed through the ultraviolet ray irradiation device, and is provided with a chamber 86 to store the disc; a supply source 87 for cleaning water to clean the disc stored in the chamber 86; and a nozzle 88 for injecting cleaning water supplied from the supply source 87 at the aforementioned disc.

In the following, another embodiment of the method for manufacturing magnetic recording medium according to the present invention is described, using an example in which the plasma CVD apparatus shown in FIG. 1 in addition to the aforementioned ultraviolet ray irradiation device and washing apparatus are employed.

Initially, a non-magnetic base film and magnetic film are formed on both sides of non-magnetic substrate, according to the spatter-coating method and the like, to obtain a disc D.

The non-magnetic substrate may comprise any substrate that is generally used as a substrate for magnetic recording medium, as described in the aforementioned. The material and thickness of the non-magnetic base film and magnetic film are as described in the aforementioned.

Subsequently, the disc D is transported into the chamber 10 of the aforementioned plasma CVD apparatus, and the surface of the disc D is exposed to a reactant gas, which is supplied from the supply source 14 through the introduction tube 15 into the chamber 10. The gas is then exhausted from chamber 10 via the exhaust tube 16 to circulate the gas therein.

The reactant gas is preferably a mixed gas of hydrocarbon and hydrogen, with a mixing ratio of hydrocarbon to hydrogen in the range of 2 to 1~1 to 100 by volume, and the hydrocarbon preferably comprises at least one type of hydrocarbon selected from among lower saturated hydrocarbons, lower unsaturated hydrocarbons, and lower cyclic hydrocarbons.

When carrying out this operation, the flow rate of the reactant gas is preferably 50~500 sccm. Additionally, the inner pressure of the chamber 10 is preferably set at a predetermined value, such as 0.1~10 Pa.

At the same time, using the high frequency electrical power source 12, high frequency electrical power of preferably 50~2000 W is supplied to the electrodes 11 to generate plasma, and a carbon protective film, with a thickness preferably in the range of 30~100 Å, is formed on both sides of the disc D by means of plasma chemical gas phase growth, using the aforementioned reactant gas as a starting material.

When supplying electrical power to the electrodes 11 and 11, it is preferable to make the phases of electrical power supplied to each electrode 11 different. By means of making the phases of electrical power supplied to each electrode 11 different, it is possible to improve the coating rate and durability of the protective film. The difference in the phase of electrical power supplied to each electrode is preferably in the range of 90~270°, and in particular, the opposite phase (i.e., 180°) is preferred.

In this operation, it is preferable to form the film while performing bias applying, such as high frequency bias or pulse D.C. bias, to the disc D, using the electrical bias source 13.

The conditions of bias such as voltage and the like are preferably as described in the aforementioned.

The formed carbon protective film contains a higher content of diamond-like-carbons (DLC), which exhibit an increased hardness.

In the method for manufacturing magnetic recording medium according to the present embodiment, subsequently, the disc D formed with the aforementioned carbon protective film is transported into the chamber 74 of the ultraviolet ray irradiation device, and the surface of the carbon protective film of the aforementioned disc D is irradiated with ultraviolet rays comprising a wavelength of preferably 100~400 nm, using the ultraviolet ray source 75.

If the wavelength of the ultraviolet rays is less than 100 nm, energy loss becomes great, while if the wavelength exceeds 400 nm, the effects of improving the properties of the carbon protective film 23 are insufficient, and hence undesirable.

The preferred condition at the time of irradiating with ultraviolet rays is an illuminance of 5~50 mW/cm$^2$, and radiation duration of 2~600 seconds.

Subsequently, the disc D which has passed through the ultraviolet rays irradiation device, is transported into the washing apparatus, and cleaning water supplied from the supply source 87 is injected at the aforementioned disc D, using a nozzle 88, to clean the surface of the carbon protective film. As the cleaning water used herein, a ultrapure water with only a small unpurified content is preferred due to its superior effectiveness in cleaning the surface of the carbon protective film.

Subsequently, a lubricant such as perfluoropolyether, fomblin lubricant, and the like, is applied, according to a dipping method or the like, to the carbon protective film on the surface of the disc D, which has passed through the washing apparatus, to form a lubricating film. In this manner, a magnetic recording medium, wherein a non-magnetic base film, magnetic film, carbon protective film and lubricating film are successively formed on a substrate, is obtained.

Examples of the magnetic recording medium manufactured according to the aforementioned manufacturing method may include a magnetic recording medium with a similar structure to that shown in FIG. 2.

In the magnetic recording medium of this example, a non-magnetic substrate S, a non-magnetic base film 31, a magnetic film 32, a carbon protective film 33, and a lubricating film 34 are provided.

In the aforementioned method for manufacturing a magnetic recording medium, since the surface of the carbon protective film 33 is irradiated with ultraviolet rays prior to forming the lubricating film 34, the quality of the film surface is improved, and the adhesion of the carbon protective film 33 to the lubricating film 34 is increased, leading to a superior durability.

The reason for the aforementioned magnetic recording medium exhibiting a superior durability is attributed to the following. Specifically, by the irradiation with ultraviolet rays, the shallow area of the carbon protective film 33, near the surface, contains a large amount of dangling bonds, and bonding involving this dangling bonds of the carbon protective film 33 firmly adheres to the lubricating film 34.

Accordingly, it is possible to make the carbon protective film thinner, and thereby reduce spacing loss. In addition, it is possible to prevent problems such as spin-off during CSS operation.

Thus, it is possible to provide a highly reliable magnetic recording medium, which is capable of increasing the recording density without lowering the output properties thereof.

Additionally, by means of using an excimer emission lamp as the ultraviolet ray source 75, it is possible to obtain a high output using a short pulse width, and thereby efficiently improve the quality of the carbon protective film 33 surface.

In addition, by means of washing the surface of the carbon protective film 33 with water, it is possible to remove the impurities that are attached to the surface of the carbon protective film 33, and thereby clean the film.

Thus, it is possible to prevent a reduction in the bonding strength between the carbon protective film 33 and lubricating film 34 due to impurities lying between the two films, which in turn prevents any reduction in the durability of the magnetic recording medium.

In addition, in the manufacturing method according to the aforementioned embodiment, after forming the carbon protective film, the surface is irradiated with ultraviolet rays, and then washed using water. However, the method for manufacturing magnetic recording medium according to the present invention is not limited thereto, and the washing process may precede the process of irradiating with ultraviolet rays, after forming the carbon protective film.

In addition, the surface of the carbon protective film may also be washed using water without undergoing irradiation with ultraviolet rays. Furthermore, the surface of the carbon protective film may be irradiated with ultraviolet rays without being washed.

Additionally, in the method for manufacturing magnetic recording medium according to the present invention, after forming the carbon protective film, a tape-vanishing process, wherein micro-ridges on the surface of the carbon protective film are scraped off, may also be performed.

In the following, the effects of the present invention are specified, using concrete examples.

TEST EXAMPLE 68

A magnetic recording medium was manufactured, using a plasma CVD apparatus, an ultraviolet ray irradiation device, and a washing apparatus shown in FIGS. 1, 6, and 7, respectively, according to the following process.

After an aluminium alloy substrate coated with a NiP metal film (with a diameter of 95 mm and thickness of 0.8 mm) was treated with mechanical texture-processing to form an average surface roughness of 20 Å, a non-magnetic base film 31 (with a thickness of 600 Å) comprising a Cr alloy, and a magnetic film 32 comprising a Co alloy ($Co_{82}Cr_{15}Ta_3$) were successively formed on both sides of the substrate S, using a spattering device (3010 manufactured by Anelva), to obtain a disc D.

Subsequently, the disc D was transported into the chamber 10 of the plasma CVD apparatus, and a mixed gas was supplied from the supply source 14 into the chamber to achieve a flow rate of 130 sccm.

A mixed gas of toluene and hydrogen, with a mixing ratio of toluene to hydrogen of 1 to 12 by volume, was used as the reactant gas. Additionally, the inner pressure of the chamber 10 was maintained at 6 Pa.

At the same time, high frequency electrical power of 450 W was supplied to the electrodes 11 to generate plasma, while applying pulse D.C. bias of −120V (with a frequency of 200 kHz and pulse width of 500 ns) to the disc, using the electrical bias source 13, to form a carbon protective film 33 with a thickness of 50 Å on both sides of the disc D. The temperature of the disc D, and coating rate were maintained at 130° C., and 450 Å/min, respectively. The difference in the phase of high frequency electrical power supplied to each electrode 11 was set at 180°. In addition, the distance between the disc D and electrode 11 was set at 30 mm.

Subsequently, the disc D wherein the carbon protective film was formed according to the aforementioned operation was transported into the washing apparatus, wherein the surface was washed using ultrapure water.

The disc D was then transported into the chamber 74, where the disc D was irradiated with ultraviolet rays, using the ultraviolet ray source 75.

Herein, an excimer lamp (manufactured by Ushio Denki), which is able to irradiate ultraviolet rays of a wavelength of 172 mm (with a half band width of 14 nm), was used as the ultraviolet ray source 75, and ultraviolet ray irradiation was performed for 30 seconds at an illuminance of 10 mW/cm$^2$ under a nitrogen gas atmosphere.

Subsequently, the disc D was washed in the washing apparatus again, and then a fomblin lubricant (Fomblin Zdol 2000) was applied 33 after washing to the carbon protective film, according to a dipping method. A lubricating film 34 with a thickness of 20 Å was then formed, to obtain a magnetic recording medium.

TEST EXAMPLE 69

A magnetic recording medium was manufactured in the same manner as in Test Example 68, with the exception that an excimer lamp (manufactured by Ushio Denki) capable of irradiating ultraviolet rays with a wavelength of 222 nm (with a half band width of 2 nm) was used as the ultraviolet ray source 75, and the disc D was irradiated with ultraviolet rays for 30 seconds at an illuminance of 7 mW/cm$^2$ under a nitrogen gas atmosphere.

TEST EXAMPLE 70

A magnetic recording medium was manufactured in the same manner as in Test Example 68, with the exception that the disc D was irradiated with ultraviolet rays under ambient air.

TEST EXAMPLE 71

A magnetic recording medium was manufactured in the same manner as in Test Example 68, with the exception that the disc D was not washed in the washing apparatus. In this test, ultraviolet ray source 75 used in Test Example 68 was used.

TEST EXAMPLE 72

A magnetic recording medium was manufactured in the same manner as in Test Example 68 except that irradiation with ultraviolet rays was not performed.

The bonded ratio test, spin-of test and CSS test described in the following were performed on each magnetic recording medium, obtained in each of the aforementioned

TEST EXAMPLES (1) Bonded Ratio Test

Each of the aforementioned magnetic recording medium was soaked in a solvent (AK225 manufactured by Asahi Glass) for 15 minutes, and then removed. The ratio of the thickness of the lubricating film 34 prior to this operation and after this operation was then calculated in percentage. The thickness of the lubricating film 34 was measured at the position where the radius measured 20 mm, using ESCA.

(3) Spin-off Test

The aforementioned magnetic recording medium was rotated at a rotational speed of 10000 rpm and a temperature of 100° C. for 168 hours. The ratio of the thickness of the lubricating film 34 prior to this operation and after this operation was then calculated in percentage. The thickness of the lubricating film 34 was measured at the positions, where the radius of the magnetic recording medium measured 20 mm (inner circumference) and 42 mm (outer circumference), respectively, using FT-IR.

(3) CSS Test

Using an MR head, a CSS operation was performed on the aforementioned magnetic recording medium 5000 times, at a rotational speed of 7200 rpm, and a low temperature of 5° C. with a low humidity of 15%.

In this CSS test, two types of tests were performed: in one test, the aforementioned magnetic recording medium was baked at a temperature of 180° C. for 3 hours prior to the aforementioned CSS operation, and in the other, no such baking process was performed. The test results are shown in Table 11.

TEST EXAMPLE 73

A magnetic recording medium was manufactured in the same manner as in Test Example 68 with the exception that neither irradiation using ultraviolet rays nor washing was performed.

TEST EXAMPLE 74

A magnetic recording medium was manufactured in the same manner as in Test Example 68 with the exception that the carbon protective film with a thickness of 100 Å was formed according to a conventionally known, spattering method.

TEST EXAMPLE 75

A magnetic recording medium was manufactured in the same manner as in Test Example 74 with the exception that washing was not performed.

TEST EXAMPLE 76

A magnetic recording medium was manufactured in the same manner as in Test Example 74 with the exception that irradiation with ultraviolet rays was not performed.

TEST EXAMPLE 77

A magnetic recording medium was manufactured in the same manner as in Test Example 74 with the exception that neither irradiation using ultraviolet rays nor washing was performed.

The aforementioned three types of tests were performed on each of the aforementioned magnetic recording media. The test results are shown in Table 11.

In the table, the plasma CVD method is referred to as "pCVD method", and ultraviolet ray irradiation is referred to as "UV irradiation".

TABLE 11

| | Carbon protective film coating method | UV irradiation source | Washing process | Bonded ratio (%) | Spin-off Inner circumference (%) | Spin-off Outer circumference (%) | CSS w/o baking process | CSS With baking process |
|---|---|---|---|---|---|---|---|---|
| Test Example 68 | pCVD method | Excimer lamp | with | 33 | 74 | 80 | No crash | No crash |
| Test Example 69 | pCVD method | Excimer lamp | with | 51 | 82 | 89 | No crash | No crash |
| Test Example 70 | pCVD method | Excimer lamp | with | 39 | 77 | 83 | No crash | No crash |
| Test Example 71 | pCVD method | Excimer lamp | without | 31 | 72 | 79 | No crash | No crash |
| Test Example 72 | pCVD method | — | with | 15. | 42 | 49 | No crash | No crash |
| Test Example 73 | pCVD method | — | without | 11 | 38 | 44 | No crash | Crash |
| Test Example 74 | Spattering method | Excimer lamp | with | 56 | 84 | 92 | Crash | Crash |
| Test Example 75 | Spattering method | Excimer lamp | without | 53 | 82 | 89 | Crash | Crash |
| Test Example 76 | Spattering method | — | with | 30 | 75 | 82 | Crash | Crash |
| Test Example 77 | Spattering method | — | without | 28 | 76 | 82 | Crash | Crash |

From the results of CSS shown in Table 11, it is clear that the magnetic recording media, manufactured according to a method in which the carbon protective film was formed according to the plasma CVD method, and ultraviolet ray irradiation and/or washing with ultrapure water was performed prior to lubricating the film, exhibited sufficient durability against CSS operations performed 5000 times.

Additionally, from the results of the bonded ratio test and spin-off test, the magnetic recording media, manufactured according a the method in which UV irradiation was performed, exhibited a lower reduction rate in thickness of the lubricating film, compared to those manufactured according to a method in which UV irradiation was not performed.

As explained in the aforementioned, according to the present invention, it is possible to form a carbon protective film of a superior durability. As a result, it is also possible to make the carbon protective film thinner while also maintaining a sufficient durability, and thereby reduce spacing loss.

Consequently, it is possible to provide a highly reliable magnetic recording medium which is capable of sufficiently increasing the recording density without lowering the output properties thereof.

In the following, another embodiment of the magnetic recording medium according to the present invention is described.

The magnetic recording medium according to the present embodiment comprises a structure similar to that shown in FIG. 2. In the magnetic recording medium according to the present embodiment, a non-magnetic substrate S, a non-magnetic base film 31, a magnetic film 32, a carbon protective film 33, and a lubricating film 34 are provided.

Examples of the non-magnetic substrate S may include an aluminium alloy substrate coated with a NiP metal film, in addition to substrates comprising glass, silicone, and the like.

The surface of the substrate S is preferably treated with texture-processing such as mechanical texture-processing. In particular, the average surface roughness (Ra) is preferably in the range of 1~20 Å.

The material and thickness of the non-magnetic base film 31 and magnetic film 32 are as described in the aforementioned. The thickness of the non-magnetic base film 31 and magnetic film 32 are preferably in the range of 50~1000 Å, and 50~800 Å, respectively.

The carbon protective film 33 is formed according to the plasma CVD method.

The thickness of the carbon protective film is preferably in the range of 30~100 Å.

In the magnetic recording medium according to the present embodiment, the lubricating film 34 principally comprises at least one compound selected from among the compounds represented by the following formula (1) through (5), number average molecular weight of which fall in the range of 500~6000. The thickness of the lubricating film 34 is preferably in the range of 5~40 Å.

In this specification, the term "principally comprise" signifies that the particular component is contained in an amount greater than 70 wt %.

[wherein, m, n, p, q, r, s, t, u, v, and w represent an integer, respectively].

If the molecular weight of the compounds represented by the aforementioned formula (1) through (5) is less than 500, "spin-off" worsens. On the other hand, if the molecular weight of the compounds exceeds 6000, the lubricating ability of the surface of the resultant magnetic recording medium deteriorates, undesirably leading to an inferior CSS property.

Among the aforementioned, compounds represented by the formula (1) or (5), with a number average molecular weight of 500~6000, are especially preferred as the principal component of the lubricating film 34, since these compound improve the spin-off properties and CSS characteristics.

Additionally, the lubricating film 34 may principally comprise a mixture, wherein a compound represented by the following formula (6) is mixed into at least one compound selected from among the aforementioned formula (1) through (5), having a number average molecular weight is 500~6000, at a mixing ratio of 0.1~20 wt %.

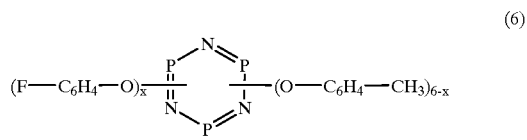

(6)

[wherein, x represents an integer between 0~6].

The formula (6) represents a compound, wherein six units of the structure represented by (F—$C_6H_4$—O) and/or (O—$C_6H_4$—$CF_3$) are bonded to at least one selected from among a nitrogen and/or phosphorus which have six-member-ring structure.

When using the compound represented by the formula (6), if the proportional content of this compound is less than 0.1 wt %, the lubricating ability of the surface of the resultant magnetic recording medium deteriorates, leading to an inferior CSS property. When the proportional content of the aforementioned exceeds 20 wt %, smears derived from this compound tend to stick to the head, which is undesirable.

In the following, the method for manufacturing the aforementioned magnetic recording medium is described.

In order to manufacture the aforementioned magnetic recording medium, initially, a non-magnetic base film 31 and magnetic film 32 were formed on both sides of a non-magnetic substrate, according to a method such as a spatter-coating method, or the like, to obtain a disc D.

Subsequently, the disc D is transported into the chamber 10 of the aforementioned plasma CVD apparatus, and the surface of the disc D is exposed to a reactant gas, which is supplied from the supply source 14 through the introduction

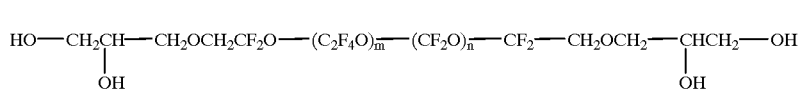

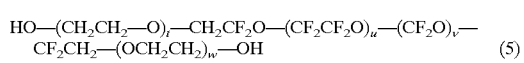

tube 15 into the chamber 10, from which the gas is exhausted via the exhaust tube 16 to circulate the gas within.

The reactant gas is a mixed gas of hydrocarbon and hydrogen, with a mixing ratio of hydrocarbon to hydrogen in the range of 2 to 1~1 to 100 by volume. The hydrocarbon preferably comprises at least one type of hydrocarbon selected from among lower saturated hydrocarbons, lower unsaturated hydrocarbons, and lower cyclic hydrocarbons.

In this operation, the flow rate of the reactant gas is preferably in the range of 50~500 sccm. Additionally, the inner pressure of the chamber 10 is preferably maintained at a predetermined value, such as 0.1~10 Pa.

At the same time, using the high frequency electrical power source 12, high frequency electrical power of preferably 50~2000 W is supplied to the electrodes 11 to generate plasma, and a carbon protective film 33 with a thickness of preferably in the range of 30~100 Å, is formed on both sides of the disc D by means of plasma chemical gas phase growth, using the aforementioned reactant gas as a starting material.

When supplying electrical power to the electrodes 11 and 11, it is preferable to make the phases of electrical power supplied to each electrode 11 different. By means of making the phases of electrical power supplied to each electrode 11 different, it is possible to improve the coating rate and durability of the protective film. The difference in the phase of electrical power supplied to each electrode is preferably in the range of 90~270°, and in particular, the opposite phase (i.e., 180°) preferred.

In this operation, it is preferable to form the film while performing bias applying, such as high frequency bias or pulse D.C. bias, to the disc D, using the electrical bias source 13.

The conditions of bias such as voltage and the like are preferably as described in the aforementioned.

The resultant carbon protective film 33 contains a higher content of diamond-like-carbons (DLC), which exhibit an increased hardness.

Subsequently, the lubricant comprising the compounds represented by the aforementioned chemical formula is applied to the carbon protective film 33, according to a dipping method or the like, to form a lubricating film 34 with a thickness of preferably 5~40 Å. In this manner, a magnetic recording medium is obtained, in which the non-magnetic base film 31, magnetic film 32, carbon protective film 33, and lubricating film 34 were successively formed on a substrate S.

According to the aforementioned magnetic recording medium, wherein the lubricating film 34 principally comprises at least one compound selected from among the compounds represented by formula (1) through (5), or alternatively principally comprises a mixture of the aforementioned compound and a compound represented by formula (6), in which the proportional content of the compound represented by the formula (6) is 0.1~20 wt %, the aforementioned lubricating film 34 exhibits a greater adhesion to the carbon protective film 33, and hence provides for a superior durability.

The reason for the aforementioned magnetic recording medium exhibiting a superior durability is attributed to the fact that the lubricating film comprising the aforementioned components is firmly adhered to the carbon protective film 33 formed according to the plasma CVD method.

As a result, it is possible to make the carbon protective film 33 thinner while also maintaining a sufficient durability, and thereby reduce spacing loss. Additionally, there are no problems such as spin-off in CSS operation.

Consequently, it is possible to provide a highly reliable magnetic recording medium, which is capable of sufficiently increasing the recording density without lowering the output properties thereof.

In the following, the effects of the present invention are specified using concrete examples.

TEST EXAMPLES 78~84

The magnetic recording medium similar to that shown in FIG. 2 was manufactured as follows.

After an aluminium alloy substrate coated with a NiP metal film (with a diameter of 95 mm and thickness of 0.8 mm) was treated with mechanical texture-processing to form an average surface roughness of 20 Å, a non-magnetic base film 31 (with a thickness of 600 Å) comprising a Cr alloy, and a magnetic film 32 comprising a Co alloy ($Co_{82}Cr_{15}Ta_3$) were successively formed on both sides of the substrate S, using a spattering device (3010 manufactured by Anelva), to obtain a disc D.

Subsequently, the disc D was transported into the chamber 10 of the plasma CVD apparatus, and a mixed gas was supplied from the supply source 14 into the chamber 10 to achieve a flow rate of 130 sccm.

A mixed gas of toluene and hydrogen, with a mixing ratio of toluene to hydrogen of 1 to 12 by volume, was used as the reactant gas. Additionally, the inner pressure of the chamber 10 was maintained at 6 Pa.

At the same time, high frequency electrical power of 450 W was supplied to the electrodes 11 to generate plasma, while applying pulse D.C. bias of −120V (with a frequency of 200 kHz and pulse width of 500 ns) to the disc, using the electrical bias source 13, to form a carbon protective film 33 with a thickness of 50 Å on both sides of the disc D. The temperature of the disc D, and coating rate were maintained at 130° C., and 450 Å/min, respectively. The difference in the phase of high frequency electrical power supplied to each electrode 11 was set at 180°. In addition, the distance between the disc D and electrode 11 was set at 30 mm.

Subsequently, a lubricating film 34 with a thickness of 20 Å, comprising the materials shown in Table 12, was formed on the carbon protective film 33, according to a dipping method, to obtain a magnetic recording medium.

In the table, the numbers in parenthesis correspond to the number of the aforementioned formula. That is, for example, Fomblin ZTETRAOL 2000 (1) used in Test Example 78 comprises the compound represented by the aforementioned formula (1).

Additionally, in the magnetic recording medium in Test Example 83, the lubricating film 34 comprises a mixture of Fomblin ZTETRAOL 2000 (1) and Fomblin Zdol 2000 (4) (with a mixing ratio of 1 to 1 by volume).

Additionally, in the magnetic recording medium in Test Example 84, the lubricating film 34 comprises the material in which X1P (6) was added to Demnum SP (2) at 3 wt %.

The bonded ratio test, and CSS test described in the following were performed on the resultant magnetic recording media.

(1) Bonded Ratio Test

The aforementioned magnetic recording medium was soaked in a solvent (AK225 manufactured by Asahi Glass) for 15 minutes, and then removed. The ratio of the thickness of the lubricating film 34 prior to this operation and after this operation was then calculated in percentage. The thickness of the lubricating film 34 was measured at the position where the radius measured 20 mm, using ESCA.

In addition, after the aforementioned bonded ratio test, the magnetic recording medium was left under the environment of a temperature of 120° C. for 3 hours, after which the bonded ratio test was performed in the same manner. The test results are shown in Table 12.

In Table 12, the test results after thermal treatment at 120° C. are shown in the column of 'with baking', and the test results before thermal treatment are shown in the column of 'without baking'.

(2) CSS Test

After the aforementioned magnetic recording medium was baked at a temperature of 120° C. for 3 hours, a CSS operation was performed, using an MR head, on the aforementioned magnetic recording medium 10000 times at a rotational speed of 7200 rpm, and a low temperature of 5° C. with a low humidity of 15%. The coefficient of dynamic friction on the surface of the magnetic recording medium was subsequently measured. Furthermore, after the aforementioned magnetic recording medium was allowed to sit for 6 hours, the coefficient of static friction was measured.

TEST EXAMPLES 85~88

A magnetic recording medium was manufactured, wherein the carbon protective film was formed according to the spattering method, and the lubricating film comprised the materials shown in Table 12.

The aforementioned two types of tests were performed on these magnetic recording media. The test results are shown in Table 12.

In the table, plasma CVD method is expressed as "pCVD" method.

Accordingly, the aforementioned magnetic recording medium exhibited a superior durability.

Additionally, the magnetic recording medium, wherein the carbon protective film was formed according to the spattering method, induced a head crash or exhibited an increased coefficient of static friction, from baking process at a high temperature. Whereas the magnetic recording medium, wherein the carbon protective film was formed according to the plasma CVD method, and the lubricating film principally comprised the aforementioned compound (s), maintained a small coefficient of dynamic friction even after treatment at a high temperature.

As explained in the aforementioned, according to the present invention, it is possible to form a carbon protective film with a superior durability. As a result, it is also possible to make the carbon protective film thinner while also maintaining a sufficient durability, and thereby reduce spacing loss.

Therefore, it is possible to provide a highly reliable magnetic recording medium, which is capable of sufficiently increasing the recording density without lowering the output properties thereof.

Figure 8:
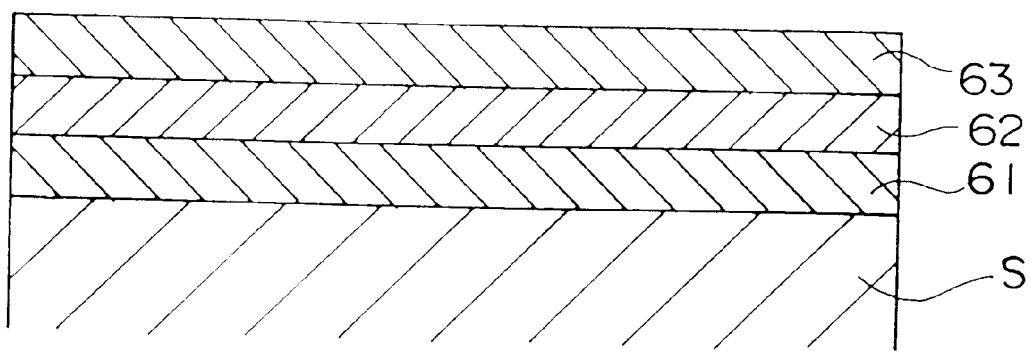
FIG. 8 is a cross-sectional view, showing an embodiment of the magnetic recording medium according to the present invention.

FIG. 8 shows another embodiment of the magnetic recording medium according to the present invention. In the magnetic recording medium shown herein, a non-magnetic

TABLE 12

| | | | Bonded ratio | | | Coefficient |
| --- | --- | --- | --- | --- | --- | --- |
| | Carbon protective film coating method | Material for lubricating film | without baking (%) | with baking (%) | Coefficient of dynamic friction (–) | of static friction (gram) |
| Test Example 78 | PCVD method | Fomblin ZTETRAOL 2000 (1) | 38 | 73 | 0.85 | 2.3 |
| Test Example 79 | PCVD method | Demnum SP (2) | 10 | 33 | 1.41 | 3.8 |
| Test Example 80 | PCVD method | Demnum SA (3) | 11 | 42 | 1.27 | 3.3 |
| Test Example 81 | PCVD method | Fomblin Zdol 2000 (4) | 15 | 58 | 0.90 | 2.2 |
| Test Example 82 | pCVD method | Fomblin TX (5) | 33 | 69 | 0.88 | 1.8 |
| Test Example 83 | pCVD method | Fomblin ZTETRAOL 2000 (1) + Fomblin Zdol 2000 (4) | 32 | 67 | 0.79 | 1.8 |
| Test Example 84 | pCVD method | Demnum SP (2) + X1P (6) | 10 | 32 | 0.59 | 2.5 |
| Test Example 85 | Spattering method | Fomblin ZTETRAOL 2000 (1) | 55 | 93 | Crash | Crash |
| Test Example 86 | Spattering method | Demnum SP (2) | 25 | 45 | 1.73 | 6.3 |
| Test Example 87 | Spattering method | Fomblin Zdol 2000 (4) | 32 | 91 | Crash | Crash |
| Test Example 88 | Spattering method | Demnum SP (2) + X1P (6) | 23 | 42 | 0.87 | 4.1 |

From the results of the CSS test shown in Table 12, it is clear that the magnetic recording media, in which the carbon protective film was formed according to the plasma CVD method, and the lubricating film principally comprised at least one compound selected from among the formula (1) through (5), or the aforementioned compound, into which a compound represented by the formula (6) is mixed in at 0.1~20 wt %, maintained a small coefficient of dynamic friction, and exhibited a desirable resistance to sliding.

base film 61, magnetic film 62, and carbon protective film 63 are successively formed on a non-magnetic substrate S.

Examples of the non-magnetic substrate S may include an aluminium alloy substrate coated with a NiP metal film, and substrates comprising glass, silicone, and the like.

In addition, the surface of the substrate S is preferably treated with texture-processing such as mechanical texture-processing. In particular, the average surface roughness (Ra) is preferably in the range of 1~20 Å.

The material of the non-magnetic base film 61 and magnetic film 62 are as described in the aforementioned. The thickness of the non-magnetic base film 61 and magnetic film 62 are preferably in the range of 50~1000 Å, and 50~800 Å, respectively.

The carbon protective film 63 is formed according to the plasma CVD method, and Co extraction amount to the substrate area is 3 ng/cm² or less, preferably 2ng/cm² or less, or more preferably 1.5 ng/cm² or less.

Herein, the Co extraction amount represents the amount of Co extracted from water, at the time when the magnetic recording medium, wherein a protective film is formed on the magnetic film containing Co at 50 at % or greater, is left for 96 hours at a temperature of 60° C. and a humidity of 80%, and then soaked in the water at 20° C. for 30 minutes.

If this Co extraction amount exceeds 3 ng/cm², the durability of the magnetic recording medium tends to weaken, which is undesirable.

The thickness of the carbon protective film 63 is preferably in the range of 30~100 Å.

If the thickness is less than 30 Å, the strength of the carbon protective film 63 is inadequate, and if the thickness exceeds 100 Å, the resultant magnetic recording medium exhibits greater spacing loss at the time of recording and replay, leading to a likelihood of lowering the output properties at the time of increasing the recording density.

Additionally, a lubricating film with a thickness of 5~40 Å, comprising perfluoropolyether, fomblin lubricant, or the like, may be provided on the carbon protective film 63.

In the following, the method for manufacturing the aforementioned magnetic recording medium is described.

When manufacturing the aforementioned magnetic recording medium, the plasma CVD apparatus shown in FIG. 1 may be used.

In order to manufacture the aforementioned magnetic recording medium, using this equipment, initially, a non-magnetic base film 61 comprising a Cr alloy or the like, and a magnetic film 62 comprising a Co alloy and the like are successively formed on both sides of a non-magnetic substrate S, comprising aluminium alloy coated with a NiP metal film, according to a method such as the spatter-coating method, and the like, to obtain a disc D.

Subsequently, the disc D is transported into the chamber 10 of the aforementioned plasma CVD apparatus, and the surface of the disc D is exposed to a reactant gas, which is supplied from the supply source 14 through the introduction tube 15 into the chamber 10, from which the gas is exhausted via the exhaust tube 16 to circulate the gas within.

The reactant gas is a mixed gas of hydrocarbon and hydrogen, with a mixing ratio of hydrocarbon to hydrogen in the range of 2 to 1~1 to 100 by volume. The hydrocarbon preferably comprises at least one type of hydrocarbon selected from among lower saturated hydrocarbons, lower unsaturated hydrocarbons, and lower cyclic hydrocarbons.

In this operation, the flow rate of the reactant gas is preferably in the range of 50~500 sccm. Additionally, the inner pressure of the chamber 10 is preferably maintained at a predetermined value, such as 0.1~10 Pa.

At the same time, using the high frequency electrical power source 12, high frequency electrical power of preferably 50~2000 W is supplied to the electrodes 11 to generate plasma, and a carbon protective film 63 with a thickness of preferably in the range of 30~100 Å, is formed on both sides of the disc D by means of plasma chemical gas phase growth, using the aforementioned reactant gas as a starting material.

When supplying electrical power to the electrodes 11 and 11, it is preferable to make the phases of electrical power supplied to each electrode 11 different. By means of making the phases of electrical power supplied to each electrode 11 different, it is possible to improve the coating rate and durability of the protective film. The difference in the phase of electrical power supplied to each electrode is preferably in the range of 90~270°, and in particular, more preferably opposite phase (i.e., 180°).

In this operation, it is preferable to form the film while performing bias applying, such as high frequency bias or pulse D.C. bias, to the disc D, using the electrical bias source 13.

The conditions of bias such as voltage and the like are preferably as described in the aforementioned.

The formed carbon protective film 63 contains a higher content of diamond-like carbon (DLC), which exhibit an increased hardness, higher density and greater strength, wherein the Co extraction amount with respect to the substrate area is 3 ng/cm² or less.

Subsequently, a lubricating film is preferably formed on the carbon protective film 63 according to a dipping method, or the like, by means of applying a lubricant such as perfluoropolyether, fomblin lubricant, and the like.

The aforementioned magnetic recording medium, wherein a carbon protective film 63 is formed according to the plasma CVD method, and the Co extraction amount to substrate area is 3 ng/cm2 or less, exhibits an increased hardness and higher density, in addition to displaying superior strength and resistance to corrosion.

Accordingly, it is possible to make the carbon protective film 63 thinner while also maintaining a sufficient durability, and thereby reduce spacing loss.

Therefore, it is possible to provide a highly reliable magnetic recording medium, which is capable of sufficiently increasing the recording density without lowering the output properties thereof.

In the following, the effects of the present invention are specified, using concrete examples.

TEST EXAMPLES 89~92

The magnetic recording medium shown in FIG. 8 is manufactured as follows.

After an aluminium alloy substrate coated with a NiP metal film (with a diameter of 95 mm and thickness of 0.8 mm) was treated with mechanical texture-processing to form an average surface roughness of 20 Å, a non-magnetic base film 61 (with a thickness of 600 Å) comprising a Cr alloy, and a magnetic film 62 comprising a Co alloy ($Co_{82}Cr_{15}Ta_3$) were successively formed on both sides of the substrate S, using a spattering device (3010 manufactured by Anelva), to obtain a disc D.

Subsequently, the disc D was transported into the chamber 10 of the plasma CVD apparatus, and a reactant gas was supplied from a supply source 14 into the chamber. A mixed gas comprising toluene and hydrogen was used as the reactant gas. The flow rate of each was as shown in Table 13. Additionally, the inner pressure of the chamber 10 was maintained at 6 Pa.

At the same time, high frequency electrical was supplied to the electrodes 11, power under the conditions shown in Table 13, to generate plasma, and a carbon protective film 63 with a thickness of 50 Å was formed on both sides of the disc D, to yield a magnetic recording medium.

At this time, pulse D.C. bias (DC) or high frequency bias (RF) was applied to the disc D, under the conditions shown in Table 13, using a bias electrical source 13. Additionally, the temperature of the disc D at the time of coating the film was set at 130° C. In addition, the difference of the phase of high frequency electrical power supplied to each electrode 11 was set at 180°. Additionally, the distance between the disc D and electrodes 11 were set at 30 mm. In the table, plasma RF electrical power represents the high frequency electrical power supplied to the electrodes 11.

The Co extraction amount of the magnetic recording medium onto which the aforementioned carbon protective film 63 is formed, was measured according to the corrosion test described in the following.

The test comprised the steps of allowing the aforementioned magnetic recording medium to sit for 96 hours at a high temperature (60° C.) and high humidity (80%); subsequently soaking the medium in 50 cc of ultrapure water for 30 minutes; and then measuring the amount of Co extracted in the pure water. Additionally, another test was also performed in the same manner with the exception that the aforementioned magnetic recording medium was instead allowed to sit at a normal temperature (25° C.) and normal humidity (50%) for 96 hours. The test results are shown in Table 14.

The results of Raman spectral analysis (argon ion laser excitation), performed on the aforementioned magnetic recording medium, using a Raman spectral analysis apparatus (manufactured by JEOL), are also shown in Table 14.

Additionally, the hardness of the carbon protective film 63 of the aforementioned magnetic recording medium was measured using a pico-indentor (manufactured by Hysitron). These results are also shown in Table 14.

TEST EXAMPLE 93

A magnetic recording medium, in which a carbon protective film comprising carbon was formed according to the conventionally known, spatter-coating method, using a target comprising carbon, was manufactured.

At this time, argon (Ar) was used as the spatter gas, and its flow rate was set at 90 sccm.

TEST EXAMPLE 94

A carbon protective film was formed according to the conventionally known, spatter-coating method, using a target comprising carbon. At this time, a mixed gas of Ar and nitrogen was used as the spatter gas, and their flow rates were set at 100 sccm, and 50 sccm, respectively. Accordingly, the protective film comprised nitrogen and carbon.

The above-described corrosion test and Raman spectral analysis were performed on each magnetic recording medium. In addition, the hardness of each magnetic recording medium was measured. The results are shown in Table 14.

TABLE 13

| | Protective film coating method | Reactant gas | | Plasma RF electrical power (W) | Bias conditions | | | |
|---|---|---|---|---|---|---|---|---|
| | | Toluene (sccm) | Hydrogen (sccm) | | Type | Frequency (kHz) | Pulse width (ns) | Voltage/ electrical power |
| Test Example 89 | pCVD method | 10 | 240 | 300 | DC | 200 | 500 | −100 V |
| Test Example 90 | pCVD method | 10 | 120 | 500 | RF | 400 | — | 50 W |
| Test Example 91 | pCVD method | 10 | 120 | 500 | DC | 200 | 500 | −100 V |
| Test Example 92 | pCVD method | 10 | 120 | 500 | RF | 400 | — | 30 W |
| Test Example 93 | Spattering method | — | — | — | — | — | — | — |
| Test Example 94 | Spattering method | — | — | — | — | — | — | — |

TABLE 14

| | Co extraction amount (60° C., 80%) (ng/cm$^2$) | Co extraction amount (25° C., 50%) (ng/cm$^2$) | Raman spectral analysis | | Hardness (Gpa) | Coating rate (Å/min) |
|---|---|---|---|---|---|---|
| | | | UG-line (cm$^{-1}$) | Id/Ig | | |
| Test Example 89 | 0.76 | 0.38 | 1543.8 | 0.55 | 26.6 | 458 |
| Test Example 90 | 0.53 | 0.38 | 1556.2 | 0.90 | 24.7 | 409 |
| Test Example 91 | 1.21 | 0.49 | 1541.9 | 0.66 | 20.5 | 753 |
| Test Example 92 | 1.47 | 0.55 | 1532.2 | 0.50 | 19.8 | 789 |
| Test Example 93 | 3.39 | 1.04 | 1572.3 | 4.14 | 10.3 | — |
| Test Example 94 | 4.47 | 1.19 | 1561.8 | 2.95 | 11.8 | — |

From Tables 13 and 14, the magnetic recording media, in which a carbon protective film was formed according to the plasma CVD method, and wherein the Co extraction amount to substrate area (at 60° C. and 80% humidity) was 3 ng/cm2 or less, showed a G-band peak at a higher frequency, exhibited a smaller Id/Ig, and displayed an increased hardness due to the effects of DLC, compared to the other magnetic recording media.

As explained in the aforementioned, according to the present invention, it is possible to form a carbon protective film with a superior durability. As a result, it is possible to make the carbon protective film thinner while also maintaining a sufficient durability, and thereby reduce spacing loss.

Therefore, it is possible to provide a highly reliable magnetic recording medium, which is capable of sufficiently increasing the recording density without lowering the output properties thereof.

Figure 9:
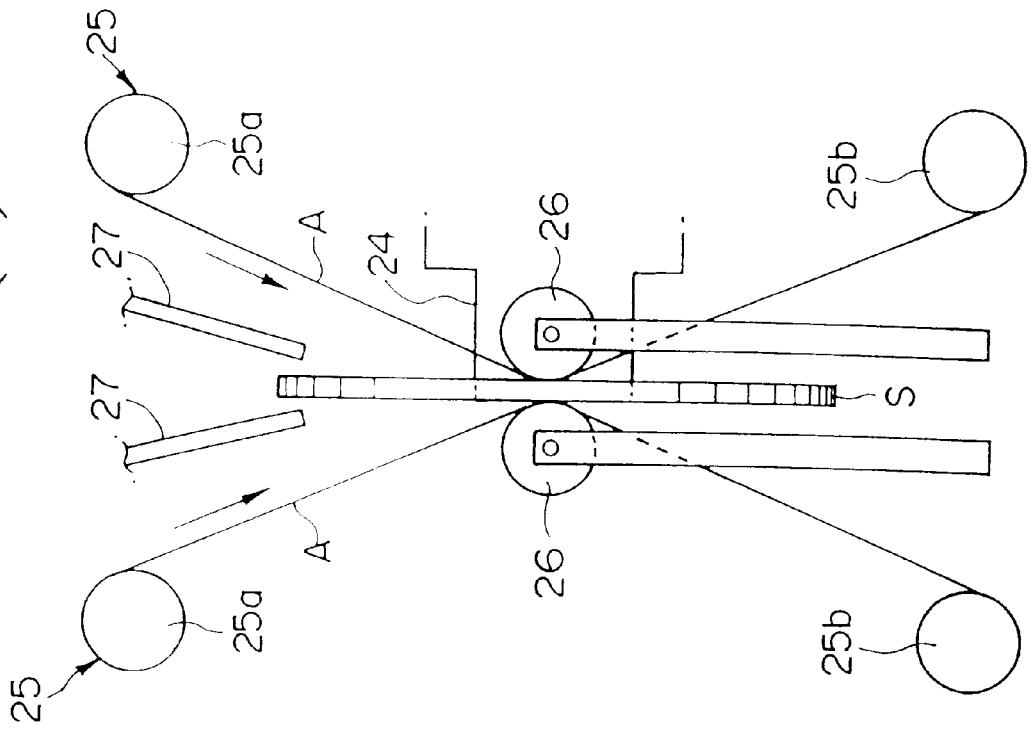
FIGS. 9(a) and 9(b) are schematic structural views, showing the texture-processing equipment used in an embodiment of the method for manufacturing a magnetic recording medium according to the present invention.
Figure 9:
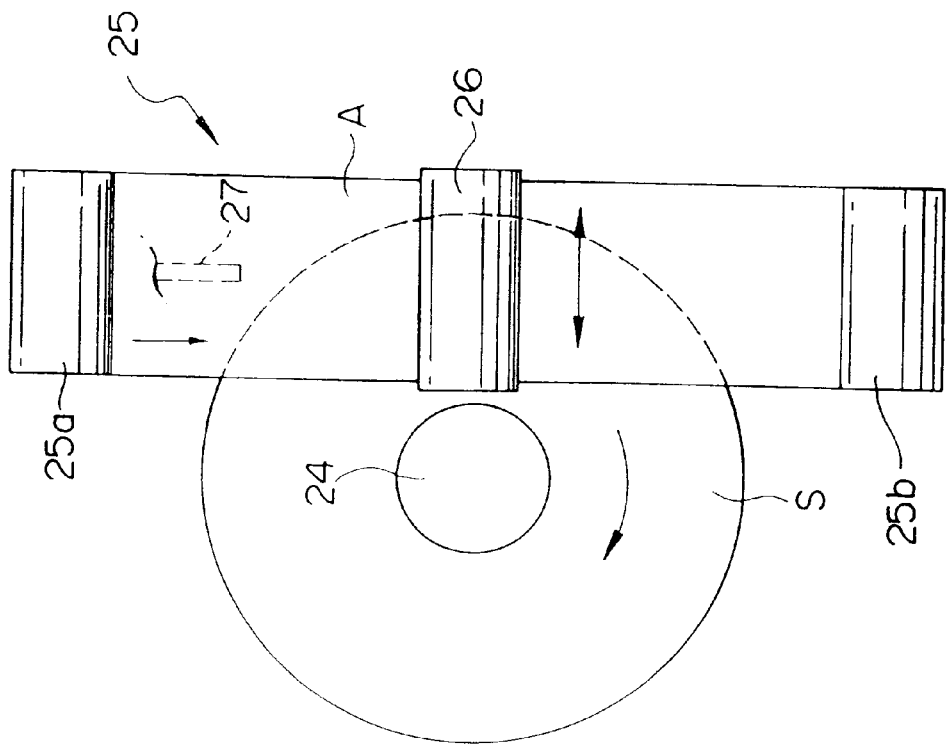

FIG. 9 shows the texture-processing equipment used in another embodiment of the method for manufacturing magnetic recording medium according to the present invention.

The texture-processing equipment shown herein is provided with a substrate support member 24, which supports the non-magnetic substrate S for texture-processing in a manner such that it can rotate; abrasive tape supply members 25 and 25, which supply abrasive tape A to mechanically scrape the non-magnetic substrate S; contact rollers 26 and 26, which press the abrasive tape A against one area of the surface of the substrate S; and abrasive particle supply nozzles 27 and 27 which supply abrasive particles to the area of contact between the abrasive tape A and substrate S.

The abrasive tape supply member 25 is provided with a delivery roll 25a, which sends the abrasive tape A out, and a receiving roll 25b, which receives the abrasive tape A. The aforementioned supply member 25 comprises a structure in which the abrasive tape A, wound around delivery roll 25a, may be received by receiving roll 25b, at any speed in the direction perpendicular to the radial direction of the substrate S, where the abrasive tape A is in contact with the substrate S. An abrasive tape supply member 25 is provided on each side of the substrate S.

Additionally, the abrasive tape supply member 25 is preferably designed such that the abrasive tape A is able to oscillate in a direction approximately perpendicular to the running direction of the tape.

In addition, it is possible to design the aforementioned substrate support member 24 such that it is able to oscillate in a direction approximately perpendicular to the running direction of the tape, in order so that the substrate S is able to oscillate against the abrasive tape A.

The contact rollers 26 may comprise a synthetic resin, rubber, metal, and the like, and are provided on each side of the substrate S, such that the roller 26 lies in contact with the substrate S, via the abrasive tape A, in a direction approximately perpendicular to the running direction of the tape.

The outer diameter of the contact roller 26 is preferably in the range of 20~100 mm, and the length in the axial direction is preferably set at a length which reaches the most-outer circumference from the most-inner circumference on the surface of the substrate S to undergo abrasion at the time of texture-processing.

The contact roller 26 is preferably attached in the direction of the substrate S such that the aforementioned abrasive tape is pushed against the substrate S with a predetermined pressure such as 0.3~4 kg/cm$^2$.

Examples of the abrasive tape A may include conventionally used, polishing tape, texture tape, and wiping tape; in particular, tapes with a thickness of 0.1~1.0 mm and width of 20~60 mm are preferred.

The abrasive supply nozzle 27 is provided at the upper portion of the contact roller 26 such that abrasive particle slurry in the abrasive particle slurry tank (not shown) can be introduced to the area of contact between the abrasive tape A and substrate S.

In the following, another embodiment of the aforementioned method for manufacturing magnetic recording medium according to the present invention is described, using an example in which the aforementioned texture-processing equipment and plasma CVD apparatus shown in FIG. 1 are employed.

Initially, the non-magnetic substrate S is supported by a substrate support member 24 of the texture-processing equipment.

The non-magnetic substrate may comprise any substrate that is generally used as a substrate for magnetic recording medium, examples of which may include an aluminium alloy substrate coated with a NiP metal film, and substrates comprising glass, silicone, and the like.

The substrate S is rotated in the direction shown by the arrow in the figure at a predetermined speed.

The rotational speed of the substrate S is preferably in the range of 300~2000 rpm. A rotational speed less than 300 rpm results in a reduction in the efficiency of texture-processing, while a rotational speed exceeding 2000 rpm tends to result in a non-uniform, processed surface for the substrate.

The abrasive tape A set in the abrasive tape supply member 25 is received by means of the receiving roll 25b. The speed at which the abrasive tape A is received preferably lies in the range of 0.1~2 cm/sec.

The abrasive tape A runs over the substrate S while in contact with both sides of the substrate S, at the time of passing between the contact roller 26 and substrate S.

At the same time, an abrasive particle slurry stored in the abrasive particle slurry tank (not shown) is introduced and allowed to run onto the abrasive tape A, via the abrasive particle supply nozzle 27.

The aforementioned abrasive particle slurry comprises a slurry in which abrasive particles are suspended in water.

The abrasive particle may comprise any particle that is conventionally used in texture-processing, examples of which may include diamond abrasive particles, alumina abrasive particles, carbon silicon, abrasive particles, and the like. Among the aforementioned, diamond abrasive particles are particularly preferred. The average particle diameter is preferably in the range of 0.1~0.5 μm.

If the average particle diameter is less than 0.1 μm, the resultant abrasion tends to be inadequate, while an average diameter exceeding 0.5 μm tends to result in the surface of the substrate becoming too rough, both of which are undesirable.

As the abrasive particle slurry, the aforementioned abrasive particles are preferably added to water to comprise approximately 5~30%. In addition, the flow rate of the abrasive particle slurry is preferably in the range of 10~100 ml/min.

The abrasive particle slurry introduced from the abrasive particle supply nozzle 27 reaches the area of contact between the abrasive tape A and substrate S. Here, the abrasive particles in the abrasive particle slurry are rubbed onto the substrate S, by means of running the abrasive tape A in the direction perpendicular to the radial direction of the substrate S, to scrape the surface of the substrate S. By means of scraping the surface of the rotating substrate S with abrasive particles, the resultant grooves are formed on the surface of the substrate in the running direction of the abrasive tape A, i.e., approximately, along the periphery of the substrate S.

In the method for manufacturing magnetic recording medium according to the present embodiment, the aforementioned operation is continued until the average surface roughness of the substrate S (Ra) becomes 1~20 Å. If the average surface roughness of the substrate S (Ra) is less than 1 Å, the resultant magnetic recording medium becomes excessively flat, leading to an inferior CSS property. If it exceeds 20 Å, the surface of the resultant magnetic recording medium becomes too irregular, leading to a deterioration in the glide avalanche property.

In addition, when performing texture-processing, it is preferable to oscillate the abrasive tape A in the direction perpendicular to the running direction of the tape by means of the aforementioned oscillation mechanism, to treat the processing surface of the substrate S uniformly in the radial direction of the substrate. The frequency of oscillation is preferably in the range of 0.1~5 Hz.

In addition, the width of the abrasive tape A at the time of oscillation is preferably in the range of 0.1~30 mm.

Furthermore, the direction of oscillation of the abrasive tape A is not limited to a direction perpendicular to the running direction of the tape, so long as the direction crosses the running direction of the tape.

Subsequently, using conventional spatter equipment or the like, a non-magnetic base film and magnetic film are formed on a substrate S, which has been treated with texture-processing, to obtain a disc D. The material and thickness of the non-magnetic base film and magnetic film are as described in the aforementioned.

The formation of the aforementioned non-magnetic base film and magnetic film is not limited to spatter-coating, but may also be carried out in accordance with vacuum evaporation, ion plating, metal plating, and the like.

Subsequently, the disc D is transported into the chamber 10 of the plasma CVD apparatus shown in FIG. 1, and the surface of the disc D is exposed to a reactant gas, which is supplied from the supply source 14 through the introduction tube 15 into the chamber 10, from which the gas is exhausted via the exhaust tube 16 to circulate the gas within.

The reactant gas is preferably a mixed gas of hydrocarbon and hydrogen, with a mixing ratio of hydrocarbon to hydrogen in the range of 2 to 1~1 to 100 by volume. The hydrocarbon preferably comprises at least one type of hydrocarbon selected from among lower saturated hydrocarbons, lower unsaturated hydrocarbons, and lower cyclic hydrocarbons.

In this operation, the flow rate of the reactant gas is preferably in the range of 50~500 sccm. Additionally, the inner pressure of the chamber 10 is maintained at a predetermined value such as 0.1~10 Pa.

At the same time, high frequency electrical power of preferably 500~2000 W is supplied to the electrodes 11 to generate plasma, and a carbon protective film is formed on both sides of the disc D by means of plasma chemical gas phase growth, using the aforementioned reactant gas as a starting material. The thickness of the carbon protective film is preferably in the range of 30~100 Å.

When supplying electrical power to the electrodes 11 and 11, it is preferable to make the phases of electrical power supplied to each electrode different. By means of making the phases of electrical power supplied to each electrode 11 different, it is possible to improve both the coating rate and durability of the protective film. The difference in the phase of electrical power supplied to each electrode is preferably in the range of 90~270°, and in particular, the opposite phase (i.e., 180°) is preferred.

It is preferable to form the film while performing bias applying such as high frequency bias or pulse D.C. bias to the disc D, using the bias electrical source 13.

The conditions of bias such as voltage and the like are preferably as described in the aforementioned.

The resultant carbon protective film contains a higher content of diamond-like-carbon (DLC), which exhibit an increased hardness.

Additionally, it is possible to provide a lubricating film by means of applying the aforementioned lubricant on the protective film.

Examples of the magnetic recording medium manufactured according to the aforementioned manufacturing method may include a magnetic recording medium comprising a structure shown in FIG. 2.

In the magnetic recording medium according to this embodiment, a non-magnetic substrate S, a non-magnetic base film 31, a magnetic film 32, a carbon protective film 33, and a lubricating film 34 are provided.

According to the aforementioned manufacturing method, a carbon protective film is formed by, means of a plasma CVD method, after a non-magnetic base film and magnetic film are formed on the substrate S, which has been treated with texture-processing. In this manner, the carbon protective film contains a high content of DLC, leading to a superior durability. Accordingly, it is possible to make the carbon protective film thinner while also maintaining a sufficient durability.

Consequently, the surface of the resultant magnetic recording medium reflects the surface of the substrate S, wherein the average surface roughness (Ra) is in the range of 1~20 Å, while also maintaining a uniform and sufficient difference in height.

Accordingly, it is possible to provide a highly reliable magnetic recording medium exhibiting superior CSS and glide avalanche properties, which is capable of sufficiently increasing the recording density without lowering the output properties thereof.

On the other hand, when the carbon protective film is formed according to a conventional spatter-coating method or the like, the thickness of the carbon protective film must be increased to a certain extent, from the perspective of the resistance to sliding. Therefore, even if the irregularities on the surface of the substrate S are uniform, the micro-irregularities on the surface of the magnetic recording medium tend to become non-uniform. Moreover, when the average surface roughness of the substrate S (Ra) is kept low, for example in the range of 1~20 Å, in order to increase the glide avalanche property, the magnetic head adherence during the CSS operation tends to occur due to the partially flat surface of the magnetic recording medium, thus leading to inferior CSS properties.

In the following, the effects of the present invention are specified, using concrete examples.

TEST EXAMPLE 95

A magnetic recording medium was manufactured using the plasma CVD apparatus and texture-processing equipment shown in FIGS. 1 and 3, respectively. The texture-processing equipment (manufactured by Hitachi) is provided with a controller 26 comprising rubber with an outer circumference of 42 mm and length in axial direction of 42 mm. Additionally, 2501-2 manufactured by Chiyoda (with a thickness of 0.2 mm and width of 38 mm) was used as the abrasive tape A.

An aluminium alloy substrate S coated with a NiP metal film (with a diameter of 95 mm, and thickness of 0.8 mm) was supported by means of a substrate support member 24 of the texture-processing equipment, and rotated at a constant speed of 380 rpm, while the abrasive tape A was pushed against and ran over the substrate S with a pressure of 2 kg/cm$^2$. At the same time, the abrasive particle slurry was introduced from the abrasive particle supply nozzle 27, to supply abrasive particles between the abrasive tape A and substrate S.

The receiving speed of the abrasive tape A was set at 0.2 cm/sec. Furthermore, a 20% mixed solution of diamond abrasive particles with a particle diameter of 0.3 μm was used as the abrasive particle slurry. Additionally, when performing texture-processing, the abrasive tape A was oscillated at a frequency of 2 Hz and oscillation width of 20 mm, in the direction perpendicular to the running direction of the tape, by means of an oscillation mechanism (not shown).

The average surface roughness (Ra) of the substrate S as a result of this texture-processing operation is shown in Table 15.

A non-magnetic base film comprising a Cr alloy (with a thickness of 600 Å), and a magnetic film comprising a Co alloy were successively formed on the resultant substrate S by means of DC Magnetron Spattering device (3010 manufactured by Anelva), to form a disc D.

Subsequently, the disc D was transported into the chamber 10 of the plasma CVD apparatus, and a reactant gas was supplied from the supply source 14 into the chamber to achieve a flow rate of 130 sccm. A mixed gas of toluene and hydrogen, with a mixing ratio of toluene to hydrogen of 1 to 10 by volume, was used as the reactant gas. In addition, the inner pressure of the chamber 10 was maintained at 6 Pa.

At the same time, high frequency electrical power of 500 W was supplied to the electrodes 11 to generate plasma, and a carbon protective film with a thickness of 50 Å was formed on both sides of the disc D. High frequency electrical power of 50 W was applied to the disc D, using the bias electrical source 13. Additionally, the difference in the phase of high frequency electrical power supplied to each electrode 11 was set at 180°.

Subsequently, a lubricating film with a thickness of 15 Å was formed by means of applying a fomblin lubricant onto the carbon protective film, thereby yielding a magnetic recording medium.

The glide avalanche test, and CSS test described in the following were performed on the magnetic recording medium.

In the glide avalanche test, the glide avalanche of the magnetic recording medium was measured using a grind tester (DS4200 manufactured by Sony Techtronics).

In addition, in the CSS test, using an MR head, a CSS operation was performed 20000 times at a rotational speed of 7200 rpm, and a temperature of 40° C. with a humidity of 80%. The dynamic stiction value was monitored after allowing the magnetic recording medium to sit for one hour. These results are shown in Table 15.

TEST EXAMPLES 96~99

Magnetic recording media were manufactured, in which the average surface roughness (Ra) of the substrate S was modified by means of adjusting the duration time for performing texture-processing.

The glide avalanche test and CSS test were performed on these magnetic recording media. The results are shown in Table 15.

TEST EXAMPLES 100 AND 101

Magnetic recording media were manufactured, in which the average surface roughness (Ra) of the substrate S was changed by means of modifying the particle diameter of the abrasive particles used in texture-processing.

The glide avalanche test and CSS test were performed on these magnetic recording media. The results are shown in Table 15.

TEST EXAMPLE 102

A magnetic recording medium was manufactured in the same manner as in Test Example 96, with the exception that the carbon protective film was formed according to the spatter-coating method.

The glide avalanche test and CSS test were performed on this magnetic recording medium. The results are shown in Table 15.

TABLE 15

|  | Oscillation frequency (Hz) | Number of rotation of substrate (rpm) | Abrasive particle diameter (μm) | Average surface roughness Ra(Å) | Glide avalanche (μ inch) | Stiction (−) |
| --- | --- | --- | --- | --- | --- | --- |
| Test Example 95 | 3 | 380 | 0.3 | 9 | 0.26 | 0.37 |
| Test Example 96 | 3 | 450 | 0.3 | 17 | 0.30 | 0.34 |
| Test Example 97 | 3 | 300 | 0.3 | 18 | 0.32 | 0.40 |
| Test Example 98 | 5 | 300 | 0.3 | 20 | 0.33 | 0.31 |
| Test Example 99 | 3 | 2000 | 0.3 | 12 | 0.29 | 0.36 |
| Test Example 100 | 3 | 450 | 1.0 | 28 | 0.51 | 0.36 |
| Test Example 101 | 3 | 600 | 1.0 | 30 | 0.56 | 0.39 |
| Test Example 102 | 3 | 450 | 0.3 | 17 | 0.40 | 0.97 |

From the results shown in Table 15, it is clear that the magnetic recording media manufactured according to the plasma CVD method, wherein the average surface roughness (Ra) was 1~20 Å, exhibited sufficiently low glide avalanche values and stiction values, leading to superior CSS and glide avalanche properties.

As explained in the aforementioned, according to the present invention, it is possible to provide a highly reliable magnetic recording medium exhibiting superior CSS and glide avalanche properties, which is capable of increasing the recording density sufficiently without lowering the output properties thereof.

In the following, another embodiment of the method for manufacturing magnetic recording medium according to the present invention is described, using an example in which the plasma CVD apparatus shown in FIG. 1 is employed.

Initially, a non-magnetic base film and magnetic film are formed on both sides of a non-magnetic substrate, according to the spatter-coating method, to obtain a disc D.

The non-magnetic substrate may comprise any substrate that is generally used as a substrate for magnetic recording medium, as described in the aforementioned.

The surface of the non-magnetic substrate is preferably treated with texture-processing such as mechanical texture-processing. In particular, the average surface roughness (Ra) is preferably in the range of 1~20 Å. If the Ra exceeds 20 Å, the grind height property of the resultant magnetic recording medium is undesirably reduced. The materials and thickness of the non-magnetic base film and magnetic film are as described in the aforementioned.

Subsequently, the disc D, provided with the non-magnetic base film and magnetic film on the non-magnetic substrate according to the aforementioned operation, is transported into the chamber 10 of the plasma CVD apparatus, and the surface of the disc D is exposed to a reactant gas, which is supplied from the supply source 14 through the introduction tube 15 into the chamber 10. Gas is exhausted via the exhaust tube 16 from chamber 10 to circulate the gas within.

In the manufacturing method according to the present embodiment, the reactant gas is preferably a butadiene gas or a mixed gas of butadiene and hydrogen which mixing ratio of butadiene to hydrogen is preferably in the range of 100 to 0~1 to 100 by volume, and more preferably 100 to 0~1 to 25.

If the mixing ratio of butadiene in the aforementioned gas by volume is less than the aforementioned range, the coating rate becomes too low, unsuitable for practical industrial production.

Additionally, when using the aforementioned mixed gas of butadiene and hydrogen as the reactant gas, the mixing ratio of butadiene to hydrogen in the reactant gas is preferably in the range of 100 to 60~1 to 100, and more preferably 100 to 60~1 to 25.

When forming the carbon protective film, the inner pressure of the chamber 10 is preferably set at a predetermined value, such as 0.1~10 Pa.

At the same time, high frequency electrical power of preferably 50~2000 W is supplied to the electrodes 11, using the high frequency electrical source 12, to generate plasma, and a carbon protective film is formed on both sides of the disc D by means of plasma chemical gas phase growth, using the aforementioned reactant gas as a starting material. Herein, the aforementioned butadiene gas serves as the carbon source for the carbon protective film.

When supplying electrical power to the electrodes 11 and 11, it is preferable to make the phases of electrical power supplied to each electrode 11 different. By means of making the phases of electrical power supplied to each electrode 11 different, it is possible to improve the coating rate and durability of the protective film. The difference in the phase of electrical power supplied to each electrode is preferably in the range of 90~270°, and in particular, the opposite phase (i.e., 180°) is preferred.

The thickness of the carbon protective film is in the range of 30~100 Å, and preferably 30~75 Å. If the thickness is less than the aforementioned range, the resistance to corrosion of the resultant carbon protective film is decreased. If the thickness exceeds the aforementioned range, the resultant magnetic recording medium tends to (undesirably) exhibit greater spacing loss at the time of recording and replay.

At the time of forming the carbon protective film, bias such as high frequency bias and pulse D.C. bias, is applied to the disc D, using the electrical bias source 13.

When using high frequency bias as the bias, high frequency electrical source is used as the bias electrical source 13, and high frequency electrical power of 10~300 W, preferably 10~150 W, is applied to the disc D.

If the electrical power is less than the aforementioned range, the resistance to sliding of the resultant carbon protective film is reduced. If the electrical power exceeds the aforementioned range, abnormal discharge tends to occur in the chamber 10 at the time of coating, leading undesirably to portions of abnormal growth on the carbon protective film.

When using pulse D.C. bias as the bias, a pulse D.C. electrical source is used as the bias electrical source 13, and a voltage of −400~−10V, preferably −300~−50V is applied to the disc D.

If the voltage is less than the aforementioned range, resistance to sliding of the obtained, carbon protective film is reduced. If it exceeds the aforementioned range, abnormal discharge tends to occur in the chamber 10 during coating, leading undesirably to portions of abnormal growth on the carbon protective film.

Additionally, the pulse width of the aforementioned pulse D.C. bias is preferably in the range of 10~50000 ns, and the frequency is preferably in the range of 10 kHz~1 GHz.

By means of performing bias applying, the carbon protective film contains a higher content of diamond-like-carbon (DLC), which exhibit both an increased hardness and superior strength.

Additionally, a lubricating film may be provided on the protective film, by means of applying the aforementioned lubricant.

In the aforementioned manufacturing method, by means of using a butadiene gas, or a mixed gas of butadiene and hydrogen, which mixing ratio of butadiene to hydrogen is in the range of 100 to 0~1 to 100 by volume, as the reactant gas, at the time of forming the carbon protective film, it is possible to form a carbon protective film with a superior durability. As a result, it is possible to make the carbon protective thinner while maintaining the durability, and to provide a magnetic recording medium that is capable of reducing spacing loss.

Consequently, it is possible to provide a highly reliable magnetic recording medium, which is capable of sufficiently increasing the recording density without lowering the output properties thereof.

Additionally, by means of performing bias applying to the disc D at the time of forming the carbon protective film, the carbon protective film contains a higher content of DLC, leading to a superior strength. In addition, it is also possible to improve the coating rate, leading to an efficient production.

The reason that the carbon protective film with a superior durability can be provided by means of using a butadiene gas, or a mixed gas of butadiene and hydrogen, which mixing ratio of butadiene to hydrogen is in the range of 100 to 0~1 to 100 by volume, as the reactant gas when forming the aforementioned carbon protective film, is unclear. However, this may be attributable to the fact that the resultant carbon protective film contains a higher content of DLC which exhibit an excellent hardness, and thus displays an overall superior strength, by means of using the aforementioned gas as the reactant gas.

A mixed gas wherein other gases such as nitrogen, argon, oxygen, fluorine, and the like, are added into the aforementioned butadiene gas, or mixed gas of butadiene and hydrogen at a mixing ratio of for example 1~100 vol %, may be also used as the reactant gas.

In addition, a mixed gas wherein other gases, which may serve as a carbon source, such as methane, ethane, ethylene, propylene, butylene, butane, benzene, toluene, and the like, are mixed into butadiene gas at a mixing ratio of, for example, 1~100 vol %, may be used instead of the aforementioned butadiene gas.

In addition, in the aforementioned manufacturing method according to the present embodiment, a carbon protective film is formed according only to a plasma CVD method. However, the method for manufacturing magnetic recording medium according to the present invention is not limited thereto, and a protective film may also comprise a multilayer structure comprising a plasma carbon layer formed according to the plasma CVD method, and a layer formed according to another method, such as a spatter-carbon layer and/or tantalic nitride layer formed according to the spattering method.

In the following, the effects of the present invention are specified, using concrete examples.

TEST EXAMPLE 103~117

After an aluminium alloy substrate coated with a NiP metal film (with a diameter of 95 mm and thickness of 0.8 mm) was treated with mechanical texture-processing to form an average surface roughness of 20 Å, a non-magnetic base film (with a thickness of 600 Å) comprising a Cr alloy, and a magnetic film comprising a Co alloy were successively formed on both sides of the substrate S, using DC Magnetron Spatter Equipment (3010 manufactured by Anelva), to obtain a disc D.

Subsequently, the disc D was transported into the chamber 10 of the plasma CVD apparatus, and the reactant gas was supplied from the supply source 14 inside of the chamber.

At the same time, high frequency electrical power of 700 W (with a frequency of 13.56 MHz) was supplied to the electrodes 11, to generate plasma, and a carbon protective film with a thickness of 50 Å was formed on both sides of the disc D.

The temperature of the disc D when forming the carbon protective film was set at 160° C. The distance between the electrodes 11 and disc D was set at 30 mm. The inner pressure of the chamber was maintained at 2 Pa.

The type and flow rate of the reactant gas, type and power of bias applied to the disc D by means of the bias electrical source 13, difference in the phase of high frequency electrical power supplied to the electrodes 11, thickness of the formed carbon protective film, and coating rate are shown in Table 16.

Subsequently, a lubricating film with a thickness of 20 Å was formed on the carbon protective film by means of applying a fomblin lubricant, thereby yielding a magnetic recording medium.

The CSS test, corrosion test, and Raman spectral analysis described in the following were performed on the resultant magnetic recording media.

In the CSS test, using an MR head, a CSS operation was performed 20000 times at a rotational speed of 7200 rpm, and a temperature of 40° C. with a humidity of 80%. The dynamic stiction value was monitored after allowing the magnetic recording medium to sit for one hour.

In the corrosion test, after being allowed to sit for 96 hours at a high temperature (60° C.) and a high humidity (80%), the magnetic recording medium was soaked in 50 cc of ultrapure water at 25° C., and the extraction amount of Co (per substrate area) was measured. In addition, after being allowed to sit for 96 hours at a normal temperature (25° C.) and normal humidity (50%), the extraction amount of Co was measured in the same manner.

In the Raman spectral analysis, Raman spectral analysis (argon ion laser excitation) was performed, using a Raman spectral analysis apparatus (manufactured by JEOL). The results are shown in Table 17.

In the table, "RF" represents high frequency. Furthermore, "RF phase difference" represents the difference in the phase of electrical power supplied to two electrodes 11 and 11.

TABLE 16

| | Reactant gas | | Ratio of | | | | | |
| | Carbon source gas | Hydro- | butadiene | | | RF | Protec- | Coat- |
| | | Flow rate | gen flow rate | in reactant gas | | Bias | phase differ- | tive film thick- | ing rate |
| | Type | (sccm) | (sccm) | (vol. %) | Bias | power | ence (°) | ness (Å) | (Å/min) |
|---|---|---|---|---|---|---|---|---|---|
| Test Ex 103 | Butadiene | 6 | 120 | 4.8 | Pulse D.C. | −200 V | | 180 | 50 | 218 |
| Test Ex 104 | Butadiene | 30 | 200 | 13.0 | Pulse D.C. | −200 V | | 180 | 50 | 285 |
| Test Ex 105 | Butadiene | 30 | 120 | 20.0 | Pulse D.C. | −200 V | | 180 | 50 | 533 |
| Test Ex 106 | Butadiene | 30 | 120 | 20.0 | RF | 30 W | | 180 | 50 | 506 |
| Test Ex 107 | Butadiene | 25 | 60 | 29.4 | Pulse D.C. | −200 V | | 180 | 50 | 552 |

TABLE 16-continued

| | Reactant gas | | Ratio of butadiene in reactant gas (vol. %) | Bias | Bias power | RF phase difference (°) | Protective film thickness (Å) | Coating rate (Å/min) |
|---|---|---|---|---|---|---|---|---|
| | Carbon source gas | Hydrogen flow rate (sccm) | | | | | | |
| | Type | Flow rate (sccm) | | | | | | |
| Test Ex 108 | Butadiene | 30 | 20 | 60.0 | Pulse D.C. | −200 V | 180 | 50 | 689 |
| Test Ex 109 | Butadiene | 30 | 0 | 100 | Pulse D.C. | −200 V | 180 | 50 | 810 |
| Test Ex 110 | Butadiene | 3 | 120 | 2.4 | Pulse D.C. | −200 V | 180 | 50 | 165 |
| Test Ex 111 | Butadiene | 30 | 120 | 20.0 | None | — | 180 | 50 | 386 |
| Test Ex 112 | Butadiene | 30 | 120 | 20.0 | Pulse D.C. | −200 V | 0 | 50 | 185 |
| Test Ex 113 | Butadiene | 30 | 120 | 20.0 | Pulse D.C. | −200 V | 180 | 20 | 533 |
| Test Ex 114 | Methane | 60 | 60 | — | Pulse D.C. | −200 V | 180 | 50 | 324 |
| Test Ex 115 | Ethane | 100 | 0 | — | Pulse D.C. | −200 V | 180 | 50 | 385 |
| Test Ex 116 | Ethylene | 60 | 60 | — | Pulse D.C. | −200 V | 180 | 50 | 308 |
| Test Ex 117 | Acetone | 100 | 0 | — | Pulse D.C. | −200 V | 180 | 50 | 221 |

TABLE 17

| | Stiction (-) | Corrosion test | | Raman spectral analysis | |
|---|---|---|---|---|---|
| | | Normal temp. & normal humidity (μg/disc) | High temp. & high humidity (μg/disc) | åG-line (cm$^{-1}$) | Id/Ig (-) |
| Test Example 103 | 0.64 | 0.05 | 0.11 | 0.44 | 1540.5 |
| Test Example 104 | 0.81 | 0.07 | 0.17 | 0.38 | 1536.7 |
| Test Example 105 | 0.43 | 0.08 | 0.22 | 0.37 | 1538.2 |
| Test Example 106 | 0.60 | 0.04 | 0.16 | 0.40 | 1536.4 |
| Test Example 107 | 0.96 | 0.08 | 0.20 | 0.36 | 1534.8 |
| Test Example 108 | 0.77 | 0.08 | 0.24 | 0.35 | 1533.9 |
| Test Example 109 | 0.71 | 0.08 | 0.18 | 0.34 | 1533.8 |
| Test Example 110 | 0.88 | 0.07 | 0.13 | 0.48 | 1541.2 |
| Test Example 111 | Crash | 0.36 | 0.99 | no peak | — |
| Test Example 112 | 0.56 | 0.21 | 0.77 | 0.75 | 1539.5 |
| Test Example 113 | 1.23 | 0.78 | 2.57 | — | — |
| Test Example 114 | 2.25 | 0.11 | 0.45 | 1.02 | 1558.0 |
| Test Example 115 | Crash | 0.14 | 0.58 | 0.35 | 1559.6 |
| Test Example 116 | 2.12 | 0.16 | 0.36 | — | — |
| Test Example 117 | Crash | 0.23 | 0.74 | — | — |

From the results shown in Tables 16 and 17, it is clear that the magnetic recording media manufactured according to the method wherein bias was applied to the disc D at the time of coating, and butadiene gas or a mixed gas of butadiene and hydrogen, with a mixing ratio of butadiene to hydrogen of 100 to 0~1 to 100 by volume, exhibited lower stiction values, leading to a superior resistance to the CSS operation. Additionally, it is clear that the coating rate improved.

In addition, from the results of the corrosion test, the aforementioned magnetic recording media displayed an extremely small amount of corrosion, and exhibited a resistance to corrosion to a degree which poses no problems from practical use.

Additionally, from the results of the Raman spectral analysis, the aforementioned magnetic recording medium exhibited a G-band peak of a relatively higher frequency, a low Id/Ig, and a high DLC content.

In addition, the magnetic recording medium manufactured according to the method wherein the difference in the phase of high frequency electrical power supplied to the electrodes 11 was 180 degrees, resulted in an improvement in the coating rate, compared to those with no difference in the phase.

As explained in the aforementioned, according to the method for manufacturing magnetic recording medium according to the present invention, it is possible to form a carbon protective film with a superior durability. As a result, it is possible to make the carbon protective film thinner while also maintaining a sufficient durability, and thereby reduce spacing loss.

Accordingly, it is possible to provide a highly reliable magnetic recording medium which is capable of sufficiently increasing the recording density without lowering the output properties thereof. Additionally, it is possible to increase the coating rate, leading to an efficient production.

INDUSTRIAL APPLICABILITY

The magnetic recording medium and method for manufacturing the same according to the present invention may be applied to a magnetic recording medium (and manufacturing method for the same), such as magnetic disc or the like, which is used in magnetic disc equipment.

What is claimed is:

1. A method for manufacturing a magnetic recording medium comprising the steps of forming a carbon protective film onto a disc, the non-magnetic substrate of which is layered with a non-magnetic base film and magnetic film, using a reactant gas containing carbon atoms as a starting material, according to a plasma CVD method, wherein a mixed gas of hydrocarbon and hydrogen, in which the mixing ratio of hydrocarbon to hydrogen is in the range of 2 to 1~1 to 100 by volume, is used as a reactant gas, while applying a bias to said disc.

2. A method for manufacturing a magnetic recording medium according to claim 1, wherein toluene is used as said hydrocarbon.

3. A method for manufacturing a magnetic recording medium according to claim 2, wherein a mixed gas of toluene and hydrogen, in which the mixing ratio of toluene and hydrogen is in the range of 1 to 15~1 to 20 by volume, is used as said reactant gas.

4. A method for manufacturing a magnetic recording medium according to one of claims 1~3, wherein said carbon protective film is formed according to a plasma CVD method, under high frequency electrical discharge.

5. A method for manufacturing a magnetic recording medium according to claim 4 wherein the phases of electrical power, supplied to each electrode arranged on the respective sides of said disc, are different from each other at the time of forming said carbon protective film simultaneously, on both sides of said disc, under high frequency electrical discharge.

6. A method for manufacturing a magnetic recording medium according to one of claims 1~3, wherein high frequency bias is used as said bias.

7. A method for manufacturing a magnetic recording medium according to claim 6 wherein said carbon protective film is formed according to a plasma CVD method, under high frequency electrical discharge.

8. A method for manufacturing a magnetic recording medium according to claim 7, wherein the phases of electrical power, supplied to each electrode arranged on the respective sides of said disc, are different from each other, at the time of forming said carbon protective film simultaneously, on both sides of said disc, under high frequency electrical discharge.

* * * * *